United States Patent
Ohmaru et al.

(10) Patent No.: US 9,330,759 B2
(45) Date of Patent: *May 3, 2016

(54) STORAGE ELEMENT, STORAGE DEVICE, AND SIGNAL PROCESSING CIRCUIT

(71) Applicant: SEMICONDUCTOR ENERGY LABORATORY CO., LTD., Atsugi-shi, Kanagawa-ken (JP)

(72) Inventors: Takuro Ohmaru, Kanagawa (JP); Masami Endo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/702,817

(22) Filed: May 4, 2015

(65) Prior Publication Data

US 2015/0235700 A1 Aug. 20, 2015

Related U.S. Application Data

(63) Continuation of application No. 14/068,217, filed on Oct. 31, 2013, now Pat. No. 9,024,669, which is a continuation of application No. 13/341,412, filed on Dec. 30, 2011, now Pat. No. 8,575,985.

(30) Foreign Application Priority Data

Jan. 5, 2011 (JP) ................................. 2011-000435
May 20, 2011 (JP) ................................. 2011-113414

(51) Int. Cl.
*H03K 3/356* (2006.01)
*G11C 14/00* (2006.01)
(Continued)

(52) U.S. Cl.
CPC ............ *G11C 14/0009* (2013.01); *G11C 11/24* (2013.01); *H01L 27/10805* (2013.01);
(Continued)

(58) Field of Classification Search
USPC .......................................................... 327/208
See application file for complete search history.

(56) References Cited

U.S. PATENT DOCUMENTS

| 4,656,607 A | 4/1987 | Hagiwara et al. |
| 4,797,576 A | 1/1989 | Asazawa |

(Continued)

FOREIGN PATENT DOCUMENTS

| EP | 0135036 A | 3/1985 |
| EP | 0297777 A | 1/1989 |

(Continued)

OTHER PUBLICATIONS

Korean Office Action (Application No. 2014-0097290) Dated Aug. 12, 2015.

(Continued)

*Primary Examiner* — Huan Hoang
*Assistant Examiner* — Pablo Huerta
(74) *Attorney, Agent, or Firm* — Fish & Richardson P.C.

(57) ABSTRACT

A signal processing circuit whose power consumption can be suppressed is provided. In a period during which a power supply voltage is not supplied to a storage element, data stored in a first storage circuit corresponding to a nonvolatile memory can be held by a first capacitor provided in a second storage circuit. With the use of a transistor in which a channel is formed in an oxide semiconductor layer, a signal held in the first capacitor is held for a long time. The storage element can accordingly hold the stored content (data) also in a period during which the supply of the power supply voltage is stopped. A signal held by the first capacitor can be converted into the one corresponding to the state (the on state or off state) of the second transistor and read from the second storage circuit. Consequently, an original signal can be accurately read.

19 Claims, 32 Drawing Sheets

(51) Int. Cl.
*H01L 29/24* (2006.01)
*H01L 27/108* (2006.01)
*H01L 49/02* (2006.01)
*H01L 29/786* (2006.01)
*G11C 11/24* (2006.01)

(52) U.S. Cl.
CPC .......... *H01L27/10897* (2013.01); *H01L 28/20* (2013.01); *H01L 28/40* (2013.01); *H01L 29/24* (2013.01); *H01L 29/7869* (2013.01)

(56) References Cited

U.S. PATENT DOCUMENTS

| | | | |
|---|---|---|---|
| 4,809,225 | A | 2/1989 | Dimmler et al. |
| 5,218,607 | A | 6/1993 | Saito et al. |
| 5,731,856 | A | 3/1998 | Kim et al. |
| 5,744,864 | A | 4/1998 | Cillessen et al. |
| 5,936,879 | A | 8/1999 | Brouwer et al. |
| 6,016,268 | A | 1/2000 | Worley |
| 6,046,606 | A | 4/2000 | Chu et al. |
| 6,127,702 | A | 10/2000 | Yamazaki et al. |
| 6,294,274 | B1 | 9/2001 | Kawazoe et al. |
| 6,385,120 | B1 | 5/2002 | Steiss |
| 6,563,174 | B2 | 5/2003 | Kawasaki et al. |
| 6,576,943 | B1 | 6/2003 | Ishii et al. |
| 6,727,522 | B1 | 4/2004 | Kawasaki et al. |
| 6,738,281 | B2 | 5/2004 | Yokozeki |
| 6,788,567 | B2 | 9/2004 | Fujimori |
| 6,809,952 | B2 | 10/2004 | Masui |
| 6,845,032 | B2 | 1/2005 | Toyoda et al. |
| 6,876,023 | B2 | 4/2005 | Ishii et al. |
| 6,934,178 | B2 | 8/2005 | Yokozeki et al. |
| 6,944,045 | B2 | 9/2005 | Fujimori |
| 6,972,986 | B2 | 12/2005 | Peng et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,064,973 | B2 | 6/2006 | Peng et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,612,594 | B2 | 11/2009 | Fukuoka |
| 7,616,040 | B2 | 11/2009 | Motomura |
| 7,674,650 | B2 | 3/2010 | Akimoto et al. |
| 7,732,819 | B2 | 6/2010 | Akimoto et al. |
| 7,847,287 | B2 | 12/2010 | Kim et al. |
| 7,863,611 | B2 | 1/2011 | Abe et al. |
| 7,863,627 | B2 | 1/2011 | Honda |
| 7,910,490 | B2 | 3/2011 | Akimoto et al. |
| 7,932,521 | B2 | 4/2011 | Akimoto et al. |
| 7,940,085 | B2 | 5/2011 | Kim et al. |
| 8,085,076 | B2 | 12/2011 | Djaja et al. |
| 8,115,201 | B2 | 2/2012 | Yamazaki et al. |
| 8,158,987 | B2 | 4/2012 | Nabekura et al. |
| 8,217,680 | B2 | 7/2012 | Kim et al. |
| 8,274,077 | B2 | 9/2012 | Akimoto et al. |
| 8,314,637 | B2 | 11/2012 | Kato et al. |
| 8,362,478 | B2 | 1/2013 | Yamazaki et al. |
| 8,362,538 | B2 | 1/2013 | Koyama et al. |
| 8,368,066 | B2 | 2/2013 | Yamazaki et al. |
| 8,410,838 | B2 | 4/2013 | Kato et al. |
| 8,427,595 | B2 * | 4/2013 | Yamazaki et al. .............. 349/43 |
| 8,432,187 | B2 | 4/2013 | Kato et al. |
| 8,456,396 | B2 * | 6/2013 | Umezaki .......... 345/87 |
| 8,547,771 | B2 | 10/2013 | Koyama |
| 8,575,985 | B2 * | 11/2013 | Ohmaru .................. G11C 11/24 327/208 |
| 8,593,856 | B2 | 11/2013 | Koyama et al. |
| 8,618,586 | B2 | 12/2013 | Koyama et al. |
| 8,705,267 | B2 | 4/2014 | Endo et al. |
| 8,787,073 | B2 | 7/2014 | Yamazaki et al. |
| 8,860,485 | B2 | 10/2014 | Kato et al. |
| 8,891,286 | B2 | 11/2014 | Endo et al. |
| 2001/0046027 | A1 | 11/2001 | Tai et al. |
| 2002/0056838 | A1 | 5/2002 | Ogawa |
| 2002/0074568 | A1 | 6/2002 | Yoshida et al. |
| 2002/0132454 | A1 | 9/2002 | Ohtsu et al. |
| 2003/0122581 | A1 | 7/2003 | Inoue et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0071039 | A1 | 4/2004 | Fujimori |
| 2004/0127038 | A1 | 7/2004 | Carcia et al. |
| 2004/0164778 | A1 | 8/2004 | Toyoda et al. |
| 2005/0017302 | A1 | 1/2005 | Hoffman |
| 2005/0169039 | A1 | 8/2005 | Peng et al. |
| 2005/0169040 | A1 | 8/2005 | Peng et al. |
| 2005/0199959 | A1 | 9/2005 | Chiang et al. |
| 2005/0205921 | A1 | 9/2005 | Ishii et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0095975 | A1 | 5/2006 | Yamada et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0019460 | A1 | 1/2007 | Kang et al. |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0126666 | A1 | 6/2007 | Yamazaki et al. |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0223275 | A1 | 9/2007 | Nakajima et al. |
| 2007/0229133 | A1 | 10/2007 | Tam et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0048744 | A1 | 2/2008 | Fukuoka |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0170028 | A1 | 7/2008 | Yoshida |
| 2008/0174527 | A1 * | 7/2008 | Hattori .................. G09G 3/3216 345/76 |
| 2008/0182358 | A1 | 7/2008 | Cowdery-Corvan et al. |

(56) References Cited

U.S. PATENT DOCUMENTS

| | | |
|---|---|---|
| 2008/0197414 A1 | 8/2008 | Hoffman et al. |
| 2008/0214132 A1 | 9/2008 | Kurokawa |
| 2008/0224133 A1 | 9/2008 | Park et al. |
| 2008/0225061 A1* | 9/2008 | Kimura ............... H01L 27/1255 345/690 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2008/0297676 A1* | 12/2008 | Kimura ............... G02F 1/13624 349/39 |
| 2008/0308796 A1 | 12/2008 | Akimoto et al. |
| 2008/0308805 A1 | 12/2008 | Akimoto et al. |
| 2009/0002044 A1 | 1/2009 | Kobayashi |
| 2009/0002586 A1* | 1/2009 | Kimura ............. G02F 1/136213 349/39 |
| 2009/0002590 A1 | 1/2009 | Kimura |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0168508 A1* | 7/2009 | Kapoor ................... G11C 11/41 365/177 |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0001774 A1 | 1/2010 | Djaja et al. |
| 2010/0019839 A1 | 1/2010 | Monden |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2010/0193785 A1 | 8/2010 | Kimura |
| 2010/0200851 A1 | 8/2010 | Oikawa et al. |
| 2010/0245219 A1* | 9/2010 | Shishido ............... G09G 3/3241 345/80 |
| 2010/0252832 A1 | 10/2010 | Asano et al. |
| 2011/0010493 A1 | 1/2011 | Kimura et al. |
| 2011/0024741 A1 | 2/2011 | Abe et al. |
| 2011/0089417 A1 | 4/2011 | Yamazaki et al. |
| 2011/0101351 A1 | 5/2011 | Yamazaki |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0121878 A1 | 5/2011 | Kato et al. |
| 2011/0148463 A1 | 6/2011 | Kato et al. |
| 2011/0156024 A1 | 6/2011 | Koyama et al. |
| 2011/0157964 A1* | 6/2011 | McPartland ........... G11C 11/412 365/156 |
| 2011/0163311 A1 | 7/2011 | Akimoto et al. |
| 2011/0170029 A1* | 7/2011 | Kimura ............. G02F 1/136213 349/38 |
| 2011/0176357 A1 | 7/2011 | Koyama et al. |
| 2011/0187410 A1 | 8/2011 | Kato et al. |
| 2012/0051117 A1* | 3/2012 | Yamazaki ........... G11C 14/0054 365/149 |
| 2012/0069637 A1 | 3/2012 | Ikeda et al. |
| 2012/0132910 A1 | 5/2012 | Yamazaki et al. |
| 2013/0057315 A1 | 3/2013 | Kato et al. |
| 2013/0222033 A1 | 8/2013 | Kato et al. |
| 2013/0234757 A1 | 9/2013 | Kato et al. |
| 2014/0078816 A1 | 3/2014 | Koyama et al. |
| 2014/0097867 A1 | 4/2014 | Koyama |
| 2014/0167037 A1 | 6/2014 | Koyama et al. |
| 2014/0328111 A1 | 11/2014 | Yamazaki et al. |

FOREIGN PATENT DOCUMENTS

| | | |
|---|---|---|
| EP | 0404061 A | 12/1990 |
| EP | 0530928 A | 3/1993 |
| EP | 0818891 A | 1/1998 |
| EP | 0936546 A | 8/1999 |
| EP | 1447909 A | 8/2004 |
| EP | 1583239 A | 10/2005 |
| EP | 1737044 A | 12/2006 |
| EP | 1770788 A | 4/2007 |
| EP | 1918904 A | 5/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 58-205226 A | 11/1983 |
| JP | 60-025269 A | 2/1985 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-066899 A | 3/1989 |
| JP | 03-027419 A | 2/1991 |
| JP | 03-192915 A | 8/1991 |
| JP | 05-110392 A | 4/1993 |
| JP | 05-251705 A | 9/1993 |
| JP | 07-147530 A | 6/1995 |
| JP | 08-264794 A | 10/1996 |
| JP | 10-078836 A | 3/1998 |
| JP | 10-093423 A | 4/1998 |
| JP | 11-505377 | 5/1999 |
| JP | 11-261406 A | 9/1999 |
| JP | 2000-044236 A | 2/2000 |
| JP | 2000-077982 A | 3/2000 |
| JP | 2000-150900 A | 5/2000 |
| JP | 2000-269457 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-269616 A | 9/2005 |
| JP | 2005-323295 A | 11/2005 |
| JP | 2006-050208 A | 2/2006 |
| JP | 2006-165532 A | 6/2006 |
| JP | 2007-096055 A | 4/2007 |
| JP | 2007-123861 A | 5/2007 |
| JP | 2007-125823 A | 5/2007 |
| JP | 2007-179021 A | 7/2007 |
| JP | 2008-052847 A | 3/2008 |
| JP | 2008-147903 A | 6/2008 |
| JP | 2009-175716 A | 8/2009 |
| JP | 2009-206942 A | 9/2009 |
| JP | 2009-212443 A | 9/2009 |
| JP | 2009-260378 A | 11/2009 |
| JP | 2010-034710 A | 2/2010 |
| JP | 2010-062229 A | 3/2010 |
| JP | 2010-062546 A | 3/2010 |
| JP | 2010-258434 A | 11/2010 |
| JP | 2010-267955 A | 11/2010 |
| KR | 2008-0037538 A | 4/2008 |
| KR | 2008-0060156 A | 7/2008 |
| WO | WO-03/044953 | 5/2003 |
| WO | WO-2004/059838 | 7/2004 |
| WO | WO-2004/114391 | 12/2004 |
| WO | WO-2009/110623 | 9/2009 |

OTHER PUBLICATIONS

Kamiya.T et al., "Carrier transport properties and electronic structures of amorphous oxide semiconductors: the present status", Solid

(56) References Cited

OTHER PUBLICATIONS

State Physics, Sep. 1, 2009, vol. 44, No. 9, pp. 621-633, Agne Gijutsu Center.

Jeon.S et al., "180nm Gate Length Amorphous InGaZnO Thin Film Transistor for High Density Image Sensor Applications", IEDM 10:Technical Digest of International Electron Devices Meeting, Dec. 6, 201, pp. 504-507.

Asakuma.N et al., "Crystallization and Reduction of SOL-GEL-Derived Zinc Oxide Films by Irradiation with Ultraviolet Lamp", Journal of SOL-GEL Science and Technology, 2003, vol. 26, pp. 181-184.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp.1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May. 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-65202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Avd. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystallline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and SC2O3-A2O3-BO Systems [A; Fe, Ga, or Al; B:Mg, Mn, Fe, Ni, Cu, or Zn]At Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993,vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letter), Jan. 26, 2007, vol. 98, pp. 045501-1-045501-4.

Lee.H et al., "Current Status of, Challenges to, and Perspective View of AM-OLED", IDW '06:Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review.B), 2008, vol. 77, pp. 245202-1-245202-6.

Oh.M et al., "Improving the Gate Stability of ZnO Thin-Film Transistors With Aluminum Oxide Dielectric Layer", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.Sang-Hee et al., "42.3: Transparent ZnO Thin Film Transistor for the Application of High Aperture Ratio Bottom Emission AM-OLED Dispay", SID Digest '08 : SID International Symposium Digest of Technical Paers, May 20, 2008, vol. 39, pp. 629-632.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ishii.T et al., "A Poly-Silicon TFT With a Sub-5-nm Thick Channel for Low-Power Gain Cell Memory in Mobile in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Nishijima.T et al., "Low-power Display System Driven by Utilizing Technique Using Crystalline IGZO Transistor", SID Digest '12 : SID International Symposium Digest of Technical Papers, 2012, pp. 583-586.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Yamazaki.S et al., "Research, Development, and Application of Crystalline Oxide Semiconductor", SID Digest '12 : SID International Symposium Digest of Technical Papers, Jun. 5, 2012, pp. 183-186.

Korean Office Action (Application No. 2012-0001155) Dated May 31, 2014.

\* cited by examiner

● In
◐ Sn
◡ Zn
● O

- In
- Ga
- Zn
- O

STORAGE ELEMENT, STORAGE DEVICE, AND SIGNAL PROCESSING CIRCUIT

CROSS-REFERENCE TO RELATED APPLICATIONS

This application is a continuation of U.S. application Ser. No. 14/068,217, filed Oct. 31, 2013, now allowed, which is a continuation of U.S. application Ser. No. 13/341,412, filed Dec. 30, 2011, now U.S. Pat. No. 8,575,985, which claims the benefit of foreign priority applications filed in Japan as Serial No. 2011-000435 on Jan. 5, 2011 and Serial No. 2011-113414 on May 20, 2011, all of which are incorporated by reference.

BACKGROUND OF THE INVENTION

1. Field of the Invention

The present invention relates to a nonvolatile storage device which can keep a stored logic state even when power is turned off and also relates to a signal processing circuit including the nonvolatile storage device. Further, the present invention relates to driving methods of the storage device and the signal processing circuit. Furthermore, the present invention relates to an electronic device including the signal processing circuit.

2. Description of the Related Art

A signal processing circuit such as a central processing unit (CPU) has a variety of configurations depending on its application but is generally provided with some kinds of storage devices such as a register and a cache memory as well as a main memory for storing data or a program. A register has a function of temporarily holding data for carrying out arithmetic processing, holding a program execution state, or the like. In addition, a cache memory is located between an arithmetic circuit and a main memory in order to reduce low-speed access to the main memory and speed up the arithmetic processing.

In a storage device such as a register or a cache memory, writing of data needs to be performed at higher speed than in a main memory. Thus, in general, a flip-flop or the like is used as a register, and a static random access memory (SRAM) or the like is used as a cache memory. That is, a volatile storage device in which data is erased when supply of power supply potential is stopped is used for such a register, a cache memory, or the like.

In order to reduce power consumption, a method for temporarily stopping supply of a power supply voltage to a signal processing circuit in a period during which data is not input and output has been suggested. In the method, a nonvolatile storage device is located in the periphery of a volatile storage device such as a register or a cache memory, so that the data is temporarily stored in the nonvolatile storage device. Thus, the register, the cache memory, or the like holds data even while supply of power supply potential is stopped in the signal processing circuit (for example, see Patent Document 1).

In addition, in the case where supply of a power supply voltage is stopped for a long time in a signal processing circuit, data in a volatile storage device is transferred to an external storage device such as a hard disk or a flash memory before the supply of the power supply voltage is stopped, so that the data can be prevented from being erased.

REFERENCE

Patent Document

[Patent Document 1] Japanese Published Patent Application No. H10-078836

SUMMARY OF THE INVENTION

In the case where data of a volatile storage device is stored in a nonvolatile storage device located in the periphery of the volatile storage device while the supply of the power supply voltage is stopped in a signal processing circuit, such a nonvolatile storage device is mainly formed using a magnetic element or a ferroelectric; thus, the manufacturing process of the signal processing circuit is complex.

In the case where data of the volatile storage device is stored in the external storage device while the supply of the power supply voltage is stopped in the signal processing circuit, it takes a long time for returning data from the external storage device to the volatile storage device. Therefore, back up of data using the external storage device is not suitable in the case where the power supply is stopped for a short time so as to reduce power consumption.

In view of the above-described problems, it is an object of the present invention to provide a signal processing circuit for which a complex manufacturing process is not necessary and whose power consumption can be suppressed and a driving method of the signal processing circuit. In particular, it is an object to provide a signal processing circuit whose power consumption can be suppressed by stopping the power supply for a short time and a driving method of the signal processing circuit.

(One Embodiment of Structure of Storage Element)

One embodiment of a structure of a storage element according to the present invention is described below.

(Structure 1 of Storage Element)

One embodiment of the present invention is a storage element including a first storage circuit, a second storage circuit, a first switch, a second switch, and a third switch. The first storage circuit holds data only in a period during which a power supply voltage is supplied. The second storage circuit is a storage element including a first capacitor, a first transistor, and a second transistor. The storage element has the following structure.

The first transistor is a transistor in which a channel is formed in an oxide semiconductor layer. Here, as the first transistor in which the channel is formed in the oxide semiconductor layer, an n-channel enhancement (normally-off) transistor whose leakage current (off-state current) is extremely low is used. When supply of a power supply voltage to the storage element is stopped, a ground potential (0 V) continues to be input to a gate of the first transistor; for example, the gate of the first transistor is grounded through a load such as a resistor. One of a source and a drain of the first transistor is electrically connected to one of a pair of electrodes of the first capacitor and a gate of the second transistor. One of a source and a drain of the second transistor is electrically connected to a first power supply line, and the other thereof is electrically connected to a first terminal of the first switch. A second terminal of the first switch is electrically connected to a first terminal of the second switch. A second terminal of the second switch is electrically connected to a second power supply line.

A first control signal is input to the gate of the first transistor. As for each of the first switch and the second switch, a conduction state or a non-conduction state between the first terminal and the second terminal is selected by a second control signal which is different from the first control signal. When the first terminal and the second terminal of one of the first switch and the second switch are in the conduction state, the first terminal and the second terminal of the other of the first switch and the second switch are in the non-conduction state. As for the third switch, a conduction state or a non-conduction state between a first terminal and a second terminal is selected by a third control signal which is different from the first control signal and the second control signal.

A signal corresponding to data held in the first storage circuit is input to the other of the source and the drain of the first transistor. A signal output from the second terminal of the first switch or an inverted signal thereof is input to the first storage circuit through the third switch in which the first terminal and the second terminal are in the conduction state.

Another embodiment of the structure of the storage element according to the present invention is described below.

(Structure 2 of Storage Element)

Another embodiment of the present invention is a storage element including a first storage circuit, a second storage circuit, a first switch, a second switch, a third switch, and a logic element which inverts a phase of an input signal and outputs the signal (hereinafter, referred to as a phase-inversion element). The first storage circuit holds data only in a period during which a power supply voltage is supplied. The second storage circuit is a storage element including a first capacitor, a first transistor, and a second transistor. The storage element has the following structure.

The first transistor is a transistor in which a channel is formed in an oxide semiconductor layer. Here, as the first transistor in which the channel is formed in the oxide semiconductor layer, an n-channel enhancement (normally-off) transistor whose leakage current (off-state current) is extremely low is used. When supply of a power supply voltage to the storage element is stopped, a ground potential (0 V) continues to be input to a gate of the first transistor; for example, the gate of the first transistor is grounded through a load such as a resistor. One of a source and a drain of the first transistor is electrically connected to one of a pair of electrodes of the first capacitor and a gate of the second transistor. One of a source and a drain of the second transistor is electrically connected to a first power supply line, and the other thereof is electrically connected to a first terminal of the first switch. A second terminal of the first switch is electrically connected to a first terminal of the second switch. A second terminal of the second switch is electrically connected to a second power supply line. The second terminal of the first switch, the first terminal of the second switch, and an input terminal of the phase-inversion element are electrically connected to each other.

A first control signal is input to the gate of the first transistor. As for each of the first switch and the second switch, a conduction state or a non-conduction state between the first terminal and the second terminal is selected by a second control signal which is different from the first control signal. When the first terminal and the second terminal of one of the first switch and the second switch are in the conduction state, the first terminal and the second terminal of the other of the first switch and the second switch are in the non-conduction state. As for the third switch, a conduction state or a non-conduction state between a first terminal and a second terminal is selected by a third control signal which is different from the first control signal and the second control signal.

A signal corresponding to data held in the first storage circuit is input to the other of the source and the drain of the first transistor. A signal output from the phase-inversion element or an inverted signal thereof is input to the first storage circuit through the third switch in which the first terminal and the second terminal are in the conduction state.

In the above (Structure 2 of Storage Element), the phase-inversion element may be supplied with, as a power supply voltage, a voltage corresponding to a difference between a potential input to the first power supply line and a potential input to the second power supply line.

In the above (Structure 2 of Storage Element), the storage element may further include a second capacitor so that one of a pair of electrodes of the second capacitor is electrically connected to the input terminal of the phase-inversion element. A constant potential can be input to the other of the pair of electrodes of the second capacitor; for example, a low power supply potential or a high power supply potential can be input. The other of the pair of electrodes of the second capacitor may be electrically connected to the first power supply line.

In the above (Structure 1 of Storage Element) or (Structure 2 of Storage Element), the first switch may include a transistor having a conductivity type, and the second switch may include a transistor having another conductivity type. Here, in this specification, in the case where a transistor is used as a switch, a first terminal of the switch corresponds to one of a source and a drain of the transistor, a second terminal of the switch corresponds to the other of the source and the drain of the transistor, and conduction or non-conduction between the first terminal and the second terminal of the switch (i.e., an on state or an off state of the transistor) is selected by a control signal input to a gate of the transistor.

In the above (Structure 1 of Storage Element) or (Structure 2 of Storage Element), the third switch may include a transistor. The transistor may be either an n-channel transistor or a p-channel transistor. Alternatively, an n-channel transistor and a p-channel transistor may be used in combination. For example, an analog switch can be used as the third switch.

In the above (Structure 1 of Storage Element) or (Structure 2 of Storage Element), a constant potential can be input to the other of the pair of electrodes of the first capacitor; for example, a low power supply potential or a high power supply potential can be input. The other of the pair of electrodes of the first capacitor may be electrically connected to the first power supply line.

In the above (Structure 1 of Storage Element) or (Structure 2 of Storage Element), the first storage circuit may be supplied with, as the power supply voltage, a voltage corresponding to a difference between a potential input to the first power supply line and a potential input to the second power supply line. In a period during which the first storage circuit is not supplied with the power supply voltage, the difference between the potential input to the first power supply line and the potential input to the second power supply line can be (substantially) zero.

In the above (Structure 1 of Storage Element) or (Structure 2 of Storage Element), for the first transistor, a transistor including two gates, one of which is provided over an oxide semiconductor layer, and the other of which is provided below the oxide semiconductor layer can be used. The first control signal can be input to one of the gates, and a fourth control signal can be input to the other of the gates. The fourth control signal may be a signal having a constant potential. The constant potential may be a potential supplied to the first power supply line or the second power supply line. Note that the two gates may be electrically connected to each other so that the first control signal is input. The threshold voltage or the like of the first transistor can be controlled by a signal input to the other of the gates. Further, the off-state current of the first transistor can be further reduced.

In the above (Structure 1 of Storage Element) or (Structure 2 of Storage Element), a transistor in which a channel is formed in a layer or a substrate including a semiconductor other than an oxide semiconductor can be used for any of the transistors other than the first transistor among the transistors used for the storage element; for example, a transistor in which a channel is formed in a silicon layer or a silicon substrate can be used. Alternatively, a transistor in which a channel is formed in an oxide semiconductor layer can be used for all the transistors used for the storage element. Further alternatively, a transistor in which a channel is formed in an oxide semiconductor layer can be used for any of the transistors used for the storage elements and the first transistor, and a transistor in which a channel is formed in a layer or a substrate including a semiconductor other than an oxide semiconductor can be used for the rest of the transistors.

In the above (Structure 1 of Storage Element) or (Structure 2 of Storage Element), a structure can be employed in which the first storage circuit includes a first phase-inversion element and a second phase-inversion element, an input terminal of the first phase-inversion element is electrically connected to an output terminal of the second phase-inversion element, and an input terminal of the second phase-inversion element is electrically connected to an output terminal of the first phase-inversion element. The first phase-inversion element and the second phase-inversion element each output a signal corresponding to an input signal only in a period during which a power supply potential is supplied. Note that as the phase-inversion element, for example, an inverter, a clocked inverter, or the like can be used. The structure of the first storage circuit is not limited thereto, and a nonvolatile memory such as a known latch circuit or a flip-flop circuit can be freely used for the first storage circuit.

(Driving Method of Storage Element)

In the above storage element, in the case where in order to reduce power consumption in data holding, after supply of the power supply voltage, the supply of the power supply voltage is stopped and then the power supply voltage is supplied again, a driving method can be as follows.

(Normal Operation)

In a period during which the power supply voltage is supplied to the storage element, the first storage circuit holds data. At this time, the first terminal and the second terminal of the third switch are in the non-conduction state by the third control signal. Note that the first terminal and the second terminal of each of the first switch and the second switch may be in either the conduction state or the non-conduction state; in other words, the second control signal may have either a high-level potential or a low-level potential. Further, the state of the first transistor may be in either the on state or the off state; in other words, the first control signal may have either a high-level potential or a low-level potential.

(Operation Before Stop of Supply of Power Supply Voltage)

Before supply of the power supply voltage to the storage element is stopped, the first transistor is turned on by the first control signal. Thus, a signal corresponding to data held in the first storage circuit is input to the gate of the second transistor through the first transistor. The signal input to the gate of the second transistor is held by the first capacitor. After that, the first transistor is turned off. In this manner, the signal corresponding to the data held in the first storage circuit is held in the second storage circuit. At this time, the first terminal and the second terminal of the third switch are in the non-conduction state by the third control signal. Note that the first terminal and the second terminal of each of the first switch and the second switch may be in either the conduction state or the non-conduction state.

(Operation of Stopping Supply of Power Supply Voltage)

After the above operation, the supply of the power supply voltage to the storage element is stopped. Even after the supply of the power supply voltage to the storage element is stopped, the signal corresponding to the data held in the first storage circuit is held by the first capacitor. Here, an n-channel enhancement (normally-off) transistor whose leakage current (off-state current) is extremely low is used as the first transistor, and a ground potential (0 V) continues to be input to the gate of the first transistor when the supply of the power supply voltage to the storage element is stopped. Consequently, even after the supply of the power supply voltage to the storage element is stopped, the first transistor can be kept in the off state. As a result, a potential held by the first capacitor can be held for a long time. In this manner, even after the supply of the power supply voltage to the storage element is stopped, data is held.

(Operation of Restarting Supply of Power Supply Voltage)

After the supply of the power supply voltage to the storage element is restarted, the first terminal and the second terminal of the second switch are brought into conduction and the first terminal and the second terminal of the first switch are brought out of conduction by the second control signal. At this time, the first transistor remains off. The first terminal and the second terminal of the third switch are in the non-conduction state. Thus, a potential supplied to the second power supply line at the time of supplying the power supply voltage is input to the second terminal of the first switch and the first terminal of the second switch. Therefore, the potential of each of the second terminal of the first switch and the first terminal of the second switch can be set to the potential of the second power supply line (hereinafter, this operation is referred to as pre-charge operation).

After the above pre-charge operation, the first terminal and the second terminal of the first switch are brought into conduction and the first terminal and the second terminal of the second switch are brought out of conduction by the second control signal. At this time, the first transistor remains off. The first terminal and the second terminal of the third switch are in the non-conduction state. Consequently, the potential of each of the second terminal of the first switch and the first terminal of the second switch is determined according to a signal held in the first capacitor. That potential corresponds to either a potential supplied to the first power supply line at the time of supplying the power supply voltage or a potential supplied to the second power supply line at the time of supplying the power supply voltage.

After that, the first terminal and the second terminal of the third switch are brought into conduction by the third control signal; thus, a signal corresponding to the potential of the second terminal of the first switch and the first terminal of the second switch or an inverted signal thereof can be input to the first storage circuit. In this manner, data which has been held before the supply of the power supply voltage to the storage element can be held in the first storage circuit again.

The above is the driving method of the storage element.

(Signal Processing Circuit)

One embodiment of a storage device according to the present invention is a storage device including one or more storage elements described above. One embodiment of a signal processing circuit according to the present invention is a signal processing circuit including the storage device. For example, the storage element is used for a storage device such as a register or a cache memory included in the signal processing circuit.

Further, the signal processing circuit may include some kinds of logic circuits such as an arithmetic circuit which transmits/receives data to/from the storage device in addition to the storage device. Not only the supply of the power supply voltage to the storage device but also the supply of the power supply voltage to the arithmetic circuit which transmits/receives data to/from the storage device may be stopped.

The storage device may have a switching element which controls the supply of the power supply voltage to a storage element. In the case where the supply of the power supply voltage to the arithmetic circuit is stopped, the arithmetic circuit may include a switching element which controls the supply of the power supply voltage.

In a period during which the power supply voltage is not supplied to the storage element, data stored in the first storage circuit corresponding to a nonvolatile memory can be held by the first capacitor provided in the second storage circuit.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the first transistor, a signal held in the first capacitor is held for a long time also in a period during which the power supply voltage is not supplied to the storage element. The storage element can accordingly hold the stored content (data) also in a period during which the supply of the power supply voltage is stopped.

In the second storage circuit, a signal held by the first capacitor is input to the gate of the second transistor. Therefore, after supply of the power supply voltage to the storage element is restarted, the signal held by the first capacitor can be converted into the one corresponding to the state (the on state or the off state) of the second transistor to be read from the second storage circuit. Consequently, an original signal can be accurately read even when a potential corresponding to the signal held by the first capacitor fluctuates to some degree.

By applying such a storage element to a storage device such as a register or a cache memory included in a signal processing circuit, data in the storage device can be prevented from being erased owing to the stop of the supply of the power supply voltage. Further, shortly after the supply of the power supply voltage is restarted, the storage element can return to the state before the power supply is stopped. Therefore, the power supply can be stopped even for a short time in the signal processing circuit or one or a plurality of logic circuits included in the signal processing circuit. Accordingly, it is possible to provide a signal processing circuit whose power consumption can be suppressed and a driving method of the signal processing circuit whose power consumption can be suppressed.

DETAILED DESCRIPTION OF THE INVENTION

Figure 1:
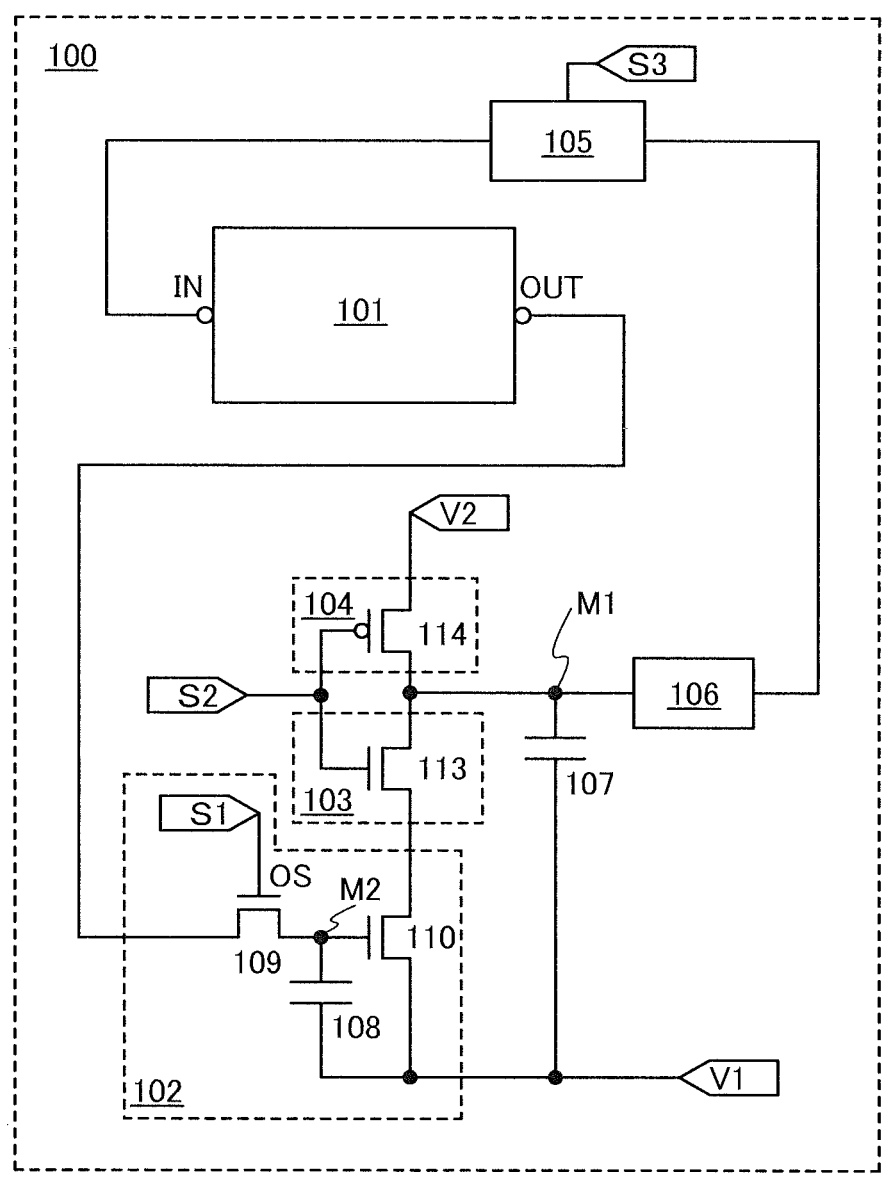
FIG. 1 is a circuit diagram of a storage element.

Hereinafter, embodiments of the present invention will be described in detail with reference to the accompanying drawings. Note that the present invention is not limited to the following description and it is easily understood by those skilled in the art that the mode and details can be variously changed without departing from the spirit and scope of the present invention. Therefore, the present invention should not be interpreted as being limited to the description in the following embodiments.

Functions of a "source" and a "drain" are sometimes interchanged with each other when a transistor of opposite polarity is used or when the direction of current flow is changed in circuit operation, for example. Therefore, the terms "source"

and "drain" can be used to denote the drain and the source, respectively, in this specification.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Even when a circuit diagram shows independent components as if they are electrically connected to each other, there is actually a case where one conductive film has functions of a plurality of components such as a case where part of a wiring also functions as an electrode. The "electrical connection" in this specification includes in its category such a case where one conductive film has functions of a plurality of components.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

The ordinal number such as "first", "second", and "third" are used in order to avoid confusion among components.

Embodiment 1

A signal processing circuit includes a storage device. The storage device includes one or a plurality of storage elements which can store 1-bit data.

Note that the signal processing circuit of the preset invention includes, in its category, a CPU, a large scale integrated circuit (LSI) such as a microprocessor, an image processing circuit, a digital signal processor (DSP), or a field programmable gate array (FPGA), and the like.

(Structure of Storage Element)

FIG. 1 is an example of a circuit diagram of a storage element. A storage element 100 includes a storage circuit 101, a storage circuit 102, a switch 103, a switch 104, a switch 105, a phase-inversion element 106, and a capacitor 107. The storage circuit 101 holds data only in a period during which a power supply voltage is supplied. The storage circuit 102 includes a capacitor 108, a transistor 109, and a transistor 110.

Note that the storage element 100 may further include another circuit element such as a diode, a resistor, or an inductor, as needed.

The transistor 109 is a transistor in which a channel is formed in an oxide semiconductor layer. In FIG. 1, "OS" is written beside a transistor in order to indicate that the transistor 109 has a structure in which a channel is formed in an oxide semiconductor layer. Here, as the transistor 109 in which the channel is formed in the oxide semiconductor layer, an n-channel enhancement (normally-off) transistor whose leakage current (off-state current) is extremely low is used. When supply of a power supply voltage to the storage element 100 is stopped, a ground potential (0 V) continues to be input to a gate of the transistor 109; for example, the gate of the transistor 109 is grounded through a load such as a resistor.

FIG. 1 illustrates an example in which the switch 103 includes a transistor 113 having a conductivity type (e.g., an n-channel transistor) and the switch 104 includes a transistor 114 having another conductivity type (e.g., a p-channel transistor). Here, a first terminal of the switch 103 corresponds to one of a source and a drain of the transistor 113, a second terminal of the switch 103 corresponds to the other of the source and the drain of the transistor 113, and conduction or non-conduction between the first terminal and the second terminal of the switch 103 (i.e., an on state or an off state of the transistor 113) is selected in response to a control signal S2 input to a gate of the transistor 113. A first terminal of the switch 104 corresponds to one of a source and a drain of the transistor 114, a second terminal of the switch 104 corresponds to the other of the source and the drain of the transistor 114, and conduction or non-conduction between the first terminal and the second terminal of the switch 104 (i.e., the on state or the off state of the transistor 114) is selected by the control signal S2 input to a gate of the transistor 114.

One of a source and a drain of the transistor 109 is electrically connected to one of a pair of electrodes of the capacitor 108 and a gate of the transistor 110. Here, the connection portion is referred to as a node M2. One of a source and a drain of the transistor 110 is electrically connected to a power supply line to which a potential V1 is supplied, and the other thereof is electrically connected to the first terminal of the switch 103 (the one of the source and the drain of the transistor 113). The second terminal of the switch 103 (the other of the source and the drain of the transistor 113) is electrically connected to the first terminal of the switch 104 (the one of the source and the drain of the transistor 114). The second terminal of the switch 104 (the other of the source and the drain of the transistor 114) is electrically connected to a power supply line to which a potential V2 is supplied. The second terminal of the switch 103 (the other of the source and the drain of the transistor 113), the first terminal of the switch 104 (the one of the source and the drain of the transistor 114), an input terminal of the phase-inversion element 106, and one of a pair of electrodes of the capacitor 107 are electrically connected to each other. Here, the connection portion is referred to as a node M1. A constant potential can be input to the other of the pair of electrodes of the capacitor 107; for example, a structure can be employed in which a low power supply potential (a ground potential or the like) or a high power supply potential is input. The other of the pair of electrodes of the capacitor 107 may be electrically connected to the power supply line to which the potential V1 is supplied. A constant potential can be input to the other of the pair of electrodes of the capacitor 108; for example, a structure can be employed in which a low power supply potential (a ground potential or the like) or a high power supply potential is input. The other of the pair of electrode of the capacitor 108 may be electrically connected to the power supply line to which the potential V1 is supplied. FIG. 1 illustrates an example in which the other of the pair of electrodes of the capacitor 107 and the other of the pair of electrodes of the capacitor 108 are electrically connected to the power supply line to which the potential V1 is supplied.

Note that the capacitor 107 is not necessarily provided as long as the parasitic capacitance of the transistor or the like is actively utilized. The capacitor 108 is not necessarily provided as long as the parasitic capacitance of the transistor or the like is actively utilized.

A control signal S1 is input to the gate of the transistor 109. As for each of the switch 103 and the switch 104, a conduction state or a non-conduction state between the first terminal and the second terminal is selected by the control signal S2 which is different from the control signal S1. When the first terminal and the second terminal of one of the switches are in the conduction state, the first terminal and the second terminal of the other of the switches are in the non-conduction state. As for the switch 105, a conduction state or a non-conduction state between a first terminal and a second terminal is selected by a control signal S3 which is different from the control signal S1 and the control signal S2.

A signal corresponding to data held in the storage circuit 101 is input to the other of the source and the drain of the transistor 109. FIG. 1 illustrates an example in which a signal output from an output terminal (denoted as OUT in FIG. 1) of the storage circuit 101 is input to the other of the source and the drain of the transistor 109. The phase of a signal output from the second terminal of the switch 103 (the other of the source and the drain of the transistor 113) is inverted by the phase-inversion element 106, and the inverted signal is input to the storage circuit 101 through the switch 105 in which the first terminal and the second terminal are in the conduction state by the control signal S3.

Note that FIG. 1 illustrates an example in which a signal output from the second terminal of the switch 103 (the other of the source and the drain of the transistor 113) is input to an input terminal (denoted as IN in FIG. 1) of the storage circuit 101 through the phase-inversion element 106 and the switch 105; however, one embodiment of the present invention is not limited thereto. A signal output from the second terminal of the switch 103 (the other of the source and the drain of the transistor 113) may be input to the storage circuit 101 without inverting the phase. For example, in the case where a node in which an inverted signal of a signal input from the input terminal is held is provided in the storage circuit 101, a signal output from the second terminal of the switch 103 (the other of the source and the drain of the transistor 113) can be input to the node.

In FIG. 1, the storage element 100 is supplied with, as the power supply voltage, a voltage corresponding to a difference between the potential V1 and the potential V2. The storage circuit 101 may be supplied with, as a power supply voltage, a voltage corresponding to a difference between the potential V1 and the potential V2. In a period during which the storage circuit 101 is not supplied with the power supply voltage, the difference between the potential V1 and the potential V2 can be (substantially) zero; for example, the potential V1 and the potential V2 each can be a ground potential.

The switch 105 may include a transistor. The transistor may be either an n-channel transistor or a p-channel transistor. Alternatively, an n-channel transistor and a p-channel transistor may be used in combination. For example, an analog switch can be used as the switch 105.

In FIG. 1, for the transistor 109, a transistor including two gates, one of which is provided over the oxide semiconductor layer, and the other of which is provided below the oxide semiconductor layer can be used. The control signal S1 can be input to one of the gates, and a control signal S4 can be input to the other of the gates. The control signal S4 may be a signal having a constant potential. The constant potential may be the potential V1 or the potential V2. Note that the two gates provided over and below the oxide semiconductor layer may be electrically connected to each other so that the control signal S1 is input. The threshold voltage of the transistor 109 can be controlled by a signal input to the other gate of the transistor 109. For example, the off-state current of the transistor 109 can be further reduced.

In FIG. 1, a transistor in which a channel is formed in a layer or a substrate including a semiconductor other than an oxide semiconductor can be used for any of the transistors other than the transistor 109 among the transistors used for the storage element 100; for example, a transistor in which a channel is formed in a silicon layer or a silicon substrate can be used. Alternatively, a transistor in which a channel is formed in an oxide semiconductor layer can be used for all the transistors used for the storage element 100. Further alternatively, in the storage element 100, a transistor in which a channel is formed in an oxide semiconductor layer can be included besides the transistor 109, and a transistor in which a channel is formed in a layer or a substrate including a semiconductor other than an oxide semiconductor can be used for the rest of the transistors.

For the oxide semiconductor layer, an In—Ga—Zn-based oxide semiconductor material can be used. A semiconductor other than an oxide semiconductor can be used, such as amorphous silicon, microcrystalline silicon, polycrystalline silicon, single crystal silicon, amorphous germanium, microcrystalline germanium, polycrystalline germanium, or single crystal germanium. The off-state current density of a transistor in which a channel is formed in a highly purified oxide semiconductor layer can be less than or equal to 100 zA/μm, preferably less than or equal to 10 zA/μm, more preferably less than or equal to 1 zA/μm. Thus, the off-state current of the transistor is extremely lower than that of the transistor including silicon with crystallinity. As a result, when the transistor 109 is off, the potential of the node M1, i.e., the potential of the gate of the transistor 110 can be held for a long time.

A material which can realize off-state current characteristics equivalent to those of the oxide semiconductor material, such as a wide gap material like silicon carbide (more specifically, a semiconductor material whose energy gap Eg is larger than 3 eV) may be used instead of the oxide semiconductor material.

A structure can be employed in which the storage circuit 101 in FIG. 1 includes a first phase-inversion element and a second phase-inversion element, an input terminal of the first phase-inversion element is electrically connected to an output terminal of the second phase-inversion element, and an input terminal of the second phase-inversion element is electrically connected to an output terminal of the first phase-inversion element. The first phase-inversion element and the second phase-inversion element each output a signal corresponding to an input signal only in a period during which the power supply potential is supplied.

As the phase-inversion element, for example, an inverter, a clocked inverter, or the like can be used.

The above is the structure of the storage element 100. Next, a driving method thereof will be described.

(Driving Method of Storage Element)

In the storage element 100, in the case where in order to reduce power consumption in data holding, after supply of the power supply voltage, the supply of the power supply voltage is stopped and then the power supply voltage is supplied again, a driving method can be as follows. The driving method will be described with reference to a timing chart in FIG. 2. In the timing chart in FIG. 2, reference numeral 101 denotes data held in the storage circuit 101, reference symbol S1 denotes the potential of the control signal S1, reference symbol S2 denotes the potential of the control signal S2, reference symbol S3 denotes the potential of the control signal S3, reference symbol V1 denotes the potential V1, and reference symbol V2 denotes the potential V2. When a potential difference V between the potential V1 and the potential V2 is 0, the power supply voltage is not supplied. Reference symbol M1 denotes the potential of the node M1, and reference symbol M2 denotes the potential of the node M2.

In the driving method below, an example will be described where, in the case of using an n-channel transistor for the switch 103 and a p-channel transistor for the switch 104 in the structure illustrated in FIG. 1, the first terminal and the second terminal of the switch 103 are brought into conduction and the first terminal and the second terminal of the switch 104 are brought out of conduction when the control signal S2 has a high-level potential, and the first terminal and the second terminal of the switch 103 are brought out of conduction and the first terminal and the second terminal of the switch 104 are brought into conduction when the control signal S2 has a low-level potential. Further, in this example, the first terminal and the second terminal of the switch 105 are brought into conduction when the control signal S3 has a high-level potential, and the first terminal and the second terminal of the switch 105 are brought out of conduction when the control signal S3 has a low-level potential. Furthermore, in the case of using an n-channel transistor for the transistor 109 in this example, the transistor 109 is turned on when the control signal S1 has a high-level potential and the transistor 109 is turned off when the control signal S1 has a low-level potential.

However, a driving method according to one embodiment of the present invention is not limited to this, and in the following description, the potential of each control signal can be determined so that the switch 103, the switch 104, the switch 105, and the transistor 109 are in the same state.

Further, in the following example, the potential V1 is a low power supply potential (hereinafter, referred to as VSS) and the potential V2 switches between a high power supply potential (hereinafter, referred to as VDD) and VSS. VSS can be set to, for example, a ground potential. Note that a driving method according to one embodiment of the present invention is not limited to this, and it is possible to employ a structure in which the potential V2 is VSS and the potential V1 switches between VDD and VSS.

(Normal Operation)

Figure 2:
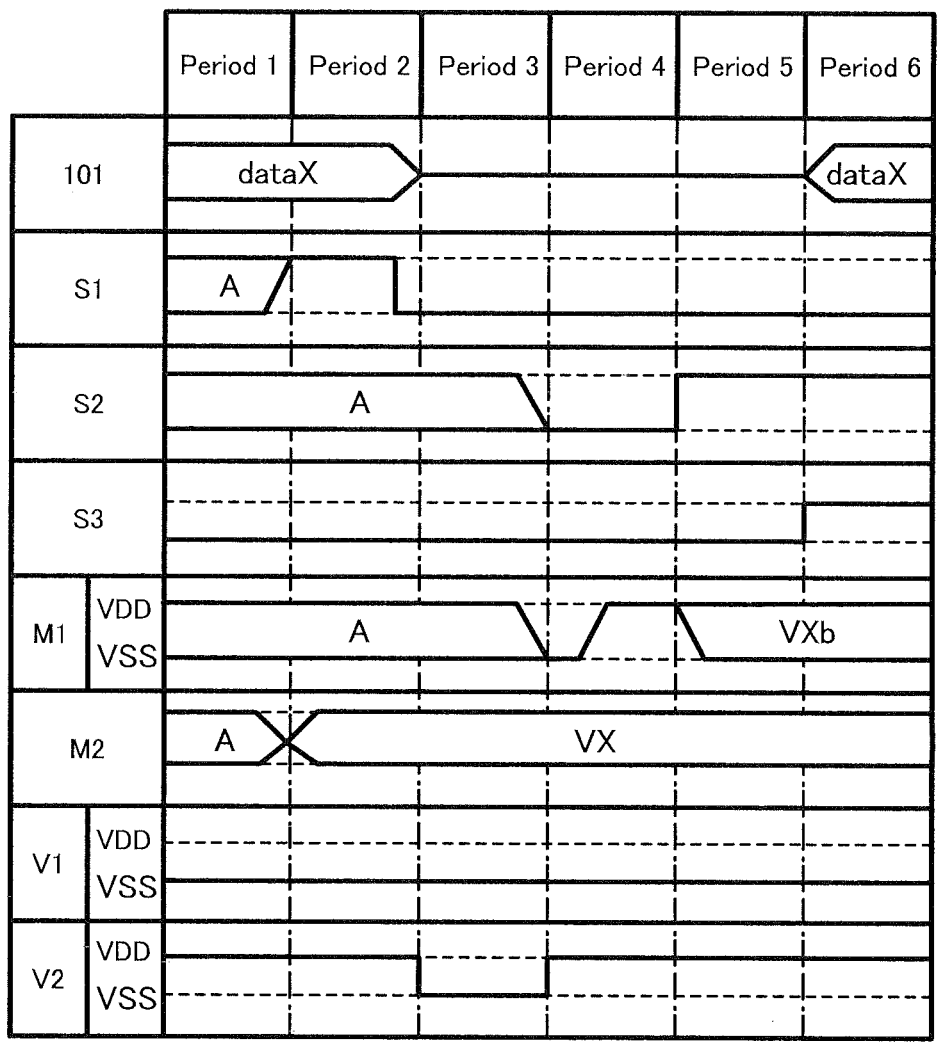
FIG. 2 is a timing chart illustrating operation of a storage element.

The operation in Period 1 in FIG. 2 will be described. In Period 1, the power supply voltage is supplied to the storage element 100. Here, the potential V2 is VDD. In a period during which the power supply voltage is supplied to the storage element 100, data is held in the storage circuit 101 (referred to as dataX in FIG. 2). At this time, the control signal S3 has a low-level potential so that the first terminal and the second terminal of the switch 105 are brought out of conduction. Note that the first terminal and the second terminal of each of the switch 103 and the switch 104 may be in either the conduction state or the non-conduction state. That is, the control signal S2 may have either a high-level potential or a low-level potential (this state is expressed with A in FIG. 2). Further, the transistor 109 may be either on or off. That is, the control signal S1 may have either a high-level potential or a low-level potential (this state is expressed with A in FIG. 2). In Period 1, the node M1 may have any potential (this state is expressed with A in FIG. 2). In Period 1, the node M2 may have any potential (this state is expressed with A in FIG. 2). The operation in Period 1 is referred to as normal operation.

(Operation before Stop of Supply of Power Supply Voltage)

The operation in Period 2 in FIG. 2 will be described. Before supply of the power supply voltage to the storage element 100 is stopped, the control signal S1 is set to a high-level potential so that the transistor 109 is turned on. Thus, a signal corresponding to data held in the storage circuit 101 (dataX) is input to the gate of the transistor 110 through the transistor 109. The signal input to the gate of the transistor 110 is held by the capacitor 108. In this manner, the potential of the node M2 becomes a signal potential corresponding to the data held in the storage circuit 101 (this potential is expressed as VX in FIG. 2). After that, the control signal S1 is set to a low-level potential so that the transistor 109 is turned off. Thus, a signal corresponding to the data held in the storage circuit 101 is held in the storage circuit 102. Also in Period 2, the first terminal and the second terminal of the switch 105 remain in the non-conduction state by the control signal S3. The first terminal and the second terminal of each of the switch 103 and the switch 104 may be in either the conduction state or the non-conduction state. That is, the control signal S2 may have either a high-level potential or a low-level potential (this state is expressed with A in FIG. 2). In Period 2, the node M1 may have any potential (this state is expressed with A in FIG. 2). The operation in Period 2 is referred to as operation before stop of supply of the power supply voltage.

(Operation of Stopping Supply of Power Supply Voltage)

The operation in Period 3 in FIG. 2 will be described. The operation before stop of supply of the power supply voltage is performed, and then, the supply of the power supply voltage to the storage element 100 is stopped at the beginning of Period 3. The potential V2 becomes VSS. When the supply of the power supply voltage is stopped, the data held in the storage circuit 101 (dataX) is erased. However, even after the supply of the power supply voltage to the storage element 100 is stopped, the signal potential (VX) corresponding to the data (dataX) held in the storage circuit 101 is held in the node M2 by the capacitor 108. Here, as the transistor 109, a transistor in which a channel is formed in an oxide semiconductor layer is used. Here, an n-channel enhancement (normally-off) transistor whose leakage current (off-state current) is extremely low is used as the transistor 109, and a ground potential (0 V) continues to be input to the gate of the transistor 109 when the supply of the power supply voltage to the storage element 100 is stopped. Consequently, even after the supply of the power supply voltage to the storage element 100 is stopped, the transistor 109 can be kept in the off state. As a result, a potential held by the capacitor 108 (the potential VX of the node M2) can be held for a long time. In this manner, even after the supply of the power supply voltage to the storage element 100 is stopped, data (dataX) is held. Period 3 corresponds to a period during which the supply of the power supply voltage to the storage element 100 is stopped.

(Operation of Restarting Supply of Power Supply Voltage)

The operation in Period 4 in FIG. 2 will be described. After the supply of the power supply voltage to the storage element is restarted and the potential V2 is set to VDD, the control signal S2 is set to a low-level potential; thus, the first terminal and the second terminal of the switch 104 are brought into conduction and the first terminal and the second terminal of the switch 103 are brought out of conduction. At this time, the control signal S1 is a low-level potential, and the transistor 109 remains off. The control signal S3 is a low-level potential, and thus the first terminal and the second terminal of the switch 105 are in the non-conduction state. In this manner, the potential V2 at the time of supplying the power supply voltage, i.e., VDD is input to the second terminal of the switch 103 and the first terminal of the switch 104. Therefore, the second terminal of the switch 103 and the first terminal of the switch 104 (the potential of the node M1) can be set to a constant potential (e.g., VDD) (hereinafter, this operation is referred to as pre-charge operation). The potential of the node M1 is held by the capacitor 107.

After the above pre-charge operation, in Period 5, the control signal S2 is set to a high-level potential; thus, the first terminal and the second terminal of the switch 103 are brought into conduction and the first terminal and the second terminal of the switch 104 are brought out of conduction. At this time, the control signal S1 keeps having a low-level potential, and the transistor 109 remains off. The control signal S3 has a low-level potential, and thus the first terminal and the second terminal of the switch 105 are out of conduction. Depending on a signal held in the capacitor 108 (the potential VX of the node M2), the on state or the off state of the transistor 110 is selected, and the potential of the second terminal of the switch 103 and the first terminal of the switch 104, i.e., the potential of the node M1 is determined. In the case where the transistor 110 is on, the potential V1 (e.g., VSS) is input to the node M1. On the other hand, in the case where the transistor 110 is off, the potential of the node M1 keeps having a constant potential (e.g., VDD) which is determined by the above pre-charge operation. In this manner, depending on the on state or the off state of the transistor 110, the potential of the node M1 becomes VDD or VSS. For example, in the case where a signal held in the storage circuit 101 is "1" and corresponds to a high-level signal (VDD), the potential of the node M1 becomes a low-level potential (VSS) corresponding to a signal "0". On the other hand, in the case where a signal held in the storage circuit 101 is "0" and corresponds to a low-level potential (VSS), the potential of the node M1 becomes a high-level potential (VDD) corresponding to a signal "1". That is, an inverted signal of a signal held in the storage circuit 101 is held in the node M1. This potential is denoted as VXb in FIG. 2. That is, a signal corresponding to the data (dataX) input from the storage circuit 101 in Period 2 is converted into the potential of the node M1 (VXb).

After that, in Period 6, the control signal S3 is set to a high-level potential, so that the first terminal and the second terminal of the switch 105 are brought into conduction. At this time, the control signal S2 keeps having a high-level potential. The control signal S1 keeps having a low-level potential, and thus the transistor 109 remains off. Consequently, the phase of a signal corresponding to the potential of the second terminal of the switch 103 and the first terminal of the switch 104 (the potential of the node M1 (VXb)) is inverted through the phase-inversion element 106, and this inverted signal can be input to the storage circuit 101. In this manner, the data which has been held before the stop of supplying the power supply voltage to the storage element 100 (dataX) can be held in the storage circuit 101 again.

The potential of the node M1 is set to a constant potential (VDD in FIG. 2) by the pre-charge operation in Period 4, and becomes the potential VXb corresponding to the data (dataX) in Period 5. Since the pre-charge operation is performed, the time required for the potential of the node M1 to be set to the constant potential VXb can be shortened. In this manner, the time required for the storage circuit 101 to hold original data again after the supply of the power supply voltage is restarted can be shortened.

The above is the driving method of the storage element.

In the storage element and the driving method thereof according to one embodiment of the present invention, in a period during which the storage element 100 is not supplied with the power supply voltage, data stored in the storage circuit 101 corresponding to a nonvolatile memory can be held by the capacitor 108 which is provided in the storage circuit 102.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 109, a signal held in the capacitor 108 is held for a long time also in a period during which the power supply voltage is not supplied to the storage element 100. The storage element 100 can accordingly hold the stored content (data) also in a period during which the supply of the power supply voltage is stopped.

Since the switch 103 and the switch 104 are provided, the storage element performs the above pre-charge operation; thus, the time required for the storage circuit 101 to hold original data again after the supply of the power supply voltage is restarted can be shortened.

In the storage circuit 102, a signal held by the capacitor 108 is input to the gate of the transistor 110. Therefore, after supply of the power supply voltage to the storage element 100 is restarted, the signal held by the capacitor 108 can be converted into the one corresponding to the state (the on state or the off state) of the transistor 110 to be read from the storage circuit 102. Consequently, an original signal can be accurately read even when a potential corresponding to the signal held by the capacitor 108 fluctuates to some degree.

By applying the above-described storage element 100 to a storage device such as a register or a cache memory included in a signal processing circuit, data in the storage device can be prevented from being erased owing to the stop of the supply of the power supply voltage. Further, shortly after the supply of the power supply voltage is restarted, the storage element can return to the state before the power supply is stopped. Therefore, the power supply can be stopped even for a short time in the signal processing circuit or one or a plurality of logic circuits included in the signal processing circuit. Accordingly, it is possible to provide a signal processing circuit whose power consumption can be suppressed and a driving method of the signal processing circuit whose power consumption can be suppressed.

This embodiment can be implemented in combination with any of the other embodiments.

Embodiment 2

In this embodiment, a structure of a storage device including a plurality of storage elements described in Embodiment 1 will be described.

Figure 3A:
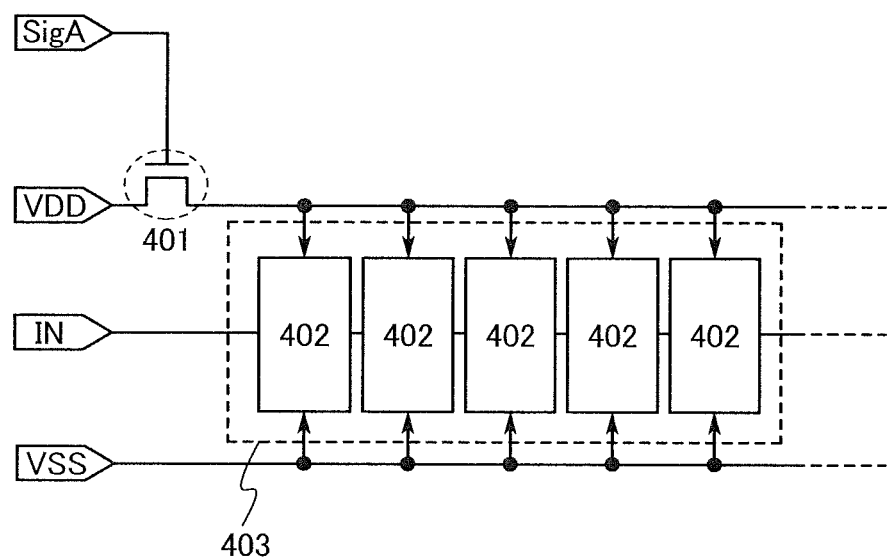
FIGS. 3A and 3B each illustrate a structure of a storage device.

FIG. 3A illustrates a structural example of a storage device of this embodiment. The storage device illustrated in FIG. 3A includes a switching element 401 and a storage element group 403 including a plurality of storage elements 402. Specifically, as each of the storage elements 402, the storage element 100 whose structure is described in Embodiment 1 can be used. Each of the storage elements 402 included in the storage element group 403 is supplied with a high-level power supply potential VDD through the switching element 401. Further, each of the storage elements 402 included in the storage element group 403 is supplied with a potential of a signal IN and a low-level power supply potential VSS.

In FIG. 3A, a transistor is used for the switching element 401, and the switching of the transistor is controlled by a control signal Sig A supplied to a gate electrode thereof.

Note that in FIG. 3A, a structure in which the switching element 401 includes only one transistor is illustrated; however, the present invention is not limited to this structure. In one embodiment of the present invention, the switching element 401 may include a plurality of transistors. In the case where the plurality of transistors which serve as switching elements are included in the switching element 401, the plurality of transistors may be electrically connected to each other in parallel, in series, or in combination of parallel connection and series connection.

Figure 3B:
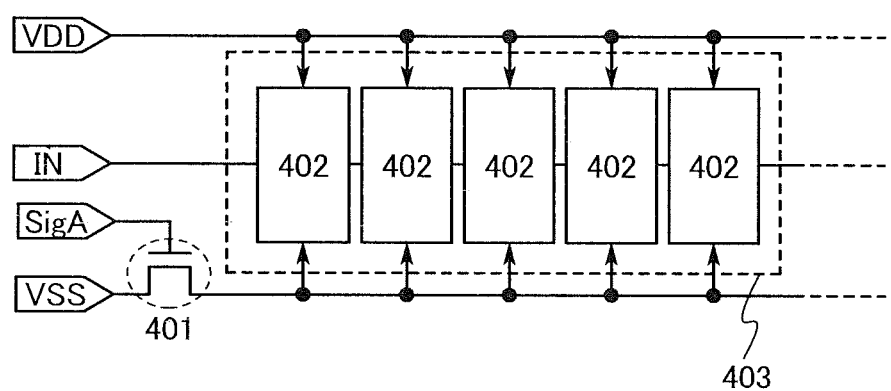

Although the switching element 401 controls the supply of the high-level power supply potential VDD to each of the storage elements 402 included in the storage element group 403 in FIG. 3A, the switching element 401 may control the supply of the low-level power supply potential VSS. In FIG. 3B, an example of a storage device in which each of the storage elements 402 included in the storage element group 403 is supplied with the low-level power supply potential VSS through the switching element 401 is illustrated. The supply of the low-level power supply potential VSS to each of the storage elements 402 included in the storage element group 403 can be controlled by the switching element 401.

This embodiment can be combined as appropriate with the above embodiment.

Embodiment 3

In this embodiment, a structure of a signal processing circuit including the storage device described in Embodiment 2 or the storage element described in Embodiment 1 will be described.

Figure 4:
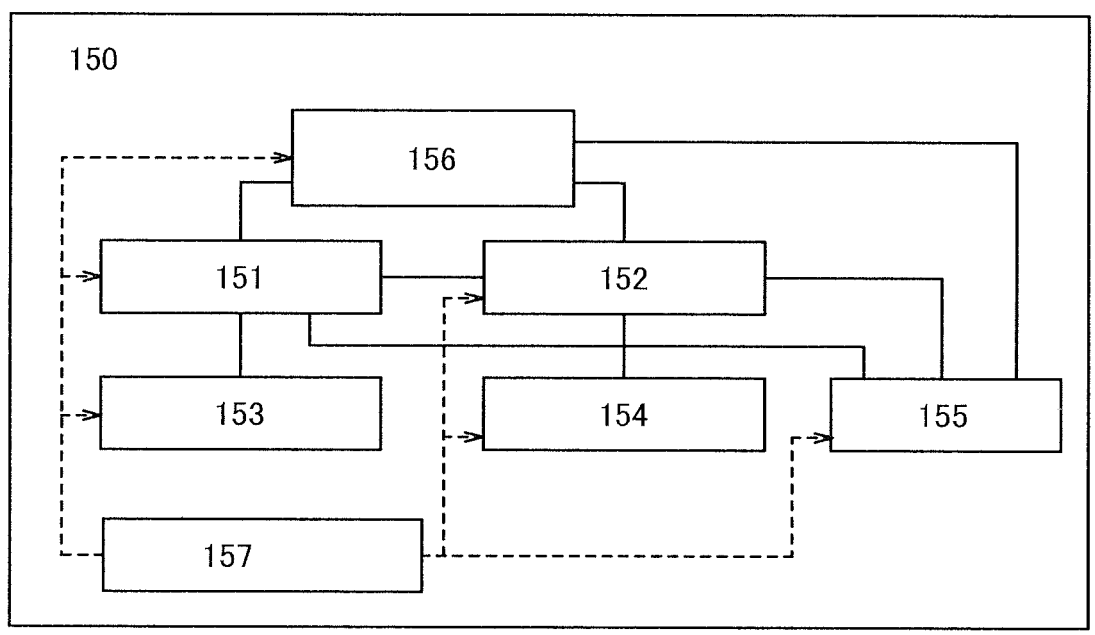
FIG. 4 is a block diagram of a signal processing circuit.

FIG. 4 illustrates an example of a signal processing circuit according to one embodiment of the present invention. The signal processing circuit includes at least one or a plurality of arithmetic circuits and one or a plurality of storage devices. Specifically, a signal processing circuit 150 illustrated in FIG. 4 includes an arithmetic circuit 151, an arithmetic circuit 152, a storage device 153, a storage device 154, a storage device 155, a control device 156, and a power supply control circuit 157.

The arithmetic circuits 151 and 152 each include, as well as a logic circuit which carries out simple logic arithmetic processing, an adder, a multiplier, and various arithmetic circuits. The storage device 153 functions as a register for temporarily holding data when the arithmetic processing is carried out in the arithmetic circuit 151. The storage device 154 functions as a register for temporarily holding data when the arithmetic processing is carried out in the arithmetic circuit 152.

In addition, the storage device 155 can be used as a main memory and can store a program executed by the control device 156 as data or can store data from the arithmetic circuit 151 and the arithmetic circuit 152.

The control device 156 is a circuit which collectively controls operations of the arithmetic circuit 151, the arithmetic circuit 152, the storage device 153, the storage device 154, and the storage device 155 included in the signal processing circuit 150. Note that in FIG. 4, a structure in which the control device 156 is provided in the signal processing circuit 150 as a part thereof is illustrated, but the control device 156 may be provided outside the signal processing circuit 150.

By using the storage element described in Embodiment 1 or the storage device described in Embodiment 2 for the storage device 153, the storage device 154, and the storage device 155, data can be held even when the supply of the power supply voltage to the storage device 153, the storage device 154, and the storage device 155 is stopped. In the above manner, the supply of the power supply voltage to the entire signal processing circuit 150 can be stopped, whereby power consumption can be suppressed. Alternatively, the supply of the power supply voltage to one or more of the storage device 153, the storage device 154, and the storage device 155 can be stopped, whereby power consumption of the signal processing circuit 150 can be suppressed. After the supply of the power supply voltage is resumed, the storage element can return to the state same as that before the supply of the power supply voltage is stopped in a short time.

In addition, as well as the supply of the power supply voltage to the storage device, the supply of the power supply voltage to the control circuit or the arithmetic circuit which transmits/receives data to/from the storage device may be stopped. For example, when the arithmetic circuit 151 and the storage device 153 are not operated, the supply of the power supply voltage to the arithmetic circuit 151 and the storage device 153 may be stopped.

In addition, the power supply control circuit 157 controls the level of the power supply voltage which is supplied to the arithmetic circuit 151, the arithmetic circuit 152, the storage device 153, the storage device 154, the storage device 155, and the control device 156 included in the signal processing circuit 150. Further, in the case where the supply of the power supply voltage is stopped, a switching element for stopping the supply of the power supply voltage may be provided for the power supply control circuit 157, or for each of the arithmetic circuit 151, the arithmetic circuit 152, the storage device 153, the storage device 154, the storage device 155, and the control device 156. In the latter case, the power supply control circuit 157 is not necessarily provided in the signal processing circuit according to the present invention.

A storage device which functions as a cache memory may be provided between the storage device 155 that is a main memory and each of the arithmetic circuit 151, the arithmetic circuit 152, and the control device 156. By providing the cache memory, low-speed access to the main memory can be reduced and the speed of the signal processing such as arithmetic processing can be higher. By applying the above-described storage element also to the storage device functioning as a cache memory, power consumption of the signal processing circuit 150 can be suppressed. After the supply of the power-supply voltage is resumed, the storage element can return to the state same as that before the power supply voltage is stopped in a short time.

This embodiment can be combined as appropriate with any of the above embodiments.

Embodiment 4

In this embodiment, a configuration of a CPU, which is one of signal processing circuits according to one embodiment of the present invention, will be described.

Figure 5:
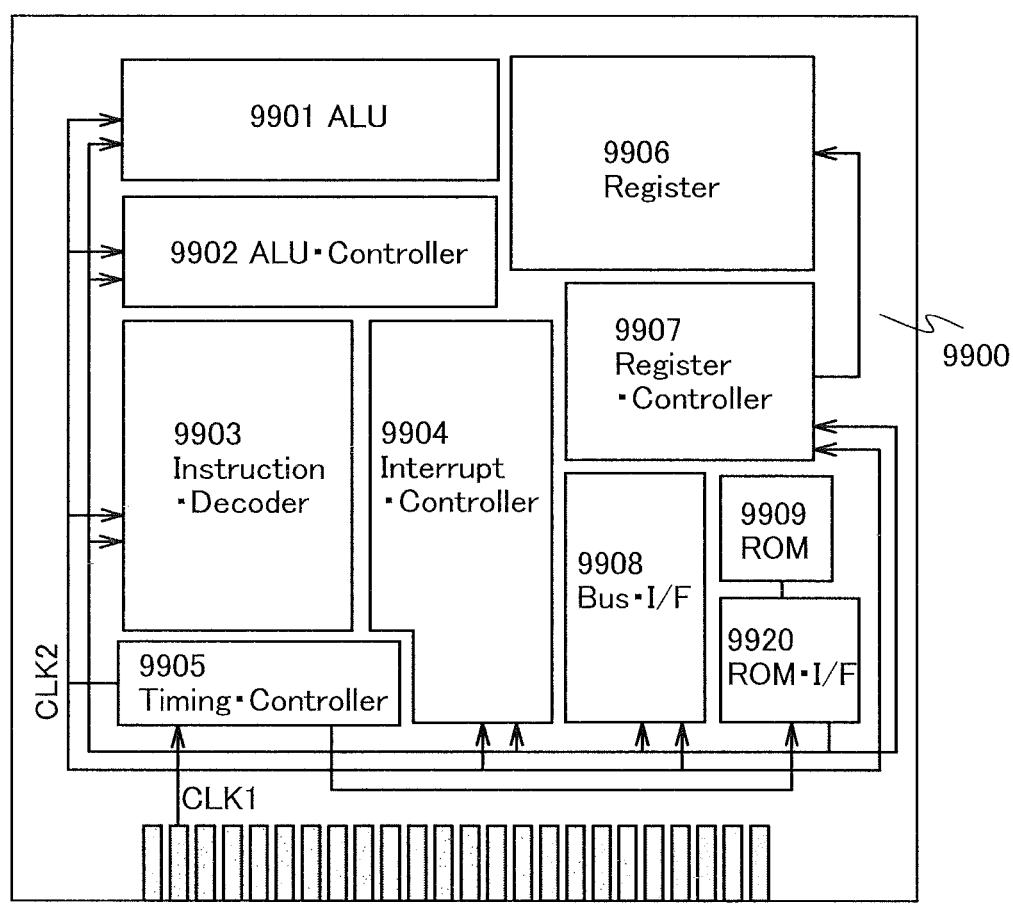
FIG. 5 is a block diagram of a CPU in which a storage device is used.

FIG. 5 illustrates a configuration of the CPU in this embodiment. The CPU illustrated in FIG. 5 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 5 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, a storage element having the structure described in any of the above embodiments is provided in the register 9906. The register controller 9907 determines, in response to an instruction from the ALU 9901, whether data is held by the storage circuit 101 or data is held by the storage circuit 102 in the storage element in the register 9906. When holding data by the feedback loop of the phase-inversion element is selected, a power supply voltage is supplied to the storage element in the register 9906. When holding data in the capacitor is selected, the supply of the power supply voltage to the storage element in the register 9906 can be stopped. The power supply can be stopped by providing a switching element between a storage element group and a node to which the power supply potential VDD or the power supply potential VSS is supplied, as illustrated in FIG. 3A or FIG. 3B.

In such a manner, even in the case where the operation of the CPU is temporarily stopped and the supply of the power supply voltage is stopped, data can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing circuit according to one embodiment of the present invention is not limited to the CPU and can be applied to an LSI such as a microprocessor, an image processing circuit, a digital signal processor (DSP), or a field programmable gate array (FPGA).

This embodiment can be implemented in combination with any of the above embodiments.

Embodiment 5

Described in this embodiment is a manufacturing method of the storage element 100 in FIG. 1 including the transistor 110 in which a channel is formed in silicon. Manufacturing methods of the transistor 110, the transistor 109 in which a channel is formed in an oxide semiconductor layer, and the capacitor 108 will be described as examples for the explanation of the manufacturing method of the storage element 100. Note that other elements included in the storage element 100 can be manufactured in a manner similar to that of the transistor 109, the transistor 110, or the capacitor 108.

Figure 6A:
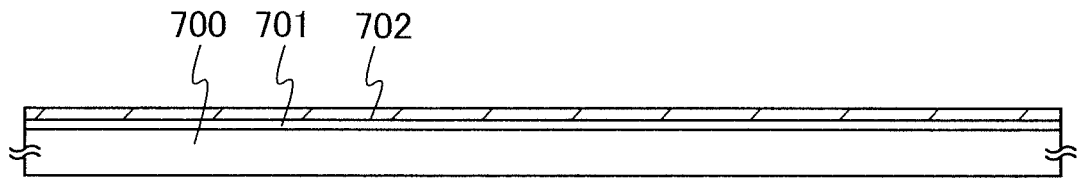
FIGS. 6A to 6D illustrate a manufacturing process of a storage element.

As illustrated in FIG. 6A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used.

In this embodiment, an example in which the semiconductor film 702 is formed using single crystal silicon is given as a manufacturing method of the transistor 110. Note that a specific example of a forming method of the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm² to 500 N/cm², preferably 11 N/cm² to 20 N/cm² is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby microvoids that exist in the fragile layer are combined, so that the microvoids increase in volume. Accordingly, a single crystal semiconductor film which is part of the bond substrate is separated from the bond substrate along the fragile layer. The heat treatment is performed at a temperature not exceeding the strain point of the substrate 700.

Note that although an example in which the single crystal semiconductor film 702 is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 6B:
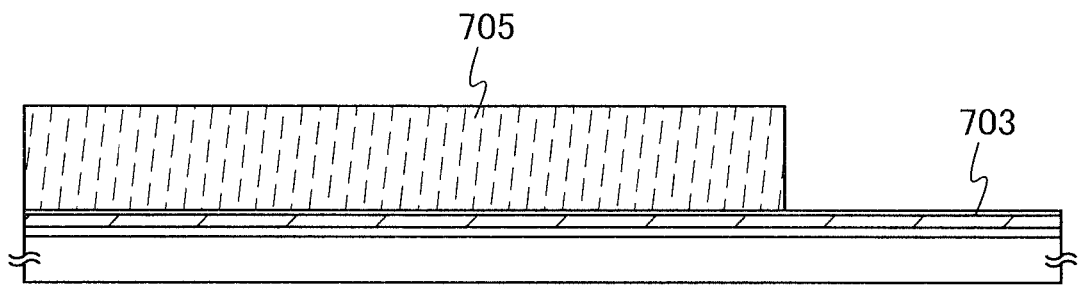

Next, as illustrated in FIG. 6B, a gate insulating film 703 is formed over the semiconductor film 702.

The gate insulating film 703 can be formed by oxidation or nitridation of a surface of the semiconductor film 702 by high-density plasma treatment, heat treatment, or the like. The high-density plasma treatment is performed using, for example, a mixed gas of a rare gas such as He, Ar, Kr, or Xe, and oxygen, nitrogen oxide, ammonia, nitrogen, hydrogen, or the like. In that case, when plasma is excited by introduction of microwaves, plasma with a low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed so as to be in contact with the semiconductor film. For example, nitrous oxide ($N_2O$) is diluted with Ar by 1 time to 3 times (flow rate) and a microwave (2.45 GHz) electric power of 3 kW to 5 kW is applied with a pressure of 10 Pa to 30 Pa so that the oxidation or nitridation of the surface of the semiconductor film 702 is performed. By this treatment, an insulating film having a thickness of 1 nm to 10 nm (preferably 2 nm to 6 nm) is formed. Further, nitrous oxide ($N_2O$) and silane ($SiH_4$) are introduced and a microwave (2.45 GHz) electric power of 3 kW to 5 kW is applied with a pressure of 10 Pa to 30 Pa so that a silicon oxynitride film is formed by vapor deposition, whereby a gate insulating film is formed. With a combination of a solid-phase reaction and a reaction by vapor deposition, the gate insulating film with low interface state density and excellent withstand voltage can be formed.

The oxidation or nitridation of the semiconductor film by the high-density plasma treatment proceeds by a solid-phase reaction. Thus, the interface state density between the gate insulating film 703 and the semiconductor film 702 can be extremely low. Further, the semiconductor film 702 is directly oxidized or nitrided by the high-density plasma treatment, whereby a variation in thickness of the insulating film to be formed can be suppressed. Moreover, in the case where the semiconductor film has crystallinity, the surface of the semiconductor film is oxidized by the solid state reaction through the high-density plasma treatment, whereby rapid oxidation only at crystal grain boundaries can be suppressed and the gate insulating film with favorable uniformity and low interface state density can be formed. A transistor in which the insulating film formed by the high-density plasma treatment is used as part of the gate insulating film or as the whole gate insulating film can have less variation in characteristics.

The gate insulating film 703 may be formed using a single layer or a stack of layers using silicon oxide, silicon nitride oxide, silicon oxynitride, silicon nitride, hafnium oxide, aluminum oxide, tantalum oxide, yttrium oxide, hafnium silicate ($HfSi_xO_y$, (x>0, y>0)), hafnium silicate ($HfSi_xO_y$ (x>0, y>0)) to which nitrogen is added, hafnium aluminate ($HfAl_xO_y$, (x>0, y>0)) to which nitrogen is added, or the like by a plasma CVD method, a sputtering method, or the like.

In this specification, an oxynitride refers to a substance in which the amount of oxygen is larger than that of nitrogen, and a nitride oxide refers to a substance in which the amount of nitrogen is larger than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma CVD method.

Next, as illustrated in FIG. 6B, a mask 705 is formed over the gate insulating film 703. Then, as illustrated in FIG. 6C, an etching process is performed using the mask 705, whereby a semiconductor layer 772 and a gate insulating layer 773 are formed.

In order to control the threshold voltage, an impurity element imparting p-type conductivity, such as boron, aluminum, or gallium, or an impurity element imparting n-type conductivity, such as phosphorus or arsenic, may be added to the semiconductor layer 772. In order to control the threshold voltage, the impurity element may be added to the semiconductor film 702 which has not been subjected to the etching process or the semiconductor layer 772 which is formed through the etching process. Alternatively, in order to control the threshold voltage, the impurity element may be added to the bond substrate. Further alternatively, the impurity element may be added to the bond substrate in order to roughly control the threshold voltage, and the impurity element may be further added to the semiconductor film 702 which has not been subjected to the etching process or the semiconductor layer 772 which is formed through the etching process in order to finely control the threshold voltage.

Figure 6C:
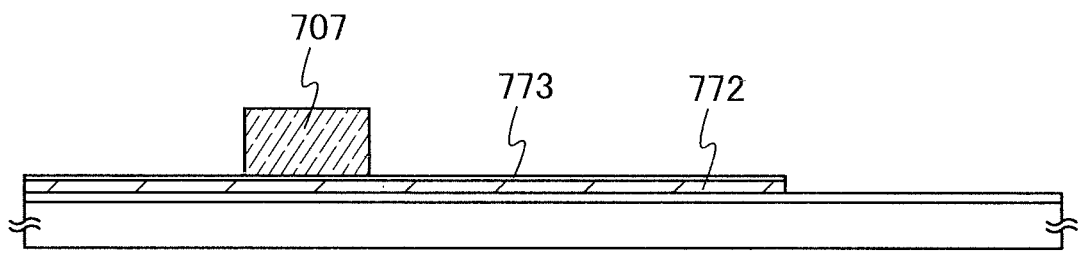

Next, the mask 705 is removed, and then a gate electrode 707 is formed as illustrated in FIG. 6C.

The gate electrode 707 can be formed in such a manner that a conductive film is formed, and then the conductive film is processed by etching into a desired shape. The conductive film can be formed by a CVD method, a sputtering method, an evaporation method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing any of the aforementioned metals as its main component or a compound containing any of the aforementioned metals may be used. Alternatively, the conductive film may be formed using a semiconductor such as polycrystalline silicon doped with an impurity element such as phosphorus which imparts conductivity to the semiconductor film.

Note that although the gate electrode 707 is formed of a single-layer conductive film in this embodiment, this embodiment is not limited to this structure. The gate electrode 707 may be formed of a plurality of stacked conductive films.

As a combination of two conductive films, tantalum nitride or tantalum can be used for a first conductive film and tungsten can be used for a second conductive film. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three or more conductive films are stacked, a layered structure of a molybdenum film, an aluminum film, and a molybdenum film is preferably used.

Further, a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without using a mask. A droplet discharge method is a method for forming a predetermined pattern by discharge or ejection of a droplet containing a predetermined composition from an orifice, and includes an inkjet method in its category.

The gate electrode 707 can be formed in such a manner that the conductive film is etched into a desired tapered shape by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. In addition, angles and the like of the tapered shapes may also be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 6D:
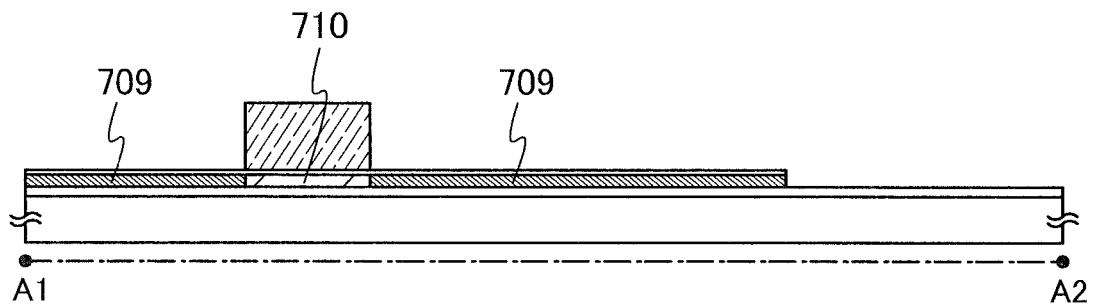

Next, an impurity element imparting one conductivity type is added to the semiconductor layer 772 with the use of the gate electrode 707 as a mask, whereby a channel formation region 710 which overlaps with the gate electrode 707 and a pair of impurity regions 709 with the channel formation region 710 interposed therebetween are formed in the semiconductor layer 772 as illustrated in FIG. 6D.

In this embodiment, the case where an impurity element imparting p-type conductivity (e.g., boron) is added to the semiconductor layer 772 is described as an example.

Figure 7A:
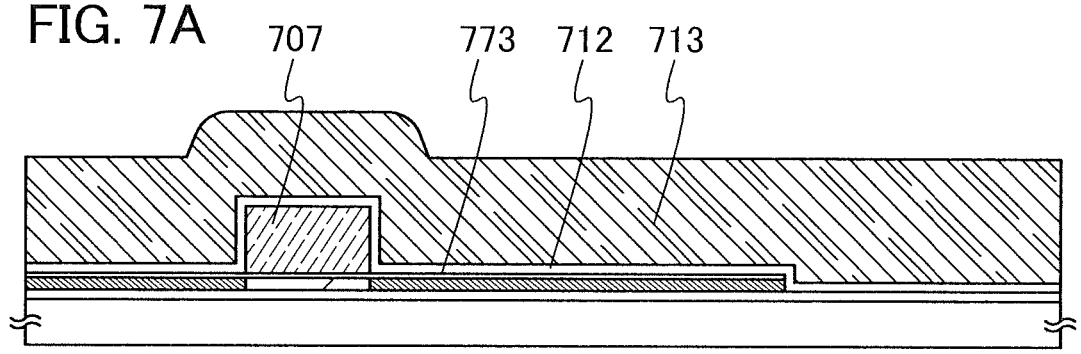
FIGS. 7A to 7C illustrate a manufacturing process of a storage element.

Next, as illustrated in FIG. 7A, insulating films 712 and 713 are formed so as to cover the gate insulating layer 773 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, a material with a low dielectric constant (a low-k material) is preferably used for the insulating films 712 and 713, because capacitance due to overlap of electrodes or wirings can be sufficiently reduced. Note that a porous insulating film including such a material may be employed as the insulating films 712 and 713. A porous insulating film has a lower dielectric constant than an insulating film with high density, and thus allows a further reduction in parasitic capacitance generated by electrodes or wirings.

In this embodiment, an example in which silicon oxynitride is used for the insulating film 712 and silicon nitride oxide is used for the insulating film 713 is described. In addition, an example in which the insulating films 712 and 713 are formed over the gate electrode 707 is described in this embodiment; however, in the present invention, only one insulating film may be formed over the gate electrode 707 or a plurality of insulating films of three or more layers may be stacked.

Figure 7B:
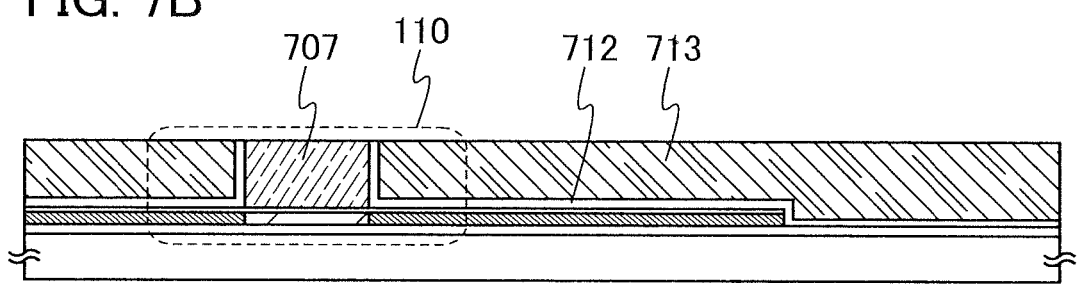

Next, as illustrated in FIG. 7B, the insulating films 712 and 713 are subjected to chemical mechanical polishing (CMP) or etching, so that a surface of the gate electrode 707 is exposed. Note that in order to improve the characteristics of the transistor 109 which is formed later, surfaces of the insulating films 712 and 713 are preferably flattened as much as possible.

Through the above steps, the transistor 110 can be formed.

Figure 7C:
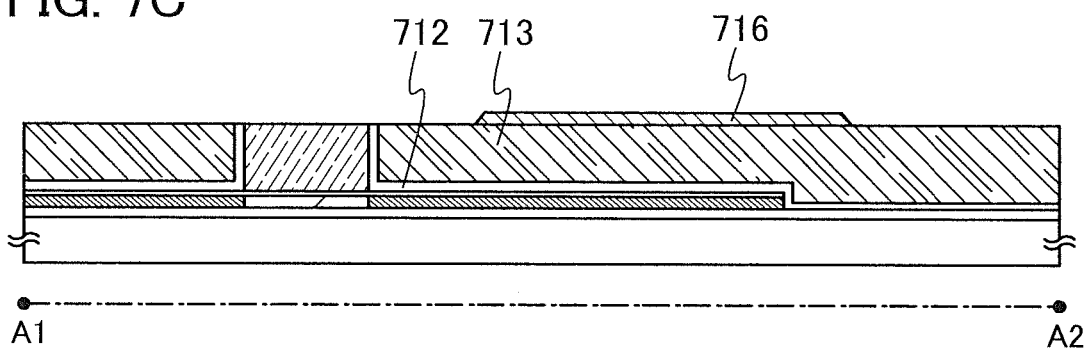

Next, a method for manufacturing the transistor 109 is described. First, as illustrated in FIG. 7C, an oxide semiconductor layer 716 is formed over the insulating film 712 or the insulating film 713.

The oxide semiconductor layer 716 can be formed by processing an oxide semiconductor film formed over the gate insulating films 712 and 713 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on surfaces of the insulating films 712 and 713 is preferably removed by reverse sputtering in which an argon gas is introduced and plasma is generated.

The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

A material (an oxide semiconductor) used for the oxide semiconductor film preferably contains at least indium (In) or zinc (Zn). In particular, In and Zn are preferably contained. As a stabilizer for reducing a variation in electrical characteristics among transistors including the oxide semiconductor film, gallium (Ga) is also preferably contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn, and there is no limitation on the ratio of In:Ga:Zn. Further, the In—Ga—Zn-based oxide may contain a metal element other than In, Ga, and Zn.

Alternatively, a material represented by $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to appropriate values.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2$ r$^2$, and r may be 0.05, for example. The same applies to other oxides.

The oxide semiconductor film may be either amorphous or crystalline.

In an oxide semiconductor in an amorphous state, a flat surface can be obtained with relative ease, so that when a transistor is manufactured with the use of the oxide semiconductor with an amorphous structure, interface scattering can be reduced, and relatively high mobility can be obtained with relative ease.

In an oxide semiconductor having crystallinity, defects in a bulk can be further reduced and when a surface flatness is improved, and mobility higher than that of an oxide semiconductor in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that the average surface roughness ($R_a$) is obtained by expanding, into three dimensions, center line average roughness that is defined by JIS B 0601 so as to be applied to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \quad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents the average height of the plane to be measured. $R_a$ can be measured using an atomic force microscope (AFM).

In this embodiment, as the oxide semiconductor film, an In—Ga—Zn-based oxide semiconductor thin film with a thickness of 30 nm, which is obtained by a sputtering method using a target containing indium (In), gallium (Ga), and zinc (Zn), is used. As the target, a target having a composition ratio of In:Ga:Zn=1:1:0.5, In:Ga:Zn=1:1:1, or In:Ga:Zn=1:1:2 can be used, for example. The filling rate of the target containing In, Ga, and Zn is greater than or equal to 90% and less than or equal to 100%, preferably greater than or equal to 95% and less than 100%. With the use of the target with high filling rate, a dense oxide semiconductor film is formed.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

When the leakage rate of the treatment chamber of the sputtering apparatus is set to $1 \times 10^{-10}$ Pa·m$^3$/s or less, entry of impurities such as an alkali metal and hydride into the oxide semiconductor film that is being deposited by sputtering can be reduced. Further, with the use of the above entrapment vacuum pump as an evacuation system, counter flow of impurities such as alkali metal, a hydrogen atom, a hydrogen molecule, water, a hydroxyl group, and hydride from the evacuation system can be reduced.

When the purity of the target is set to 99.99% or higher, alkali metal, a hydrogen atom, a hydrogen molecule, water, a hydroxyl group, hydride, or the like entering the oxide semiconductor film can be reduced. In addition, when the target is used, the concentration of alkali metal such as lithium, sodium, or potassium can be reduced in the oxide semiconductor film.

In order that the oxide semiconductor film contains as little hydrogen, a hydroxyl group, and moisture as possible, it is preferable that impurities adsorbed on the substrate 700, such as moisture and hydrogen, be eliminated and removed by preheating the substrate 700, over which films up to the insulating films 712 and 713 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that this preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coiled electrode, the amount of electric power applied to an electrode on the substrate side, the electrode temperature on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step to remove a resist residue or the like left over surfaces of the oxide semiconductor layer 716 and the insulating films 712 and 713.

Note that, in some cases, the oxide semiconductor film formed by sputtering or the like contains a large amount of moisture or hydrogen (including a hydroxyl group) as impurities. Moisture and hydrogen easily form a donor level and thus serve as impurities in the oxide semiconductor. Therefore, in one embodiment of the present invention, in order to reduce impurities such as moisture and hydrogen in the oxide semiconductor film (dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may include a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

Note that it is preferable that in the heat treatment, moisture, hydrogen, or the like be not contained in nitrogen or a rare gas such as helium, neon, or argon. It is preferable that the purity of nitrogen or a rare gas such as helium, neon, or argon which is introduced into the heat treatment apparatus be set to be 6N (99.9999%) or higher, preferably 7N (99.99999%) or higher (that is, the impurity concentration is 1 ppm or less, preferably 0.1 ppm or less).

It has been pointed out that an oxide semiconductor is insensitive to impurities, there is no problem even when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, this is not a proper consideration. Alkali metal is not an element included in an oxide semiconductor, and therefore, is an impurity. Also, alkaline-earth metal is an impurity in the case where alkaline-earth metal is not an element included in an oxide semiconductor. Alkali metal, in particular, Na becomes Na when an insulating film in contact with the oxide semiconductor layer is an oxide and Na diffuses into the insulating film. Further, in the oxide semiconductor layer, Na cuts or enters a bond between metal and oxygen which are included in the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor layer is less than or equal to $1\times10^{18}/cm^3$, preferably less than or equal to $1\times10^{17}/cm^3$, the concentration of the above impurity is preferably reduced. Specifically, the Na concentration measured by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, the measurement value of Li concentration is preferably less than or equal to $5\times10^{15}/cm^3$, more preferably less than or equal to $1\times10^{15}/cm^3$. In a similar manner, the measurement value of K concentration is preferably less than or equal to $5\times10^{15}/cm^3$, more preferably less than or equal to $1\times10^{15}/cm^3$.

Through the above steps, the hydrogen concentration in the oxide semiconductor layer 716 can be reduced.

Note that the oxide semiconductor layer may be either amorphous or crystalline. In the latter case, the oxide semiconductor layer may be a single crystal oxide semiconductor layer or a polycrystalline oxide semiconductor layer. Alternatively, the oxide semiconductor layer may have a partially crystalline structure, an amorphous structure including a portion having crystallinity, or a non-amorphous structure. As the oxide semiconductor layer, for example, an oxide including a crystal with c-axis alignment (also referred to as c-axis aligned crystal (CAAC)), which has a triangular or hexagonal atomic arrangement when seen from the direction of an a-b plane, a surface, or an interface can be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

Sputtering may be performed to form an oxide semiconductor film which includes an oxide including CAAC. In order to obtain CAAC by sputtering, it is important to form hexagonal crystals in an initial stage of deposition of an oxide semiconductor film and cause crystal growth from the hexagonal crystals as seeds. In order to achieve this, it is preferable that the distance between the target and the substrate be made longer (e.g., 150 mm to 200 mm) and the substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition, so that microdefects in the film and defects at the interface of a stacked layer can be compensated.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 16A to 16E, FIGS. 17A to 17C, and FIGS. 18A to 18C. In FIGS. 16A to 16E, FIGS. 17A to 17C, and FIGS. 18A to 18C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 16A to 16E, O surrounded by a circle represents tetracoordinate O and O surrounded by a double circle represents tricoordinate O.

Figure 16A:
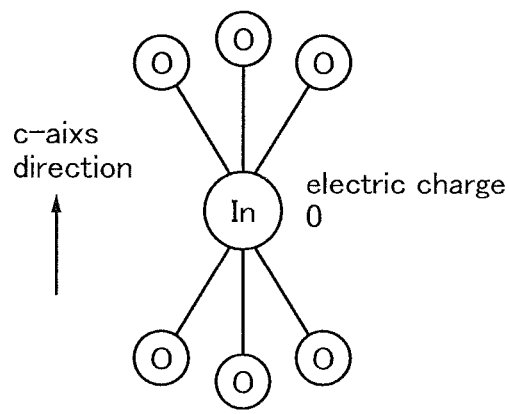
FIGS. 16A to 16E illustrate structures of oxide materials.

FIG. 16A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is illustrated as a planar structure for simplicity. Note that three tetracoordinate O atoms exist in each of an upper half and a lower half in FIG. 16A. In the small group illustrated in FIG. 16A, electric charge is 0.

Figure 16D:
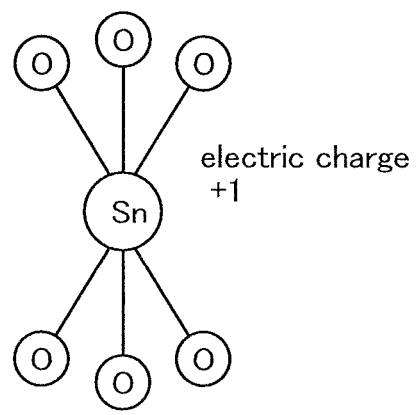
Figure 16B:
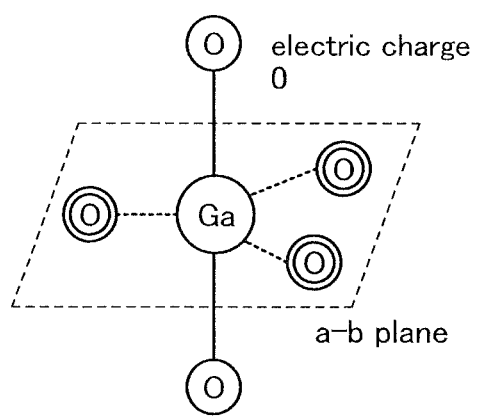

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, electric charge is 0.

Figure 16E:
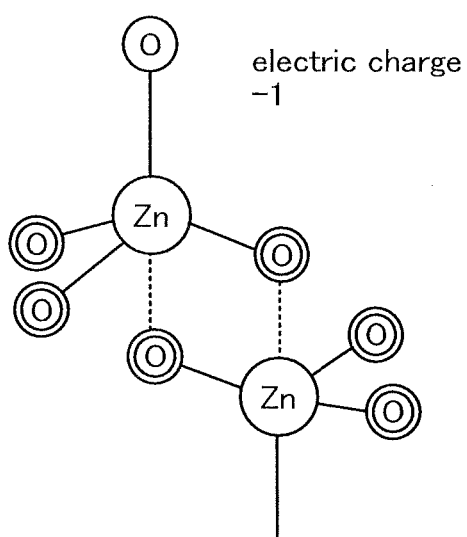
Figure 16C:
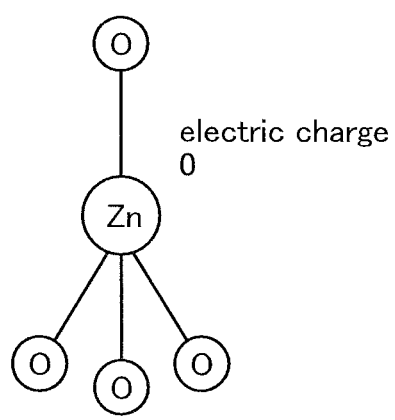

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 16C. In the small group illustrated in FIG. 16C, electric charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half. In the small group illustrated in FIG. 16D, electric charge is +1.

FIG. 16E illustrates a small group including two Zn atoms. In FIG. 16E, one tetracoordinate O atom exists in each of an upper half and a lower half. In the small group illustrated in FIG. 16E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A each have three proximate In atoms in the downward direction, and the three O atoms in the lower half each have three proximate In atoms in the upward direction. The one O atom in the upper half with respect to the pentacoordinate Ga atom in FIG. 16B has one proximate Ga atom in the downward direction, and the one O atom in the lower half has one proximate Ga atom in the upward direction. The one O atom in the upper half with respect to the tetracoordinate Zn atom in FIG. 16C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 17A:
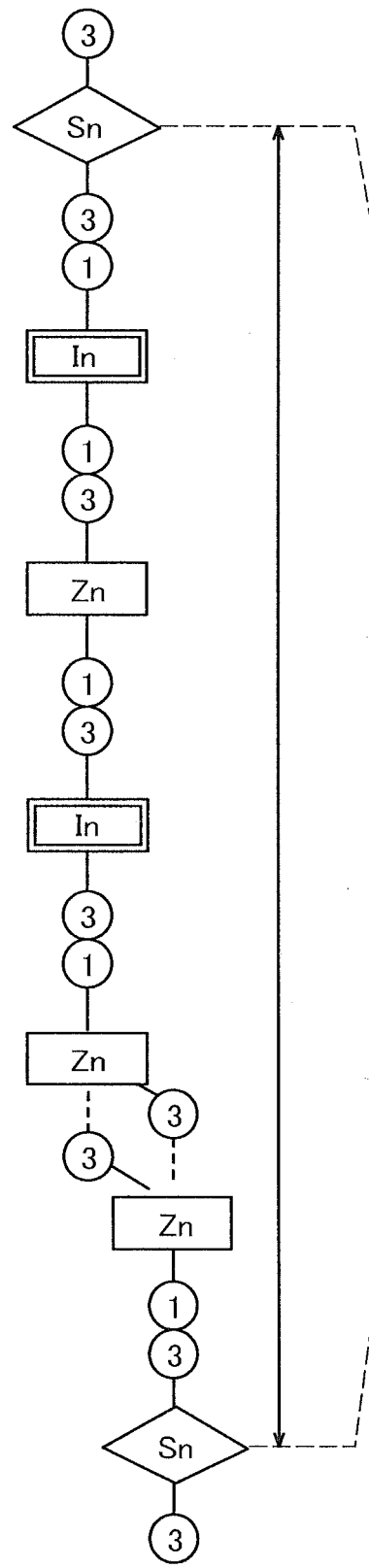
FIGS. 17A to 17C illustrate a structure of an oxide material.
Figure 17B:
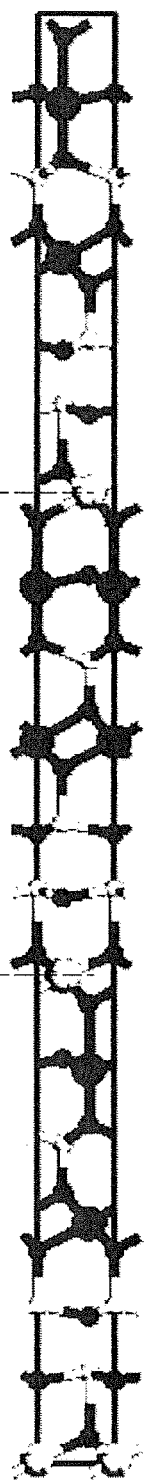
Figure 17C:
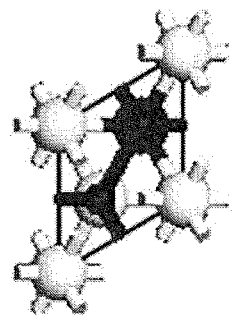

FIG. 17A illustrates a model of a medium group included in a layered structure of an In—Sn—Zn-based oxide. FIG. 17B illustrates a large group including three medium groups. Note that FIG. 17C illustrates an atomic arrangement in the case where the layered structure in FIG. 17B is observed from the c-axis direction.

In FIG. 17A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 17A, one tetracoordinate O atom existing in each of an upper half and a lower half with respect to an In atom is denoted by circled 1. FIG. 17A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 17A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can be 0.

When the large group illustrated in FIG. 17B is repeated, an In—Sn—Zn-based oxide crystal ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 18A:
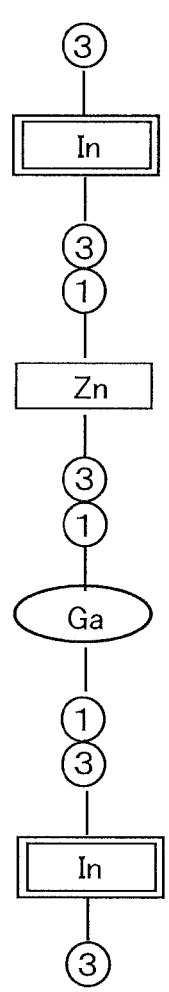
FIGS. 18A to 18C illustrate a structure of an oxide material.

As an example, FIG. 18A illustrates a model of a medium group included in a layered structure of an In—Ga—Zn-based oxide.

In the medium group included in the layered structure of the In—Ga—Zn-based oxide in FIG. 18A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 18B:
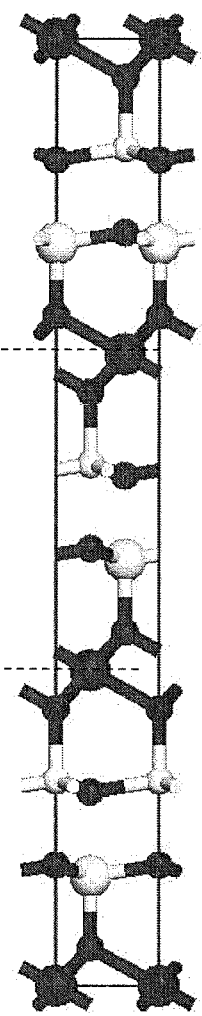
Figure 18C:
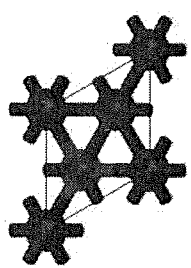

FIG. 18B illustrates a large group including three medium groups. Note that FIG. 18C illustrates an atomic arrangement in the case where the layered structure in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 18A but also a medium group in which the arrangement of the In atom, the Ga atom, and the Zn atom is different from that in FIG. 18A.

Figure 8A:
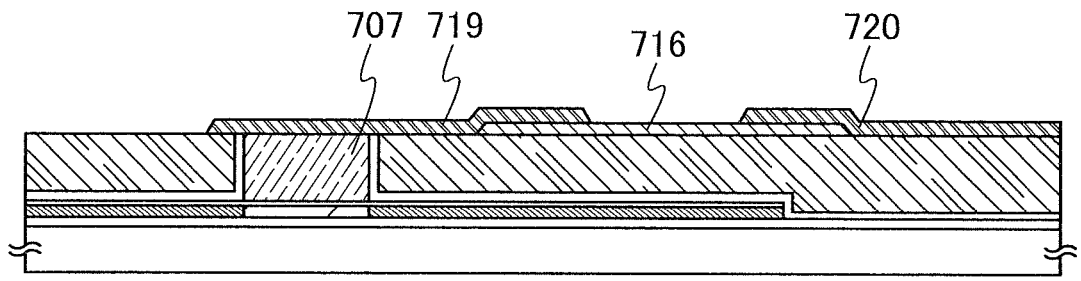
FIGS. 8A to 8C illustrate a manufacturing process of a storage element.

Next, as illustrated in FIG. 8A, the conductive film 719 which is in contact with the gate electrode 707 and the oxide semiconductor layer 716, and the conductive film 720 which is in contact with the oxide semiconductor layer 716 are formed. The conductive film 719 and the conductive film 720 function as a source and drain electrodes.

Specifically, the conductive film 719 and the conductive film 720 can be formed in such a manner that a conductive film is formed by a sputtering method or a vacuum evaporation method so as to cover the gate electrode 707, and then the conductive film is processed by etching into a desired shape.

As the conductive film for forming the conductive films 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to prevent a heat resistance problem and a corrosive problem. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 719 and 720 can be increased.

For the conductive film for forming the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that the material and etching conditions are adjusted as appropriate so that the oxide semiconductor layer 716 is not removed in etching of the conductive film as much as possible. Depending on the etching conditions, there are some cases in which an exposed portion of the oxide semiconductor layer 716 is partially etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of the process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, an etching process for forming the oxide conductive film and an etching process for forming the conductive films 719 and 720 may be performed concurrently.

By providing the oxide conductive film functioning as a source region and a drain region, the resistance between the oxide semiconductor layer 716 and the conductive films 719 and 720 can be lowered, so that the transistor can operate at high speed. In addition, by providing the oxide conductive film functioning as a source region and a drain region, the withstand voltage of the transistor can be increased.

Next, plasma treatment may be performed using a gas such as $N_2O$, $N_2$, or Ar. Through this plasma treatment, water or the like adhering to an exposed surface of the oxide semiconductor layer is removed. Plasma treatment may be performed using a mixture gas of oxygen and argon.

Figure 8B:
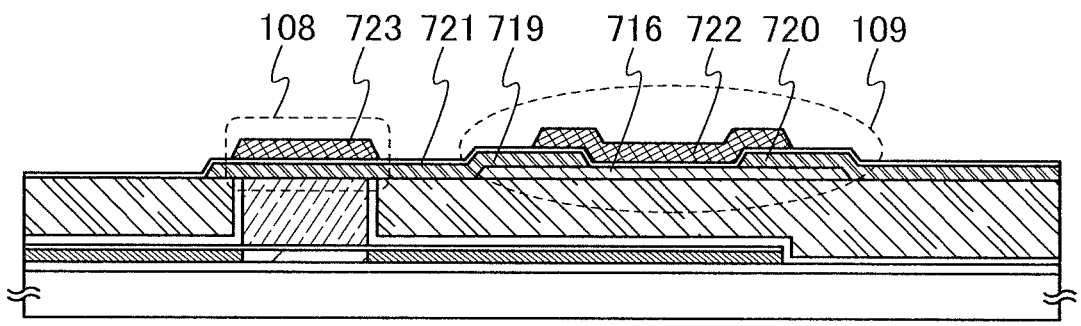

After the plasma treatment, as illustrated in FIG. 8B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the gate insulating film 721 so as to overlap with the conductive film 719.

The gate insulating film 721 can be formed using a material and a layered structure which are similar to those of the gate insulating film 703. Note that the gate insulating film 721 preferably includes impurities such as moisture and hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having a lower proportion of nitrogen such as a silicon oxide film or a silicon oxynitride film is formed on the side closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having a lower proportion of nitrogen sandwiched therebetween. When the insulating film having a high barrier property is used, impurities such as moisture and hydrogen can be prevented from entering the oxide semiconductor layer 716, the gate insulating film 721, or the interface between the oxide semiconductor layer 716 and another insulating film and the vicinity thereof. In addition, the insulating film having a lower proportion of nitrogen such as a silicon oxide film or a silicon oxynitride film formed in contact with the oxide semiconductor layer 716 can prevent the insulating film formed using a material having a high barrier property from being in direct contact with the oxide semiconductor layer 716.

In this embodiment, the gate insulating film 721 with a structure in which a 100-nm-thick silicon nitride film formed by a sputtering method is stacked over a 200-nm-thick silicon oxide film formed by a sputtering method is formed. The substrate temperature in film formation may be higher than or equal to room temperature and lower than or equal to 300° C. and in this embodiment, is 100° C.

After the gate insulating film 721 is formed, heat treatment may be performed. The heat treatment is performed in a nitrogen atmosphere, an atmosphere of ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably 20 ppm or less, more preferably 1 ppm or less, further preferably 10 ppb or less. For example, heat treatment is performed at 250° C. for one hour in a nitrogen atmosphere in this embodiment. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen deficiency is generated in the oxide semiconductor layer 716 by the previous heat treatment performed on the oxide semiconductor layer 716 by performing heat treatment after providing the gate insulating film 721 containing oxygen, oxygen is supplied to the oxide semiconductor layer 716 from the gate insulating film 721. By supplying oxygen to the oxide semiconductor layer 716, oxygen deficiency that serves as a donor can be reduced in the oxide semiconductor layer 716 and the stoichiometric ratio can be satisfied. It is preferable that the proportion of oxygen in the oxide semiconductor layer 716 be higher than that in the stoichiometric composition. As a result, the oxide semiconductor layer 716 can be made to be substantially i-type and variation in electrical characteristics of the transistor due to oxygen deficiency can be reduced; thus, electrical characteristics can be improved. The timing of this heat treatment is not particularly limited as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without the number of steps increased.

Moreover, the oxygen deficiency that serves as a donor in the oxide semiconductor layer 716 may be reduced by subjecting the oxide semiconductor layer 716 to heat treatment in an oxygen atmosphere so that oxygen is added to the oxide semiconductor. The heat treatment is performed at a temperature higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like to reduce oxygen deficiency serving as a donor. For example, oxygen which is made into a plasma state with a microwave at 2.45 GHz may be added to the oxide semiconductor layer 716.

The gate electrode 722 and the conductive film 723 can be formed in such a manner that a conductive film is formed over the gate insulating film 721 and then is processed by etching. The gate electrode 722 and the conductive film 723 can be formed using a material similar to that of the gate electrode 707 or the conductive films 719 and 720.

The thickness of each of the gate electrode 722 and the conductive film 723 is 10 nm to 400 nm, preferably 100 nm to 200 nm. In this embodiment, after a conductive film for the gate electrode is formed to a thickness of 150 nm by a sputtering method using a tungsten target, the conductive film is processed into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the transistor 109 is formed.

Note that a portion where the conductive film 719 and the conductive film 723 overlap with each other with the gate insulating film 721 provided therebetween corresponds to the capacitor 108.

Although the transistor 109 is described as a single-gate transistor, a multi-gate transistor including a plurality of channel formation regions can be manufactured when a plurality of gate electrodes electrically connected to each other are included, if needed.

Note that an insulating film in contact with the oxide semiconductor layer 716 (which corresponds to the gate insulating film 721 in this embodiment) may be formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the oxide semiconductor layer, an interface with the oxide semiconductor layer can keep a favorable state.

An insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pileup of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor layer.

The insulating material of the insulating film in contact with the oxide semiconductor layer 716 is preferably made to contain oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes oxygen plasma doping in which oxygen which is made to be plasma is added to a bulk. The oxygen doping may be performed by an ion implantation method or an ion doping method.

For example, in the case where the insulating film in contact with the oxide semiconductor layer 716 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film which includes a region where the proportion of oxygen is higher than that in the stoichiometric composition may be applied to either the insulating film located on the upper side of the oxide semiconductor layer 716 or the insulating film located on the lower side of the oxide semiconductor layer 716 of the insulating films in contact with the oxide semiconductor layer 716; however, it is preferable to apply such an insulating film to both of the insulating films in contact with the oxide semiconductor layer 716. The above-described effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and located on the upper side and the lower side of the oxide semiconductor layer 716.

The insulating films on the upper side and the lower side of the oxide semiconductor layer 716 may contain the same constituent elements or different constituent elements. For example, the insulating films on the upper side and the lower side may be both formed using gallium oxide whose composition is $Ga_2O_x$ ($x=3+\alpha$, $0<\alpha<1$). Alternatively, one of the insulating films on the upper side and the lower side may be formed using $Ga_2O_x$ ($x=3+\alpha$, $0<\alpha<1$) and the other may be formed using aluminum oxide whose composition is $Al_2O_x$ ($x=3+\alpha$, $0<\alpha<1$).

The insulating film in contact with the oxide semiconductor layer 716 may be formed by stacking insulating films each including a region where the proportion of oxygen is higher than that in the stoichiometric composition. For example, the insulating film on the upper side of the oxide semiconductor layer 716 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) is formed thereover. Note that the insulating film on the lower side of the oxide semiconductor layer 716 may be formed by stacking insulating films each including a region where the proportion of oxygen is higher than that in the stoichiometric composition. Further, both of the insulating films on the upper side and the lower side of the oxide semiconductor layer 716 may be formed by stacking insulating films each including a region where the proportion of oxygen is higher than that in the stoichiometric composition.

Figure 8C:
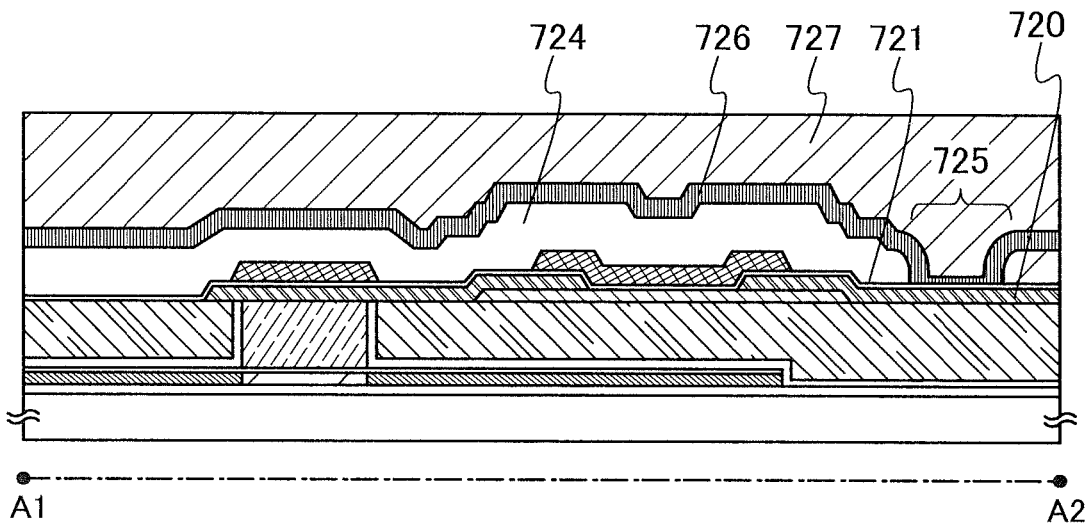

Next, as illustrated in FIG. 8C, an insulating film 724 is formed so as to cover the gate insulating film 721, the conductive film 723, and the gate electrode 722. The insulating film 724 can be formed by a PVD method, a CVD method, or the like. The insulating film 724 can be formed using a material containing an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, the parasitic capacitance generated between wirings or electrodes can be reduced, which results in higher speed operation. Note that although the insulating film 724 has a single-layer structure in this embodiment, one embodiment of the present invention is not limited to this. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

The wiring 726 is formed in such a manner that a conductive film is formed by a PVD method or a CVD method and then the conductive film is processed by etching. As a material of the conductive film, an element selected from aluminum, chromium, copper, tantalum, titanium, molybdenum, or tungsten, an alloy containing any of these elements as a component, or the like can be used. Any of manganese, magnesium, zirconium, beryllium, neodymium, and scandium, or a material containing any of these in combination may be used.

Specifically, for example, it is possible to employ a method in which a thin titanium film is formed in a region including the opening of the insulating film 724 by a PVD method and a thin titanium film (with a thickness of about 5 nm) is formed by a PVD method, and then, an aluminum film is formed so as to be embedded in the opening 725. Here, the titanium film formed by a PVD method has a function of reducing an oxide film (e.g., a natural oxide film) formed on a surface where the titanium film is formed, to decrease contact resistance with a lower electrode (here, the conductive film 720). In addition, hillock of the aluminum film can be prevented. A copper film may be formed by a plating method after the formation of the barrier film of titanium, titanium nitride, or the like.

Next, an insulating film 727 is formed so as to cover the wiring 726. Through the series of steps, the storage element can be manufactured.

Note that in the manufacturing method, the conductive films 719 and 720 functioning as source and drain electrodes are formed after the formation of the oxide semiconductor layer 716. Thus, as illustrated in FIG. 8B, in the transistor 109 obtained by the manufacturing method, the conductive films 719 and 720 are formed over the oxide semiconductor layer 716. However, in the transistor 109, the conductive films functioning as source and drain electrodes may be formed below the oxide semiconductor layer 716, that is, between the oxide semiconductor layer 716 and the insulating films 712 and 713.

Figure 9:
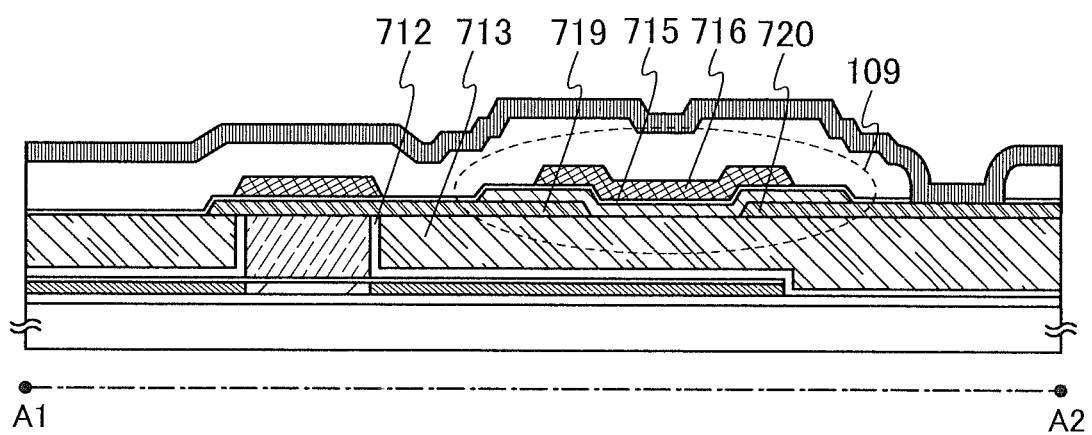
FIG. 9 is a cross-sectional view illustrating a structure of a storage element.

FIG. 9 is a cross-sectional view of the transistor 109 in the case where the conductive films 719 and 720 functioning as source and drain electrodes are provided between the oxide semiconductor layer 716 and the insulating films 712 and 713. The transistor 109 illustrated in FIG. 9 can be obtained in such a manner that the conductive films 719 and 720 are formed after the formation of the insulating film 713, and then, the oxide semiconductor layer 716 is formed.

This embodiment can be implemented in combination with any of the above embodiments.

Embodiment 6

In this embodiment, a transistor which includes an oxide semiconductor layer and has a structure different from that in Embodiment 5 will be described.

Figure 10A:
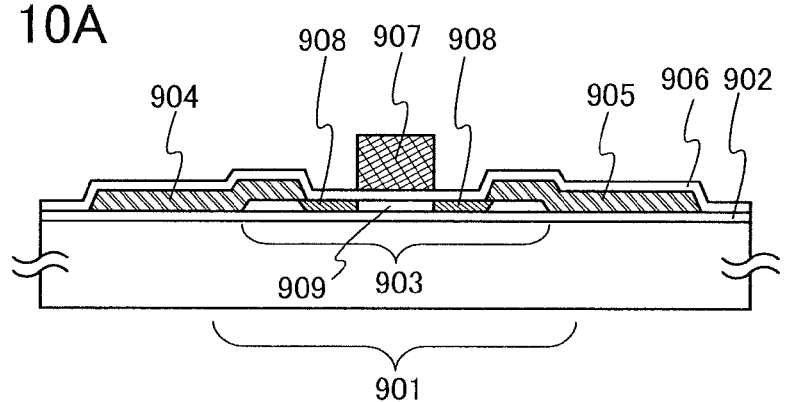
FIGS. 10A to 10D are cross-sectional views each illustrating a structure of a transistor in which a channel is formed in an oxide semiconductor layer.

A transistor 901 illustrated in FIG. 10A includes an oxide semiconductor layer 903 which is formed over an insulating film 902 and functions as an active layer; a source electrode 904 and a drain electrode 905 formed over the oxide semiconductor layer 903; a gate insulating film 906 over the oxide semiconductor layer 903, and the source electrode 904 and the drain electrode 905; and a gate electrode 907 which is provided over the gate insulating film 906 so as to overlap with the oxide semiconductor layer 903.

The transistor 901 illustrated in FIG. 10A is of a top-gate type where the gate electrode 907 is formed over the oxide semiconductor layer 903, and is also of a top-contact type where the source electrode 904 and the drain electrode 905 are formed over the oxide semiconductor layer 903. In the transistor 901, the source electrode 904 and the drain electrode 905 do not overlap with the gate electrode 907. That is, the distance between the gate electrode 907 and each of the source electrode 904 and the drain electrode 905 is larger than the thickness of the gate insulating film 906. Therefore, in the transistor 901, the parasitic capacitance generated between the gate electrode 907 and each of the source electrode 904 and the drain electrode 905 can be small, so that the transistor 901 can operate at high speed.

The oxide semiconductor layer 903 includes a pair of high-concentration regions 908 which are obtained by addition of dopant imparting n-type conductivity to the oxide semiconductor layer 903 after formation of the gate electrode 907. Further, the oxide semiconductor layer 903 includes a channel formation region 909 which overlaps with the gate electrode 907 with the gate insulating film 906 interposed therebetween. In the oxide semiconductor layer 903, the channel formation region 909 is provided between the pair of high-concentration regions 908. The addition of dopant for forming the high-concentration regions 908 can be performed by an ion implantation method. As the dopant, for example, a rare gas such as helium, argon, or xenon, a Group 15 element such as nitrogen, phosphorus, arsenic, or antimony, or the like can be used.

For example, in the case where nitrogen is used as the dopant, the concentration of nitrogen atoms in the high-concentration regions 908 is preferably higher than or equal to $5 \times 10^{19}/cm^3$ and lower than or equal to $1 \times 10^{22}/cm^3$.

The high-concentration regions 908 to which the dopant imparting n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

In the case where an In—Ga—Zn-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source electrode 904 and the drain electrode 905 can be decreased. Note that in order to effectively decrease the resistance between the source electrode 904 and the drain electrode 905 by forming an oxide semiconductor having a wurtzite crystal structure, in the case of using nitrogen as the dopant, the concentration of nitrogen atoms in the high-concentration regions 908 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 903 may include an oxide including CAAC. In the case where the oxide semiconductor layer 903 includes an oxide including CAAC, the conductivity of the oxide semiconductor layer 903 can be increased as compared to the case of an amorphous semiconductor; thus, the resistance between the source electrode 904 and the drain electrode 905 can be decreased.

By decreasing the resistance between the source electrode 904 and the drain electrode 905, high on-state current and high-speed operation can be ensured even when the transistor 901 is miniaturized. With the miniaturization of the transistor 901, the area occupied by the storage element including the transistor can be reduced and the storage capacity per unit area can be increased.

Figure 10B:
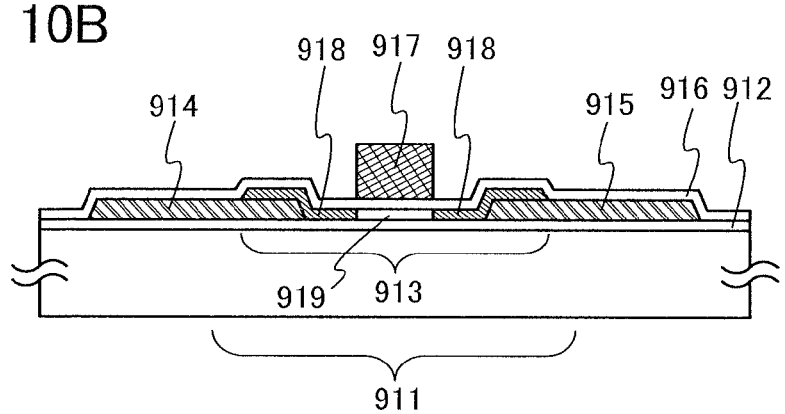

A transistor 911 illustrated in FIG. 10B includes a source electrode 914 and a drain electrode 915 formed over an insulating film 912; an oxide semiconductor layer 913 which is formed over the source electrode 914 and the drain electrode 915 and functions as an active layer; a gate insulating film 916 over the oxide semiconductor layer 913, and the source electrode 914 and the drain electrode 915; and a gate electrode 917 which is provided over the gate insulating film 916 so as to overlap with the oxide semiconductor layer 913.

The transistor 911 illustrated in FIG. 10B is of a top-gate type where the gate electrode 917 is formed over the oxide semiconductor layer 913, and is also of a bottom-contact type where the source electrode 914 and the drain electrode 915 are formed below the oxide semiconductor layer 913. In the transistor 911, the source electrode 914 and the drain electrode 915 do not overlap with the gate electrode 917 as in the transistor 901; thus, the parasitic capacitance generated between the gate electrode 917 and each of the source electrode 914 and the drain electrode 915 can be small, so that the transistor 911 can operate at high speed.

The oxide semiconductor layer 913 includes a pair of high-concentration regions 918 which are obtained by addition of dopant imparting n-type conductivity to the oxide semiconductor layer 913 after formation of the gate electrode 917. Further, the oxide semiconductor layer 913 includes a channel formation region 919 which overlaps with the gate electrode 917 with the gate insulating film 916 interposed therebetween. In the oxide semiconductor layer 913, the channel formation region 919 is provided between the pair of high-concentration regions 918.

Like the above-described high-concentration regions 908 included in the transistor 901, the high-concentration regions 918 can be formed by an ion implantation method. The kind of dopant in the case of the high-concentration regions 908 can be referred to for the kind of dopant for forming the high-concentration regions 918.

For example, in the case where nitrogen is used as the dopant, the concentration of nitrogen atoms in the high-concentration regions 918 is preferably higher than or equal to $5 \times 10^{19}/cm^3$ and lower than or equal to $1 \times 10^{22}/cm^3$.

The high-concentration regions 918 to which the dopant imparting n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 913 may include an oxide including CAAC. In the case where the oxide semiconductor layer 913 includes an oxide including CAAC, the conductivity of the oxide semiconductor layer 913 can be increased as compared to the case of an amorphous semiconductor; thus, the resistance between the source electrode 914 and the drain electrode 915 can be decreased.

By decreasing the resistance between the source electrode 914 and the drain electrode 915, high on-state current and high-speed operation can be ensured even when the transistor 911 is miniaturized. With the miniaturization of the transistor 911, the area occupied by the storage element including the transistor can be reduced and the storage capacity per unit area can be increased.

Figure 10C:
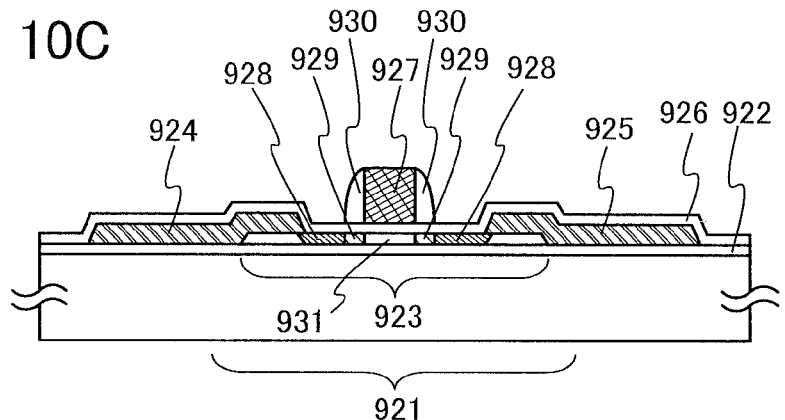

A transistor 921 illustrated in FIG. 10C includes an oxide semiconductor layer 923 which is formed over an insulating film 922 and functions as an active layer; a source electrode 924 and a drain electrode 925 formed over the oxide semiconductor layer 923; a gate insulating film 926 over the oxide semiconductor layer 923, and the source electrode 924 and the drain electrode 925; and a gate electrode 927 which is provided over the gate insulating film 926 so as to overlap with the oxide semiconductor layer 923. In addition, the transistor 921 includes a sidewall insulator 930 which is formed of an insulating film and is provided on a side surface of the gate electrode 927.

The transistor 921 illustrated in FIG. 10C is of a top-gate type where the gate electrode 927 is formed over the oxide semiconductor layer 923, and is also of a top-contact type where the source electrode 924 and the drain electrode 925 are formed over the oxide semiconductor layer 923. In the transistor 921, the source electrode 924 and the drain electrode 925 do not overlap with the gate electrode 927 as in the transistor 901; thus, the parasitic capacitance generated between the gate electrode 927 and each of the source electrode 924 and the drain electrode 925 can be small, so that the transistor 921 can operate at high speed.

The oxide semiconductor layer 923 includes a pair of high-concentration regions 928 and a pair of low-concentration regions 929 which are obtained by addition of dopant imparting n-type conductivity to the oxide semiconductor layer 923 after formation of the gate electrode 927. Further, the oxide semiconductor layer 923 includes a channel formation region 931 which overlaps with the gate electrode 927 with the gate insulating film 926 interposed therebetween. In the oxide semiconductor layer 923, the channel formation region 931 is provided between the pair of low-concentration regions 929 which are provided between the pair of high-concentration regions 928. The pair of low-concentration regions 929 is provided in a region which is in the oxide semiconductor layer 923 and overlaps with the sidewall insulator 930 with the gate insulating film 926 interposed therebetween.

Like the above-described high-concentration regions 908 included in the transistor 901, the high-concentration regions 928 and the low-concentration regions 929 can be formed by an ion implantation method. The kind of dopant in the case of the high-concentration regions 908 can be referred to for the kind of dopant for forming the high-concentration regions 928.

For example, in the case where nitrogen is used as the dopant, the concentration of nitrogen atoms in the high-concentration regions 928 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 929 is preferably higher than or equal to $5 \times 10^{18}/cm^3$ and lower than $5 \times 10^{19}/cm^3$.

The high-concentration regions 928 to which the dopant imparting n-type conductivity is added have higher conductivity than the other regions in the oxide semiconductor layer 923. Therefore, by providing the high-concentration regions 928 in the oxide semiconductor layer 923, the resistance between the source electrode 924 and the drain electrode 925 can be decreased. The low-concentration regions 929 are provided between the channel formation region 931 and the high-concentration regions 928, whereby a negative shift of the threshold voltage due to a short-channel effect can be reduced.

In the case where an In—Ga—Zn-based oxide semiconductor is used for the oxide semiconductor layer 923, heat treatment is performed at a temperature higher than or equal to 300° C. and lower than or equal to 600° C. after nitrogen is added. Consequently, the oxide semiconductor in the high-concentration regions 928 has a wurtzite crystal structure.

Further, depending on the nitrogen concentration, the low-concentration regions 929 also have a wurtzite crystal structure due to the heat treatment. Since the oxide semiconductor in the high-concentration regions 928 has a wurtzite crystal structure, the conductivity of the high-concentration regions 928 can be further increased and the resistance between the source electrode 924 and the drain electrode 925 can be decreased. Note that in order to effectively decrease the resistance between the source electrode 924 and the drain electrode 925 by forming an oxide semiconductor having a wurtzite crystal structure, in the case of using nitrogen as the dopant, the concentration of nitrogen atoms in the high-concentration regions 928 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 923 may include an oxide including CAAC. In the case where the oxide semiconductor layer 923 includes an oxide including CAAC, the conductivity of the oxide semiconductor layer 923 can be increased as compared to the case of an amorphous semiconductor; thus, the resistance between the source electrode 924 and the drain electrode 925 can be decreased.

By decreasing the resistance between the source electrode 924 and the drain electrode 925, high on-state current and high-speed operation can be ensured even when the transistor 921 is miniaturized. With the miniaturization of the transistor 921, the area occupied by a memory cell including the transistor can be reduced and the storage capacity per unit area of a cell array can be increased.

Figure 10D:
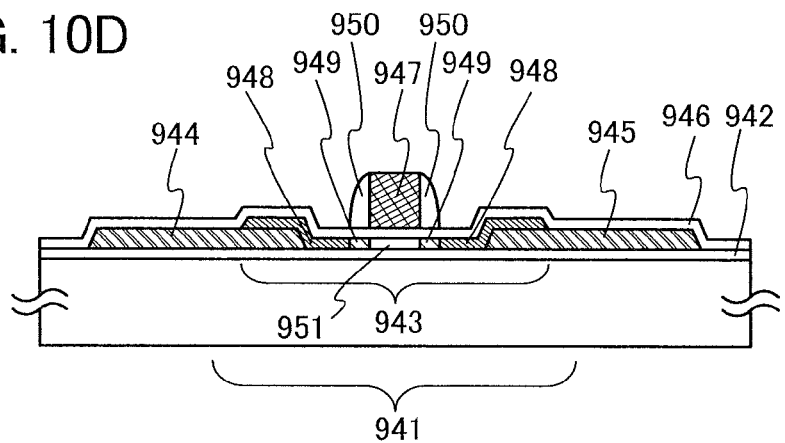

A transistor 941 illustrated in FIG. 10D includes a source electrode 944 and a drain electrode 945 formed over an insulating film 942; an oxide semiconductor layer 943 which is formed over the source electrode 944 and the drain electrode 945 and functions as an active layer; a gate insulating film 946 over the oxide semiconductor layer 943, and the source electrode 944 and the drain electrode 945; and a gate electrode 947 which is provided over the gate insulating film 946 so as to overlap with the oxide semiconductor layer 943. In addition, the transistor 941 includes a sidewall insulator 950 which is formed of an insulating film and is provided on a side surface of the gate electrode 947.

The transistor 941 illustrated in FIG. 10D is of a top-gate type where the gate electrode 947 is formed over the oxide semiconductor layer 943, and is also of a bottom-contact type where the source electrode 944 and the drain electrode 945 are formed below the oxide semiconductor layer 943. In the transistor 941, the source electrode 944 and the drain electrode 945 do not overlap with the gate electrode 947 as in the transistor 901. Therefore, the parasitic capacitance generated between the gate electrode 947 and each of the source electrode 944 and the drain electrode 945 can be small, so that the transistor 941 can operate at high speed.

The oxide semiconductor layer 943 includes a pair of high-concentration regions 948 and a pair of low-concentration regions 949 which are obtained by addition of dopant imparting n-type conductivity to the oxide semiconductor layer 943 after formation of the gate electrode 947. Further, the oxide semiconductor layer 943 includes a channel formation region 951 which overlaps with the gate electrode 947 with the gate insulating film 946 interposed therebetween. In the oxide semiconductor layer 943, the channel formation region 951 is provided between the pair of low-concentration regions 949 which are provided between the pair of high-concentration regions 948. The pair of low-concentration regions 949 is provided in a region which is in the oxide semiconductor layer 943 and overlaps with the sidewall insulator 950 with the gate insulating film 946 interposed therebetween.

Like the above-described high-concentration regions 908 included in the transistor 901, the high-concentration regions 948 and the low-concentration regions 949 can be formed by an ion implantation method. The kind of dopant in the case of the high-concentration regions 908 can be referred to for the kind of dopant for forming the high-concentration regions 948.

For example, in the case where nitrogen is used as the dopant, the concentration of nitrogen atoms in the high-concentration regions 948 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 949 is preferably higher than or equal to $5 \times 10^{18}/cm^3$ and lower than $5 \times 10^{19}/cm^3$.

The high-concentration regions 948 to which the dopant imparting n-type conductivity is added have higher conductivity than the other regions in the oxide semiconductor layer 943. Therefore, by providing the high-concentration regions 948 in the oxide semiconductor layer 943, the resistance between the source electrode 944 and the drain electrode 945 can be decreased. The low-concentration regions 949 are provided between the channel formation region 951 and the high-concentration regions 948, whereby a negative shift of the threshold voltage due to a short-channel effect can be reduced.

In the case where an In—Ga—Zn-based oxide semiconductor is used for the oxide semiconductor layer 943, heat treatment is performed at a temperature higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. Since the oxide semiconductor in the high-concentration regions 948 has a wurtzite crystal structure, the conductivity of the high-concentration regions 948 can be further increased and the resistance between the source electrode 944 and the drain electrode 945 can be decreased. Note that in order to effectively decrease the resistance between the source electrode 944 and the drain electrode 945 by forming an oxide semiconductor having a wurtzite crystal structure, in the case of using nitrogen as the dopant, the concentration of nitrogen atoms in the high-concentration regions 948 is preferably higher than or equal to $1 \times 10^{20}/cm'$ and lower than or equal to 7 atoms %. However, there is also a case where an oxide semiconductor having a wurtzite crystal structure can be obtained even when the concentration of nitrogen atoms is lower than the above range.

The oxide semiconductor layer 943 may include an oxide including CAAC. In the case where the oxide semiconductor layer 943 includes an oxide including CAAC, the conductivity of the oxide semiconductor layer 943 can be increased as compared to the case of an amorphous semiconductor; thus, the resistance between the source electrode 944 and the drain electrode 945 can be decreased.

By decreasing the resistance between the source electrode 944 and the drain electrode 945, high on-state current and high-speed operation can be ensured even when the transistor 941 is miniaturized. With the miniaturization of the transistor 941, the area occupied by the storage element including the transistor can be reduced and the storage capacity per unit area can be increased.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, pp. 504-507, 2010).

However, in the above manufacturing method, after a gate insulating film is formed, the gate insulating film needs to be partially removed so that a portion which is to be the source region and the drain region is exposed. Therefore, at the time of removing the gate insulating film, the oxide semiconductor layer which is below the gate insulating film is partially over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs remarkably in the case where a dry etching method with which the selectivity of a gate insulating film to an oxide semiconductor layer is not sufficiently obtained is employed.

For example, the overetching does not become a problem as long as the oxide semiconductor layer has an enough thickness; however, when the channel length is 200 nm or shorter, the thickness of the oxide semiconductor layer in a region which is to be a channel formation region needs to be 20 nm or shorter, preferably 10 nm or shorter so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as in one embodiment of the present invention, addition of dopant to an oxide semiconductor layer is performed in the state where a gate insulating film is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating film is kept clean. Therefore, the characteristics and reliability of the transistor can be improved.

This embodiment can be implemented in combination with any of the above embodiments.

Embodiment 7

In this embodiment, a transistor which includes an oxide semiconductor layer and has a structure different from those in Embodiments 5 and 6 will be described. An oxide semiconductor in the oxide semiconductor layer may be formed using an oxide semiconductor containing In, Sn, and Zn (an In—Sn—Zn-based oxide semiconductor) or another oxide semiconductor described in any of the other embodiments.

Figure 31A:
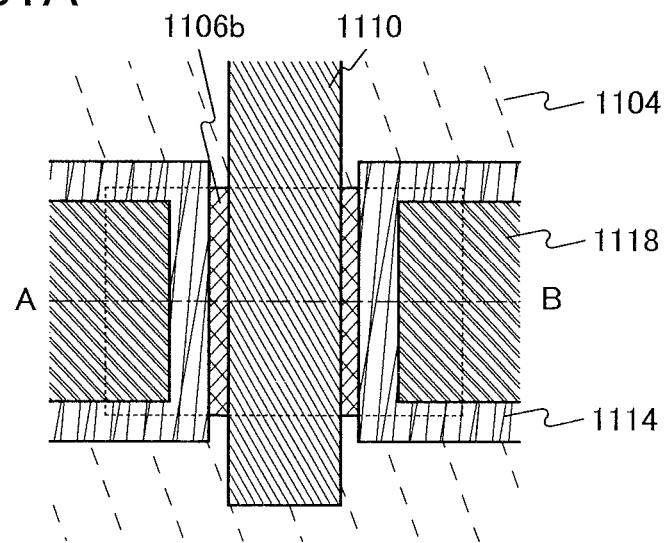
FIGS. 31A and 31B illustrate a structure of a transistor.
Figure 31B:
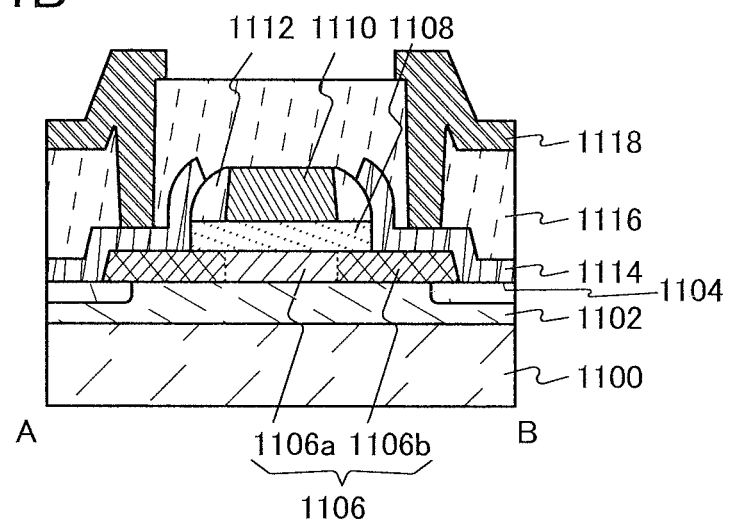

FIGS. 31A and 31B are a top view and a cross-sectional view of a coplanar transistor having a top-gate top-contact structure. FIG. 31A is the top view of the transistor. FIG. 31B illustrates a cross section A-B along dashed-dotted line A-B in FIG. 31A.

The transistor illustrated in FIG. 31B includes a substrate 1100; a base insulating film 1102 provided over the substrate 1100; a protective insulating film 1104 provided in the periphery of the base insulating film 1102; an oxide semiconductor layer 1106 that is provided over the base insulating film 1102 and the protective insulating film 1104 and includes a high-resistance region 1106*a* and low-resistance regions 1106*b*; a gate insulating film 1108 provided over the oxide semiconductor layer 1106; a gate electrode 1110 provided to overlap with the oxide semiconductor layer 1106 with the gate insulating film 1108 interposed therebetween; a sidewall insulating film 1112 provided in contact with a side surface of the gate electrode 1110; a pair of electrodes 1114 provided in contact with at least the low-resistance regions 1106*b*; an interlayer insulating film 1116 provided to cover at least the oxide semiconductor layer 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

This embodiment can be implemented in combination with any of the above embodiments.

Embodiment 8

In this embodiment, a transistor which includes an oxide semiconductor layer and has a structure different from those in Embodiments 5 to 7 will be described. Note that in this embodiment, the case where an oxide semiconductor containing In, Sn, and Zn (an In—Sn—Zn-based oxide semiconductor) is used as an oxide semiconductor in an oxide semiconductor layer is described; however, another oxide semiconductor described in any of the other embodiments may be used.

Figure 32A:
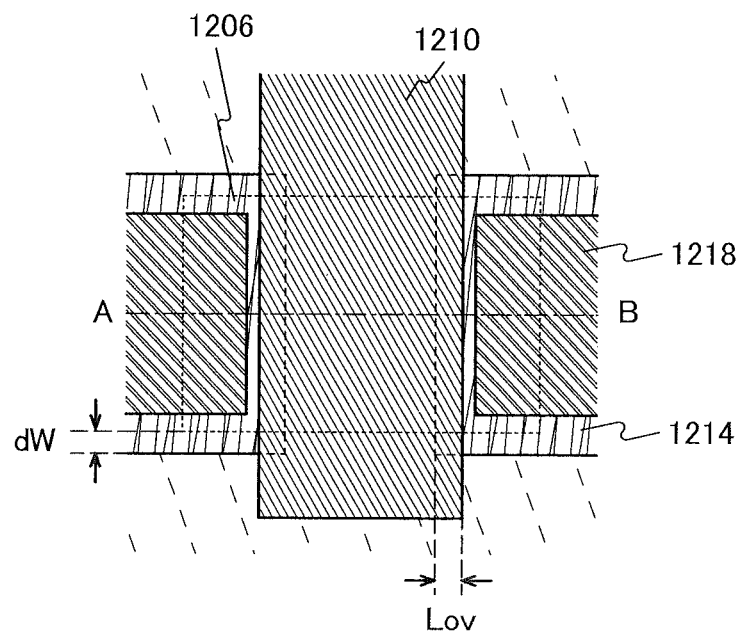
FIGS. 32A and 32B illustrate a structure of a transistor.
Figure 32B:
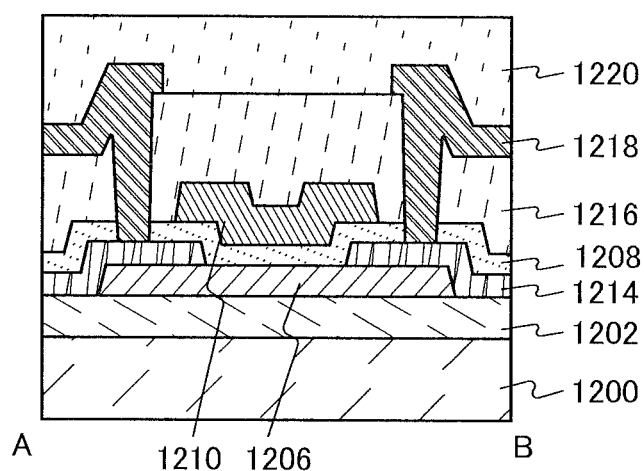

FIGS. 32A and 32B are a top view and a cross-sectional view illustrating a structure of a transistor manufactured in this embodiment. FIG. 32A is the top view of the transistor. FIG. 32B is a cross-sectional view along dashed-dotted line A-B in FIG. 32A.

The transistor illustrated in FIG. 32B includes a substrate 1200; a base insulating film 1202 provided over the substrate 1200; an oxide semiconductor layer 1206 provided over the base insulating film 1202; a pair of electrodes 1214 in contact with the oxide semiconductor layer 1206; a gate insulating film 1208 provided over the oxide semiconductor layer 1206 and the pair of electrodes 1214; a gate electrode 1210 provided to overlap with the oxide semiconductor layer 1206 with the gate insulating film 1208 interposed therebetween; an interlayer insulating film 1216 provided to cover the gate insulating film 1208 and the gate electrode 1210; wirings 1218 connected to the pair of electrodes 1214 through openings formed in the interlayer insulating film 1216; and a protective film 1220 provided to cover the interlayer insulating film 1216 and the wirings 1218.

As the substrate 1200, a glass substrate is used. As the base insulating film 1202, a silicon oxide film is used. As the oxide semiconductor layer 1206, an In—Sn—Zn-based oxide film is used. As the pair of electrodes 1214, a tungsten film is used. As the gate insulating film 1208, a silicon oxide film is used. The gate electrode 1210 has a stacked structure of a tantalum nitride film and a tungsten film. The interlayer insulating film 1216 has a stacked structure of a silicon oxynitride film and a polyimide film. The wirings 1218 have a stacked structure in which a titanium film, an aluminum film, and a titanium film are formed in this order. As the protective film 1220, a polyimide film is used.

Note that in the transistor having the structure illustrated in FIG. 32A, the width of a portion where the gate electrode 1210 overlaps with one of the pair of electrodes 1214 is referred to as Lov. Similarly, the width of a portion of the pair of electrodes 1214, which does not overlap with the oxide semiconductor layer 1206, is referred to as dW.

This embodiment can be implemented in combination with any of the above embodiments.

Embodiment 9

In this embodiment, one embodiment of a structure of a storage device will be described.

Figure 11:
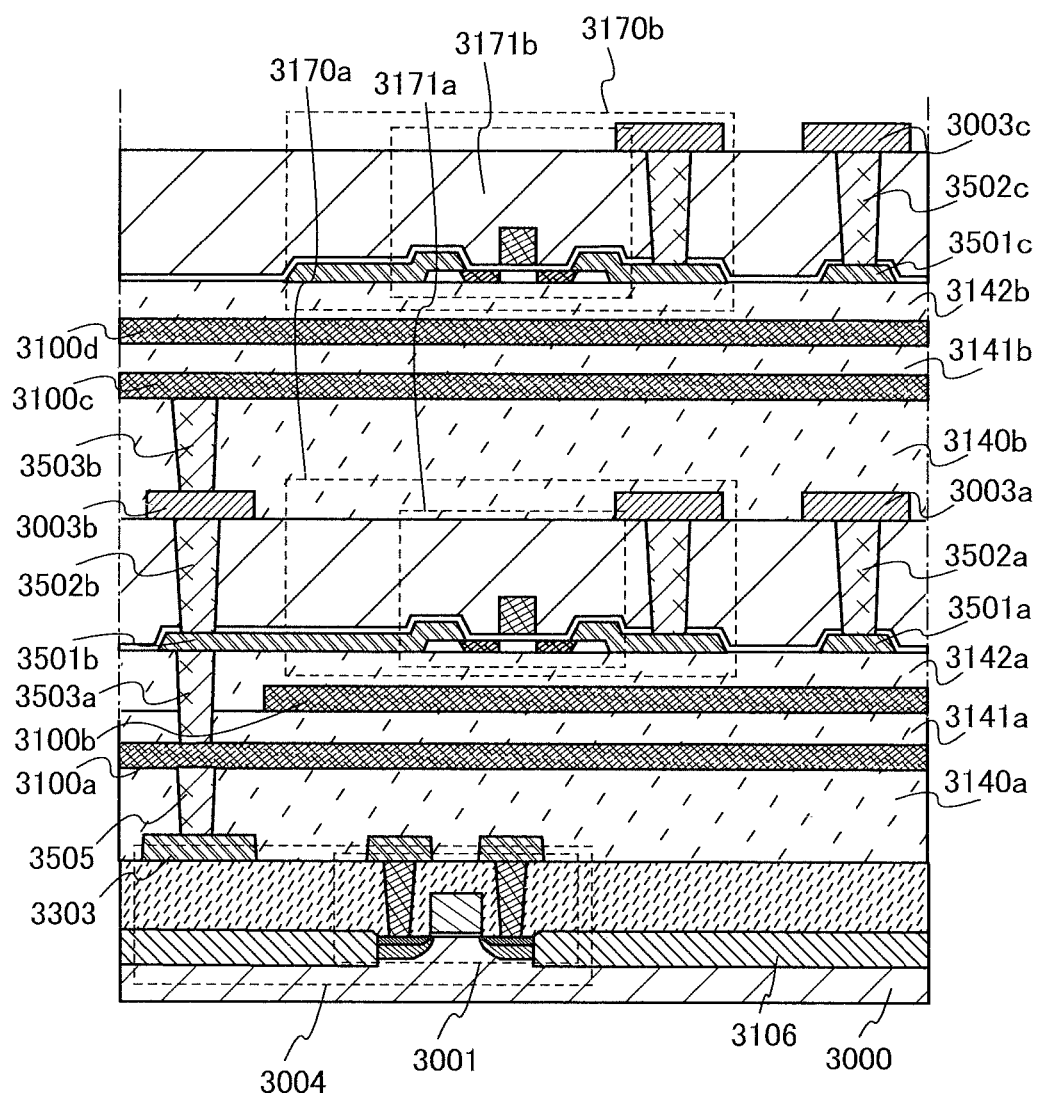
FIG. 11 is a cross-sectional view illustrating a structure of a storage device.
Figure 12:
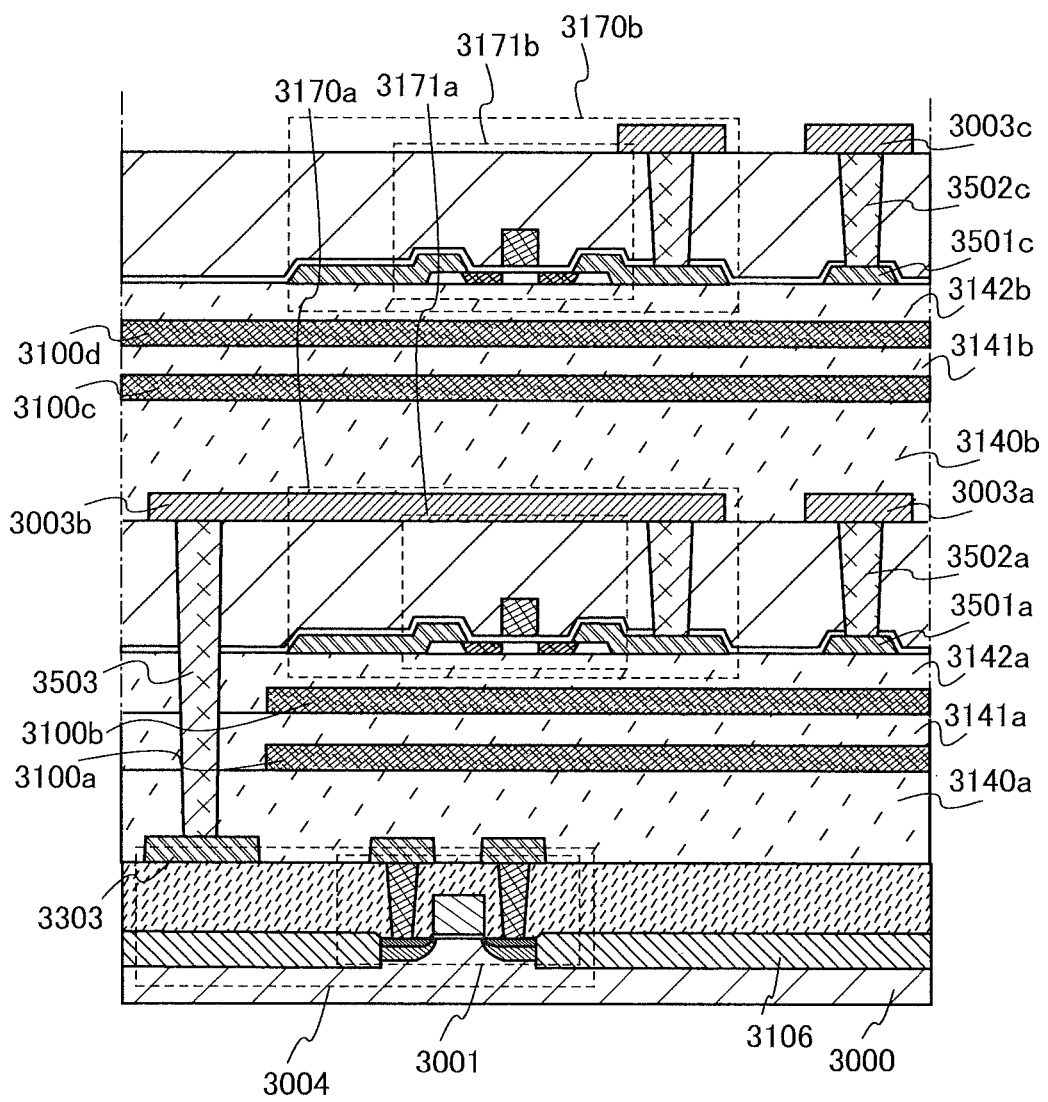
FIG. 12 is a cross-sectional view illustrating a structure of a storage device.

FIG. 11 and FIG. 12 are each a cross-sectional view of a storage device. In each of the storage devices illustrated in FIG. 11 and FIG. 12, a plurality of storage elements in a plurality of layers are formed in the upper portion, and a logic circuit 3004 is formed in the lower portion. As examples of the plurality of storage elements, a storage element 3170a and a storage element 3170b are illustrated. For the storage element 3170a and the storage element 3170b, a configuration similar to that of the storage circuit 102 described in the above embodiment can be employed, for example.

Note that a transistor 3171a in the storage element 3170a is illustrated as a representative. A transistor 3171b in the storage element 3170b is illustrated as a representative. In the transistor 3171a and the transistor 3171b, a channel formation region is formed in an oxide semiconductor layer. The structure of a transistor in which a channel formation region is formed in an oxide semiconductor layer is similar to that described in the above embodiment; thus, the description thereof is omitted here.

An electrode 3501a which is formed in the same layer as a source electrode and a drain electrode of the transistor 3171a is electrically connected to an electrode 3003a through an electrode 3502a. An electrode 3501c which is formed in the same layer as a source electrode and a drain electrode of the transistor 3171b is electrically connected to an electrode 3003c through an electrode 3502c.

The logic circuit 3004 includes a transistor 3001 in which a semiconductor material other than an oxide semiconductor is used as a channel formation region. The transistor 3001 can be obtained in such a manner that an element isolation insulating film 3106 is provided over a substrate 3000 including a semiconductor material (e.g., silicon) and a region which is to be a channel formation region is formed in a region surrounded by the element isolation insulating film 3106. Note that the transistor 3001 may be a transistor in which a channel formation region is formed in a semiconductor film such as a silicon film formed on an insulating surface or a silicon film in an SOI substrate. A known structure can be employed for the structure of the transistor 3001; thus, the description thereof is omitted here.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed, an insulating film 3141a is provided between the wiring 3100a and the wiring 3100b, and an insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed, an insulating film 3141b is provided between the wiring 3100c and the wiring 3100d, and an insulating film 3142b is provided between the wiring 3100d and the layers in which the transistor 3171b is formed.

The insulating film 3140a, the insulating film 3141a, the insulating film 3142a, the insulating film 3140b, the insulating film 3141b, and the insulating film 3142b function as interlayer insulating films, and their surfaces are planarized.

Through the wiring 3100a, the wiring 3100b, the wiring 3100c, and the wiring 3100d, electrical connection between the storage elements, electrical connection between the logic circuit 3004 and the storage element, and the like can be established.

An electrode 3303 included in the logic circuit 3004 can be electrically connected to a circuit provided in the upper portion.

For example, as illustrated in FIG. 11, the electrode 3303 can be electrically connected to the wiring 3100a through an electrode 3505. The wiring 3100a can be electrically connected to an electrode 3501b through an electrode 3503a. In this manner, the wiring 3100a and the electrode 3303 can be electrically connected to the source or the drain of the transistor 3171a. The electrode 3501b can be electrically connected to an electrode 3003b through an electrode 3502b. The electrode 3003b can be electrically connected to the wiring 3100c through an electrode 3503b.

FIG. 11 illustrates an example in which the electrode 3303 and the transistor 3171a are electrically connected to each other through the wiring 3100a; however, one embodiment of the present invention is not limited to this. The electrode 3303 and the transistor 3171a may be electrically connected to each other through the wiring 3100b, or may be electrically connected to each other through both the wiring 3100a and the wiring 3100b. Further, as illustrated in FIG. 12, the electrode 3303 and the transistor 3171a may be electrically connected to each other through neither the wiring 3100a nor the wiring 3100b. In FIG. 12, the electrode 3303 is electrically connected to the electrode 3003b through an electrode 3503. The electrode 3003b is electrically connected to the source or the drain of the transistor 3171a. In this manner, electrical connection between the electrode 3303 and the transistor 3171a can be established.

Note that FIG. 11 and FIG. 12 illustrate an example in which the two storage elements (the storage element 3170a and the storage element 3170b) are stacked; however, the number of stacked storage elements is not limited to two.

FIG. 11 and FIG. 12 illustrate an example where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer may be provided or three or more wiring layers may be provided between the layers in which the transistor 3171a is formed and the layers in which the transistor 3001 is formed.

FIG. 11 and FIG. 12 illustrate an example where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer may be provided or three or more wiring layers may be provided between the layers in which the transistor 3171*b* is formed and the layers in which the transistor 3171*a* is formed.

This embodiment can be implemented in combination with any of the above embodiments.

Embodiment 10

In this embodiment, the field-effect mobility of the transistor described in the above embodiment will be described.

The actually measured field-effect mobility of an insulated gate transistor can be lower than its original mobility because of a variety of reasons; this phenomenon occurs not only in the case of using a transistor whose channel is formed in an oxide semiconductor layer. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically. In this embodiment, the field-effect mobility of an ideal oxide semiconductor without a defect inside the semiconductor is calculated theoretically, and calculation results of characteristics of minute transistors manufactured using such an oxide semiconductor are shown.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\epsilon n} = \frac{e^3 N^2 t}{8\epsilon C_{ox} V_g} \quad \text{[Formula 3]}$$

Here, e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 μm. Further, $V_d$ represents the drain voltage (voltage between a source and a drain). When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8kT \epsilon C_{ox} V_g} \quad \text{[Formula 5]}$$

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d-V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, to can be calculated to be 120 cm²/Vs from Formula 2 and Formula 3. The measured mobility of an In—Sn—Zn-based oxide including a defect is approximately 40 cm²/Vs. However, assuming that no defect exists inside the semiconductor and at the interface between the semiconductor and an insulating layer, the mobility $\mu_0$ of the oxide semiconductor is expected to be 120 cm²/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B} \exp\left(-\frac{x}{G}\right) \quad \text{[Formula 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 19:
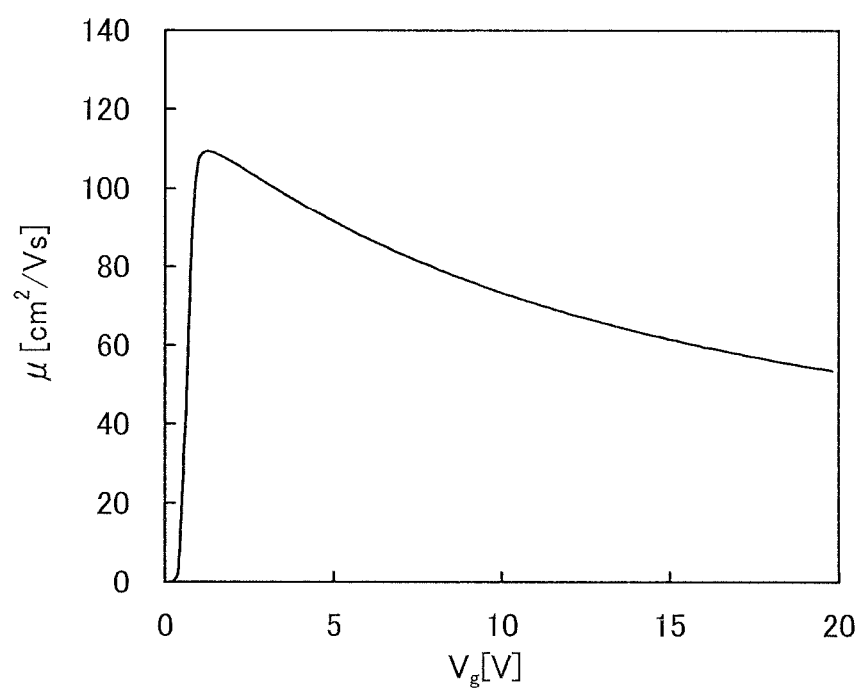
FIG. 19 shows gate voltage dependence of mobility obtained by calculation.

FIG. 19 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 19, the mobility has a peak of 100 cm²/Vs or more at a gate voltage $V_g$ that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 20A to 20C, FIGS. 21A to 21C, and FIGS. 22A to 22C. FIGS. 23A and 23B illustrate cross-sectional structures of the transistors used for the calculation. The transistors illustrated in FIGS. 23A and 23B each include a semiconductor region 1303$a$ and a semiconductor region 1303$c$ that have n$^+$-type conductivity in an oxide semiconductor layer. The resistivity of the semiconductor regions 1303$a$ and 1303$c$ is 2×10$^{-3}$ Ωcm.

The transistor in FIG. 23A is formed over a base insulating film 1301 and an embedded insulator 1302 that is embedded in the base insulating film 1301 and formed of aluminum oxide. The transistor includes the semiconductor region 1303$a$, the semiconductor region 1303$c$, an intrinsic semiconductor region 1303$b$ that is placed between the semiconductor regions 1303$a$ and 1303$c$ and serves as a channel formation region, and a gate electrode 1305. The width of the gate electrode 1305 is 33 nm.

A gate insulating layer 1304 is formed between the gate electrode 1305 and the semiconductor region 1303$b$. A sidewall insulator 1306$a$ and a sidewall insulator 1306$b$ are formed on both side surfaces of the gate electrode 1305, and an insulator 1307 is formed over the gate electrode 1305 so as to prevent a short circuit between the gate electrode 1305 and another wiring. The sidewall insulator has a width of 5 nm. A source 1308$a$ and a drain 1308$b$ are provided in contact with the semiconductor region 1303$a$ and the semiconductor region 1303$c$, respectively. Note that the channel width of this transistor is 40 nm.

The transistor in FIG. 23B is the same as the transistor in FIG. 23A in that it is formed over the base insulating film 1301 and the embedded insulator 1302 formed of aluminum oxide and that it includes the semiconductor region 1303$a$, the semiconductor region 1303$c$, the intrinsic semiconductor region 1303$b$ provided therebetween, the gate electrode 1305 having a width of 33 nm, the gate insulating layer 1304, the sidewall insulator 1306$a$, the sidewall insulator 1306$b$, the insulator 1307, the source 1308$a$, and the drain 1308$b$.

The difference between the transistor in FIG. 23A and the transistor in FIG. 23B is the conductivity type of semiconductor regions under the sidewall insulators 1306$a$ and 1306$b$. In the transistor in FIG. 23A, the semiconductor regions under the sidewall insulator 1306$a$ and the sidewall insulator 1306$b$ are part of the semiconductor region 1303$a$ having n$^+$-type conductivity and part of the semiconductor region 1303$c$ having n$^+$-type conductivity, whereas in the transistor in FIG. 23B, the semiconductor regions under the sidewall insulator 1306$a$ and the sidewall insulator 1306$b$ are part of the intrinsic semiconductor region 1303$b$. In other words, in the semiconductor layer of FIG. 23B, a region having a width of L$_{off}$ which overlaps with neither the semiconductor region 1303$a$ (the semiconductor region 1303$c$) nor the gate electrode 1305 is provided. This region is called an offset region, and the width L$_{off}$ is called an offset length. As is seen from the drawing, the offset length is equal to the width of the sidewall insulator 1306$a$ (the sidewall insulator 1306$b$).

Figure 20A:
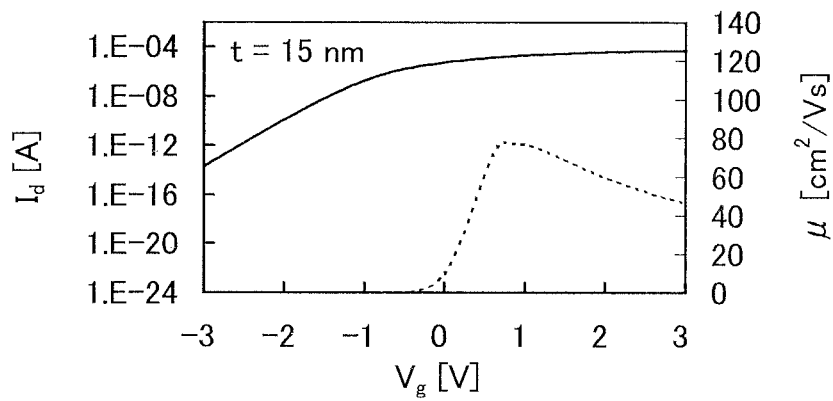
FIGS. 20A to 20C each show gate voltage dependence of drain current and mobility obtained by calculation.
Figure 20B:
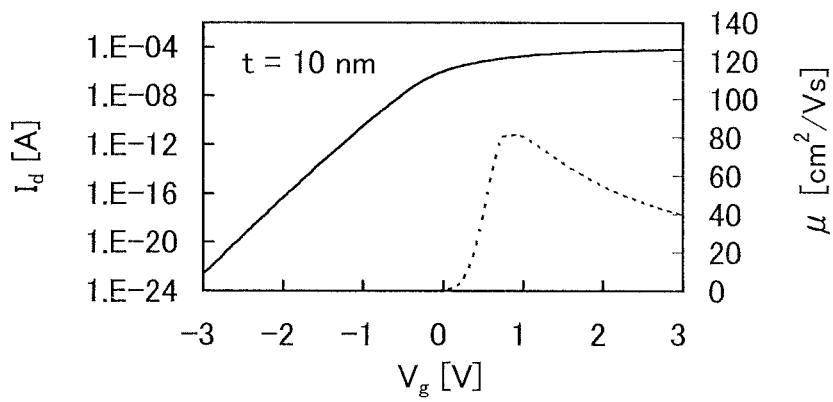
Figure 20C:
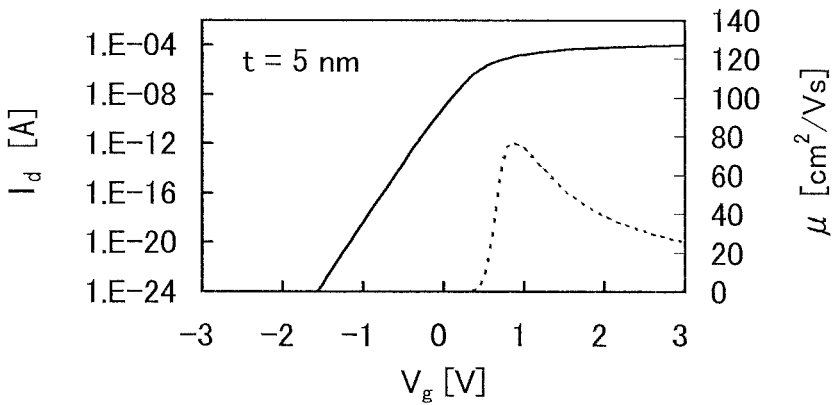

The other parameters used in calculation are as described above. For the calculation, device simulation software Sentaurus Device manufactured by Synopsys, Inc. was used. FIGS. 20A to 20C show the gate voltage (V$_g$: a potential difference between the gate and the source) dependence of the drain current (I$_d$, a solid line) and the mobility ($\mu$, a dotted line) of the transistor having the structure illustrated in FIG. 23A. The drain current I$_d$ is obtained by calculation under the assumption that the drain voltage V$_d$ (a potential difference between the drain and the source) is +1 V, and the mobility $\mu$ is obtained by calculation under the assumption that the drain voltage V$_d$ is +0.1 V.

FIG. 20A shows the gate voltage dependence of the transistor in the case where the thickness of the gate insulating film is 15 nm, FIG. 20B shows that of the transistor in the case where the thickness of the gate insulating film is 10 nm, and FIG. 20C shows that of the transistor in the case where the thickness of the gate insulating film is 5 nm. As the gate insulating film is thinner, the drain current I$_d$ in an off state (the off-state current) in particular is significantly decreased. In contrast, there is no noticeable change in peak value of the mobility $\mu$ and the drain current I$_d$ in an on state (the on-state current).

Figure 21A:
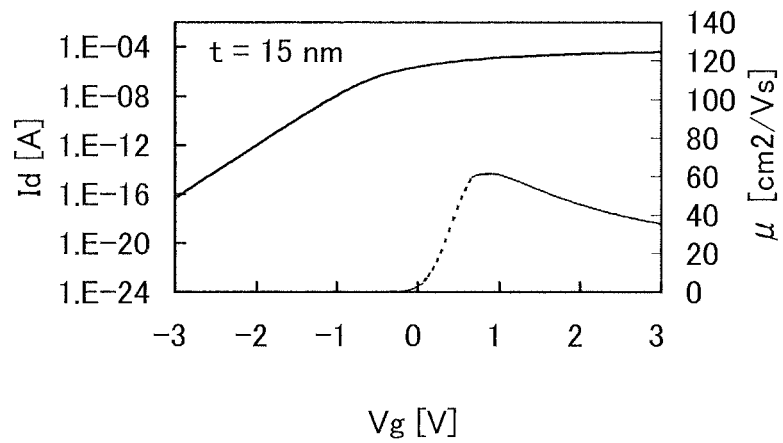
FIGS. 21A to 21C each show gate voltage dependence of drain current and mobility obtained by calculation.
Figure 21B:
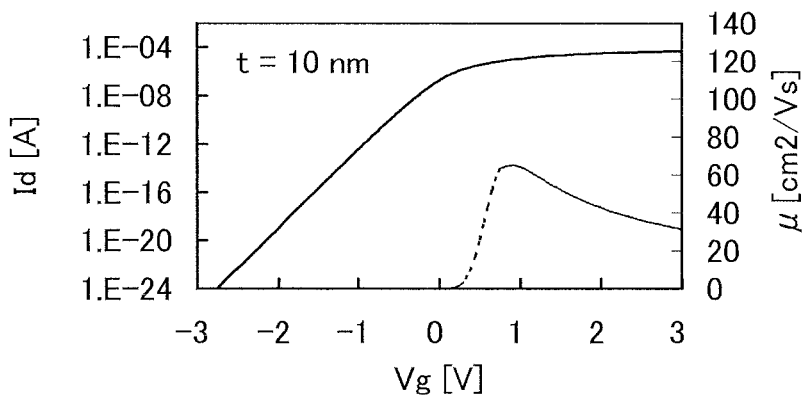
Figure 21C:
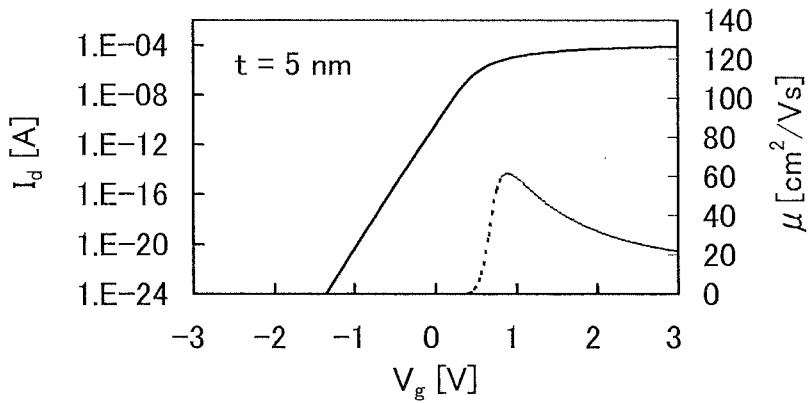

FIGS. 21A to 21C show the gate voltage V$_g$ dependence of the drain current I$_d$ (a solid line) and the mobility $\mu$ (a dotted line) of the transistor having the structure in FIG. 23B and an offset length L$_{off}$ of 5 nm. The drain current I$_d$ is obtained by calculation under the assumption that the drain voltage V$_d$ is +1 V and the mobility $\mu$ is obtained by calculation under the assumption that the drain voltage V$_d$ is +0.1 V. FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm.

Figure 22A:
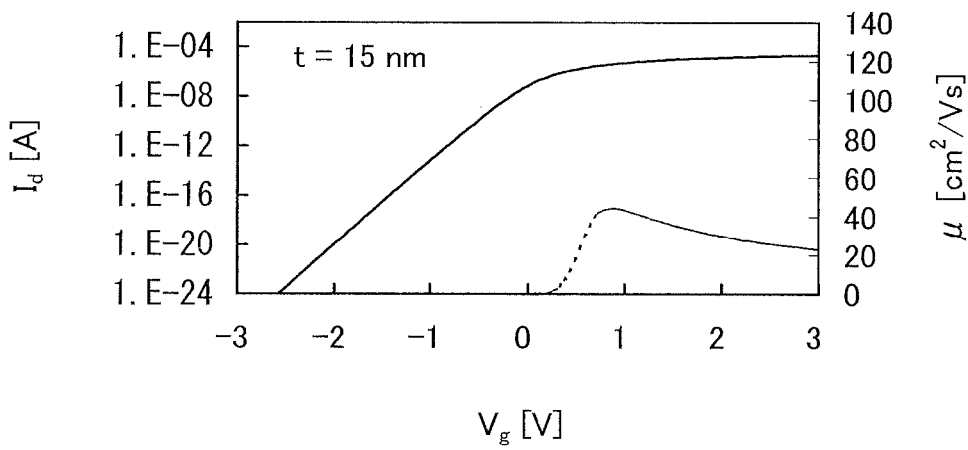
FIGS. 22A to 22C each show gate voltage dependence of drain current and mobility obtained by calculation.
Figure 22B:
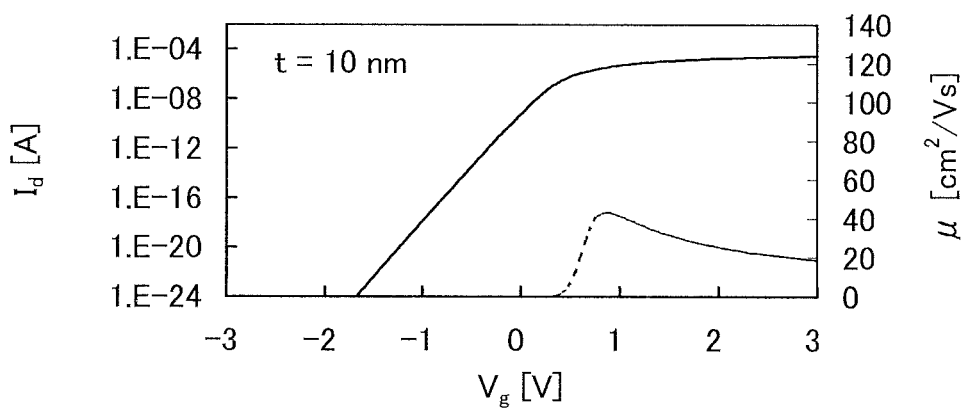
Figure 22C:
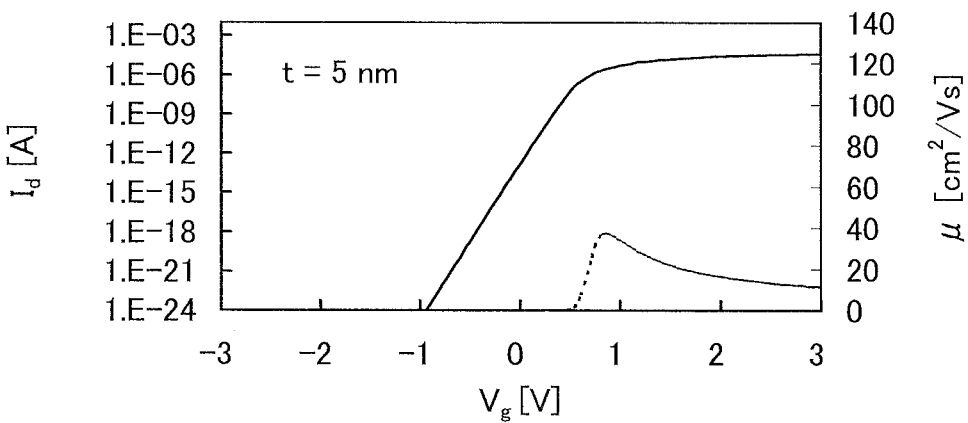
Figure 23A:
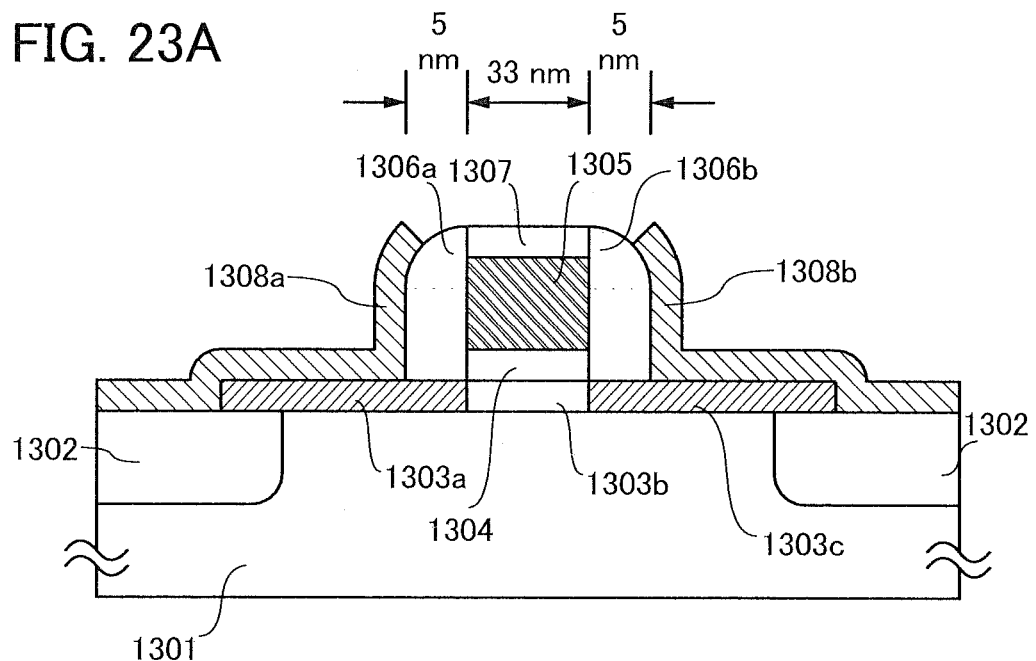
FIGS. 23A and 23B illustrate cross-sectional structures of transistors used for calculation.
Figure 23B:
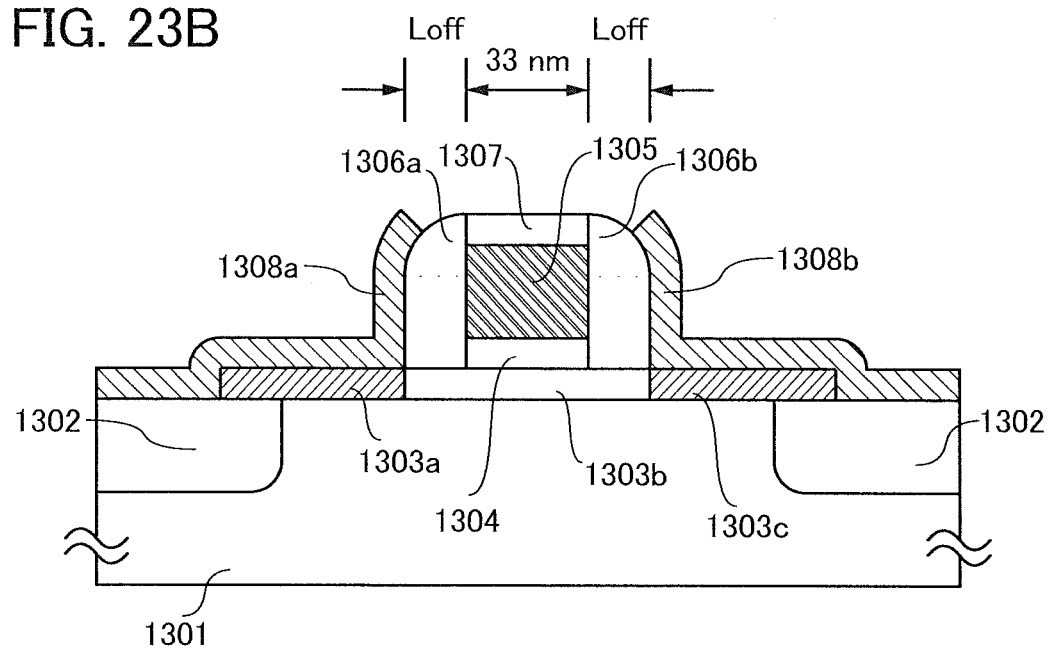

FIGS. 22A to 22C show the gate voltage V$_g$ dependence of the drain current I$_d$ (a solid line) and the mobility $\mu$ (a dotted line) of the transistor having the structure in FIG. 23B and an offset length L$_{off}$ of 15 nm. The drain current I$_d$ is obtained by calculation under the assumption that the drain voltage V$_d$ is +1 V and the mobility $\mu$ is obtained by calculation under the assumption that the drain voltage V$_d$ is +0.1 V. FIG. 22A shows the gate voltage dependence of the transistor in the case where the thickness of the gate insulating film is 15 nm, FIG. 22B shows that of the transistor in the case where the thickness of the gate insulating film is 10 nm, and FIG. 22C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 20A to 20C, approximately 60 cm$^2$/Vs in FIGS. 21A to 21C, and approximately 40 cm$^2$/Vs in FIGS. 22A to 22C; thus, the peak of the mobility $\mu$ is decreased as the offset length L$_{off}$ is increased. Further, the same applies to the off-state current. The on-state current is also decreased as the offset length L$_{off}$ is increased; however, the decrease in the on-state current is much more gradual than the decrease in the off-state current.

Embodiment 11

In this embodiment, a transistor in which an oxide semiconductor film containing In, Sn, and Zn as main components (an example of an In—Sn—Zn-based oxide semiconductor film) is used for a channel formation region will be described.

A transistor in which an oxide semiconductor film containing In, Sn, and Zn as main components is used for a channel formation region can have favorable characteristics by depositing the oxide semiconductor film while heating a substrate or by performing heat treatment after the oxide semiconductor film is formed. Note that a main component refers to an element included in a composition at 5 atomic % or more.

When the oxide semiconductor film containing In, Sn, and Zn as main components is formed while the substrate is intentionally heated, the field-effect mobility of the transistor can be improved. Further, the threshold voltage of the transistor can be positively shifted to make the transistor normally off.

Figure 24A:
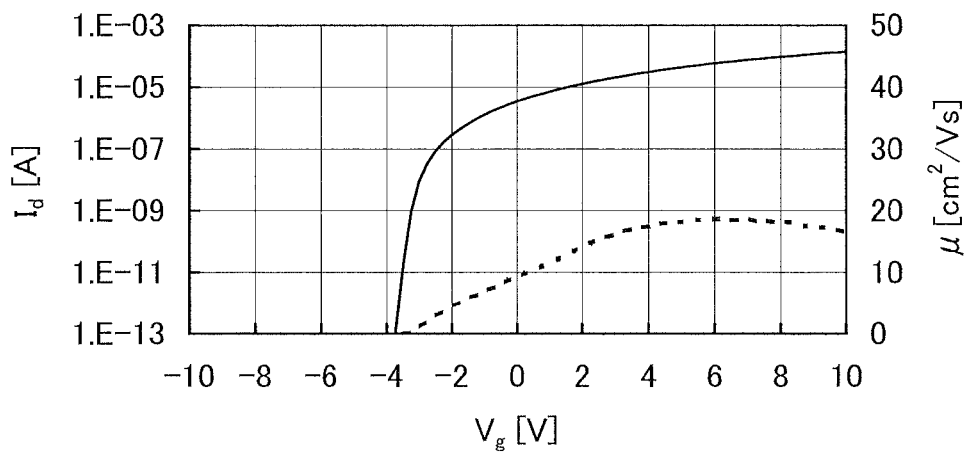
FIGS. 24A to 24C are graphs showing characteristics of transistors each including an oxide semiconductor film.
Figure 24B:
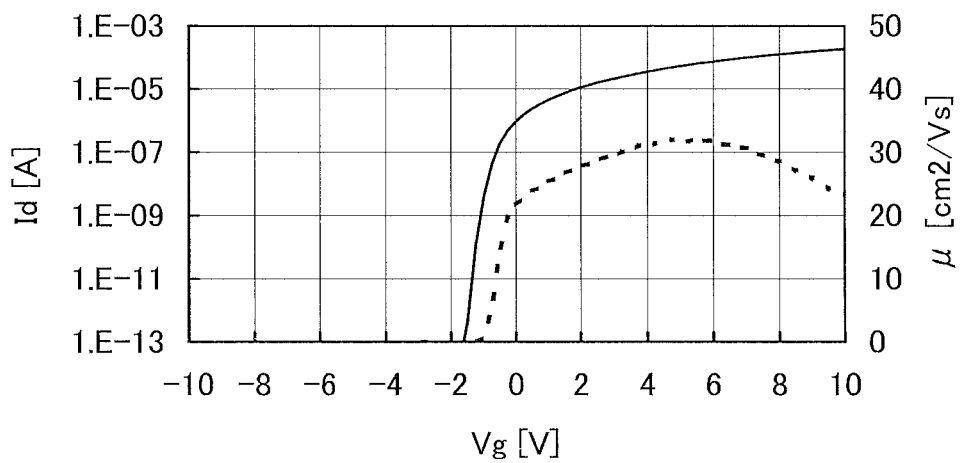
Figure 24C:
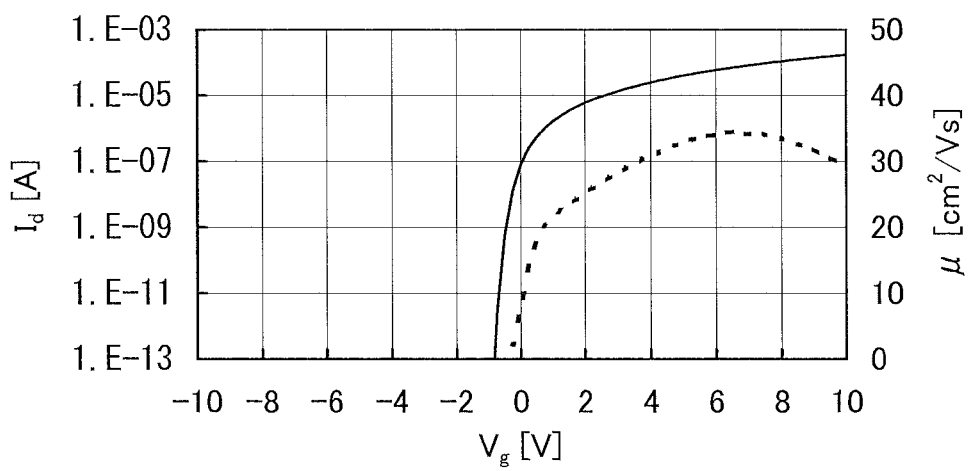

As an example, FIGS. 24A to 24C are graphs each showing electrical characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 24A is a graph showing characteristics of a transistor whose oxide semiconductor film containing In, Sn, and Zn as main components was formed by a sputtering method without heating a substrate intentionally. The field-effect mobility μ of the transistor was 18.8 $cm^2$/Vsec. On the other hand, when the oxide semiconductor film containing In, Sn, and Zn as main components is formed while heating the substrate intentionally, the field-effect mobility can be improved. FIG. 24B shows characteristics of a transistor whose oxide semiconductor film containing In, Sn, and Zn as main components was formed while heating a substrate at 200° C. The field-effect mobility μ of the transistor was 32.2 $cm^2$/Vsec.

The field-effect mobility can be further improved by performing heat treatment after formation of the oxide semiconductor film containing In, Sn, and Zn as main components. FIG. 24C shows characteristics of a transistor whose oxide semiconductor film containing In, Sn, and Zn as main components was formed by sputtering at 200° C. and then subjected to heat treatment at 650° C. The field-effect mobility of the transistor was 34.5 $cm^2$/Vsec.

The intentional heating of the substrate can realize an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 $cm^2$/Vsec is expected to be realized.

The oxide semiconductor film containing In, Sn, and Zn as main components may be crystallized in the following manner: oxygen ions are implanted into the oxide semiconductor film, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film containing In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 24A and 24B.

Note that the threshold voltage can also be controlled by changing the ratio of In, Sn, and Zn; when the composition ratio of In, Sn, and Zn is 2:1:3, a normally-off transistor can be achieved. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of 20 V was applied so that the intensity of an electric field applied to the gate insulating film was 2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a positive BT test.

In a similar manner, first, $V_g$–$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating film was −2 MV/cm, and the condition was kept for one hour. Next, $V_g$ was set to 0 V. Then, $V_g$–$I_d$ characteristics of the transistors were measured at a substrate temperature of 25° C. and $V_d$ of 10 V. This process is called a negative BT test.

Figure 25A:
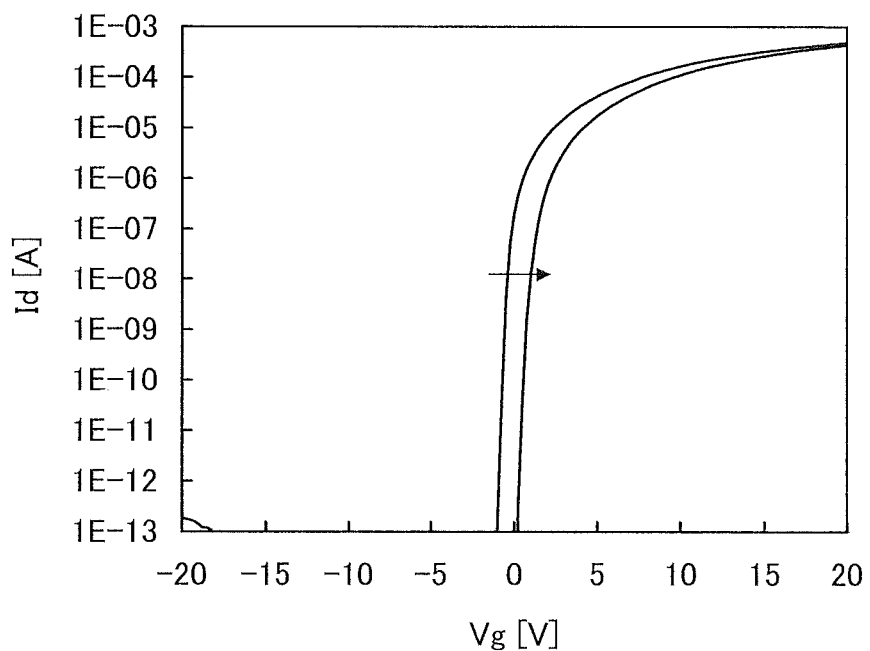
FIGS. 25A and 25B are graphs showing $V_g$–$I_d$ characteristics after a BT test of a transistor of Sample 1.
Figure 25B:
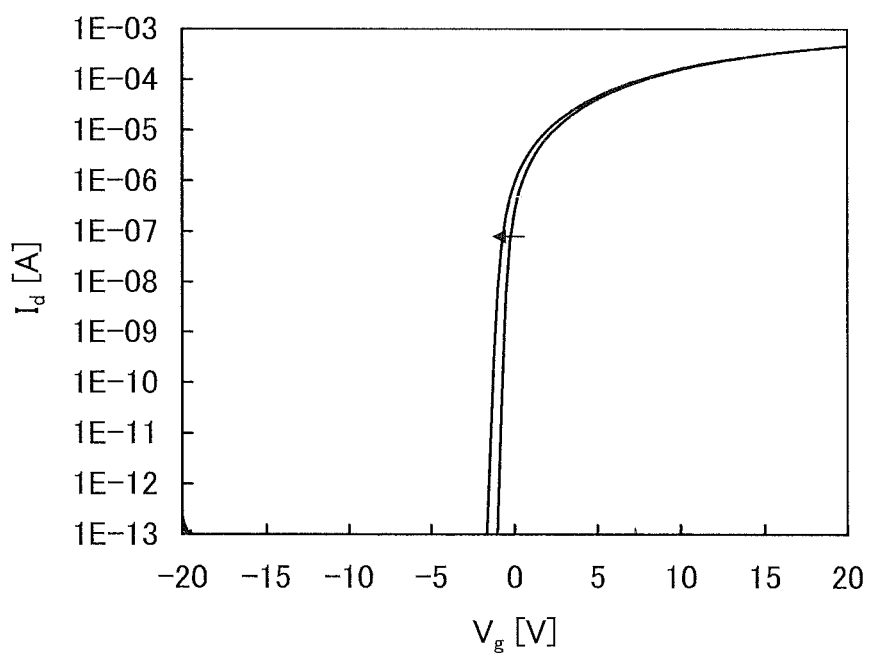
Figure 26A:
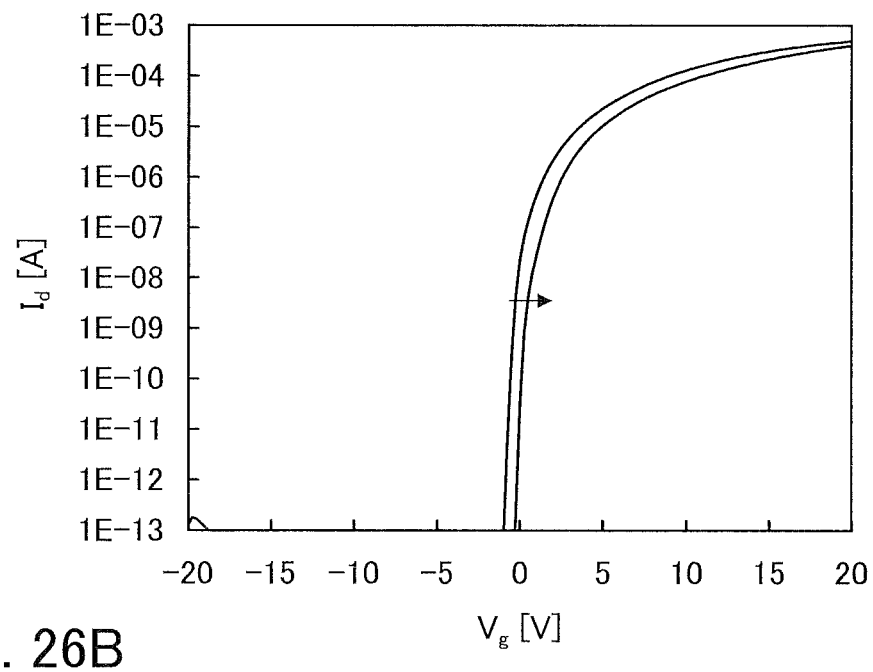
FIGS. 26A and 26B are graphs showing $V_g$–$I_d$ characteristics after a BT test of a transistor of Sample 2.
Figure 26B:
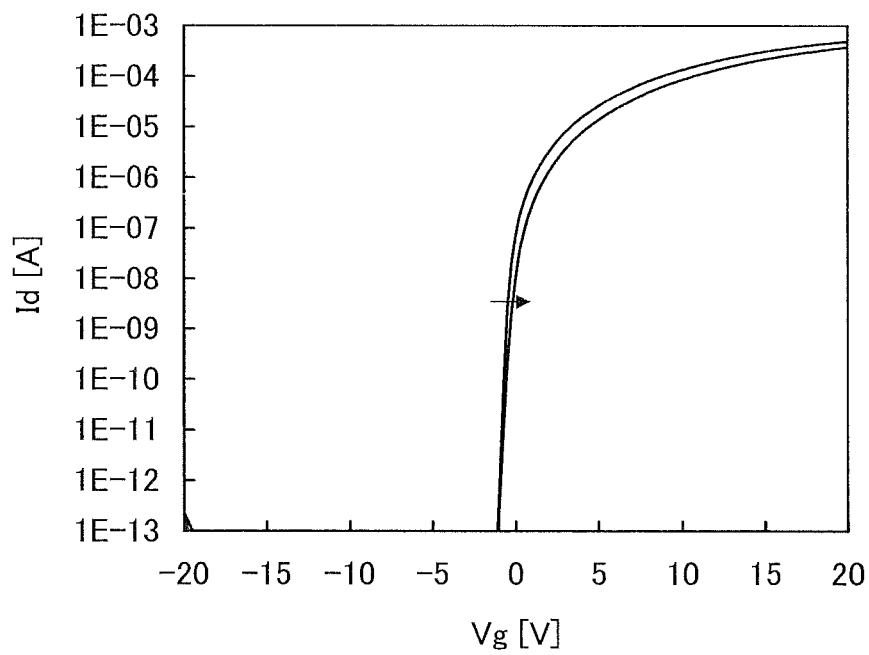

FIGS. 25A and 25B show results of the positive BT test and the negative BT test, respectively, of Sample 1. FIGS. 26A and 26B show results of the positive BT test and the negative BT test, respectively, of Sample 2.

The amount of shift in threshold voltage of Sample 1 due to the positive BT test and that due to the negative BT test were 1.80 V and 0.42 V, respectively. The amount of shift in threshold voltage of Sample 2 due to the positive BT test and that due to the negative BT test were 0.79 V and 0.76 V, respectively. It is found that, in each of Sample 1 and Sample 2, the amount of shift in threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1 \times 10^{16}/cm^3$ to $2 \times 10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

First, an In—Sn—Zn-based oxide film with a thickness of 100 nm was formed over a quartz substrate that had been subjected to dehydrogenation treatment.

The In—Sn—Zn-based oxide film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 27:
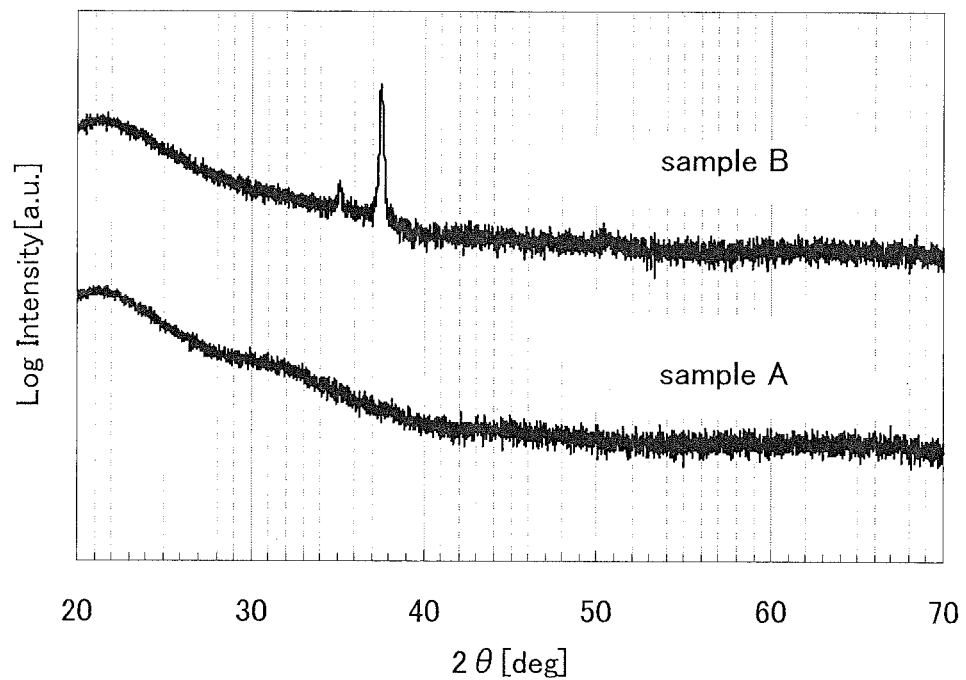
FIG. 27 shows XRD spectra of Sample A and Sample B.

FIG. 27 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 28:
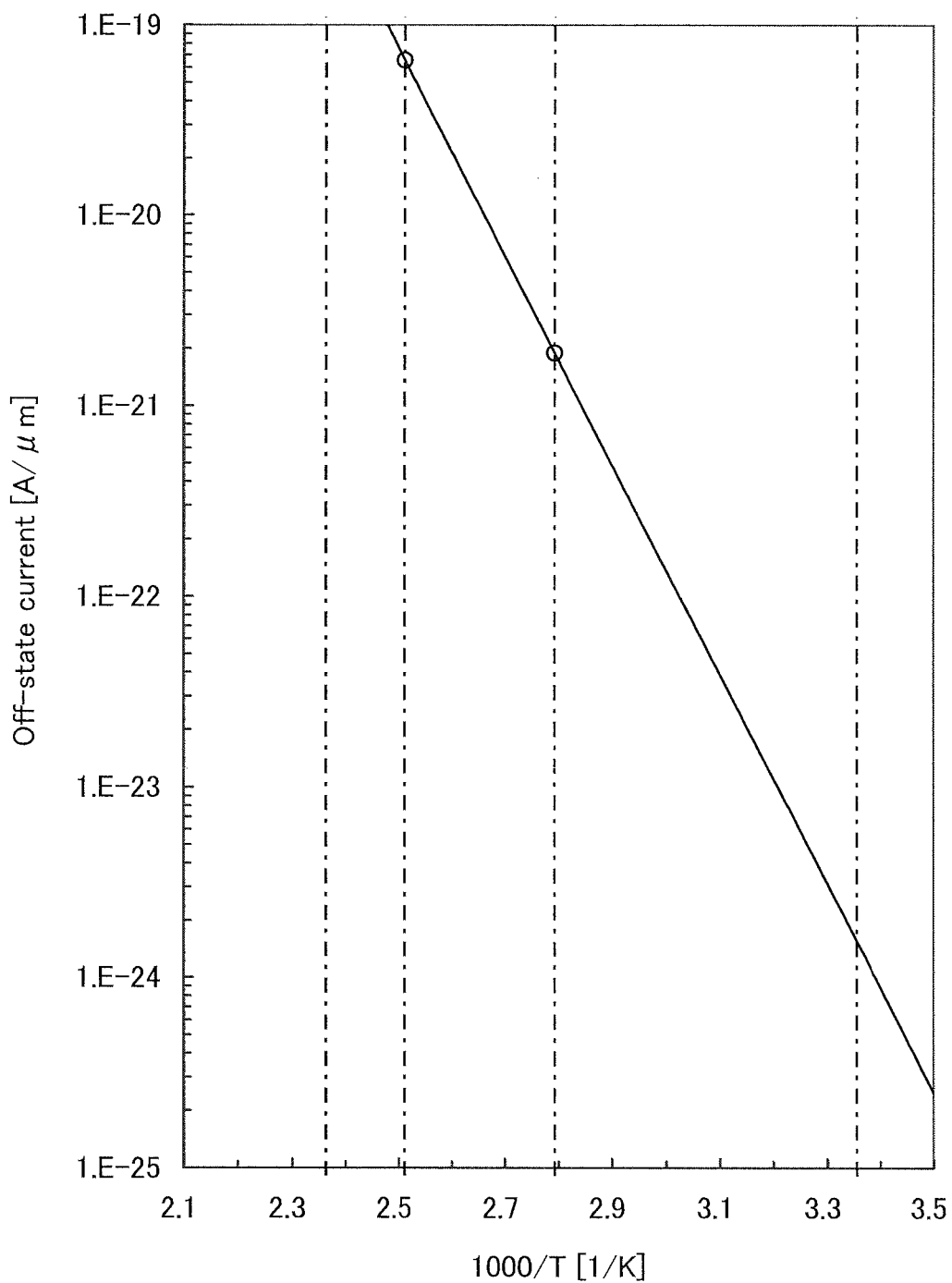
FIG. 28 is a graph showing a relation between off-state current and substrate temperature in measurement of a transistor.

FIG. 28 shows a relation between the off-state current of a transistor and the inverse of substrate temperature (absolute temperature) at measurement of the off-state current. Here, for simplicity, the horizontal axis represents a value (1000/T) obtained by multiplying an inverse of substrate temperature at measurement by 1000. As shown in FIG. 28, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation of the film, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor using Sample B, on which heat treatment at 650° C. was performed after formation of the oxide semiconductor film, was evaluated.

The transistor used for the measurement has a channel length L of 3 nm, a channel width W of 10 nm, Lov of 0 nm, and dW of 0 nm. Note that $V_d$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 29:
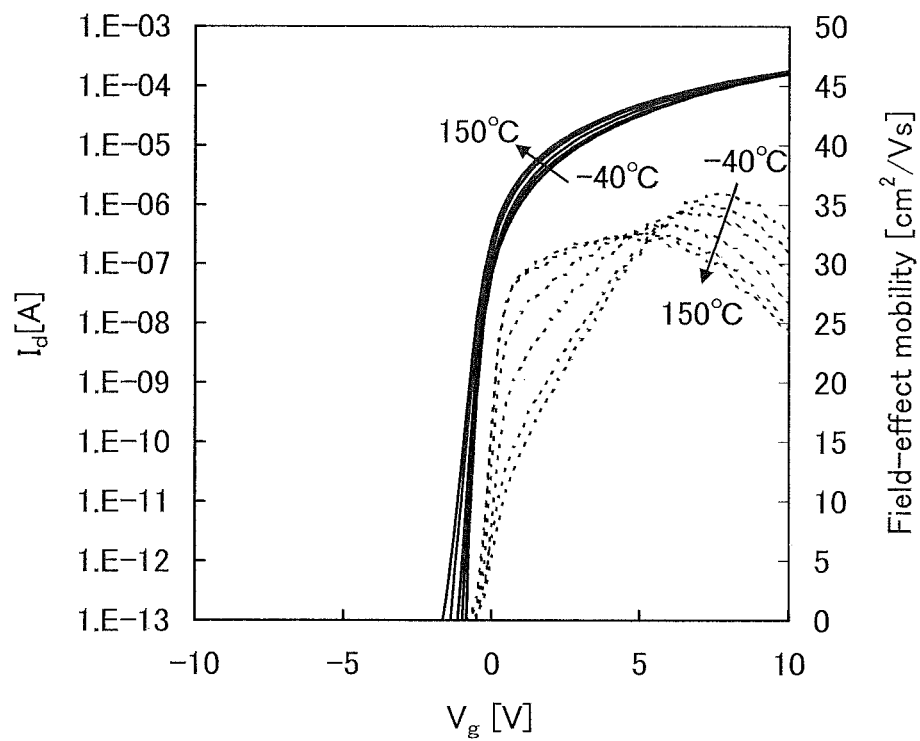
FIG. 29 is a graph showing $V_g$ dependence of $I_d$ and field-effect mobility.
Figure 30A:
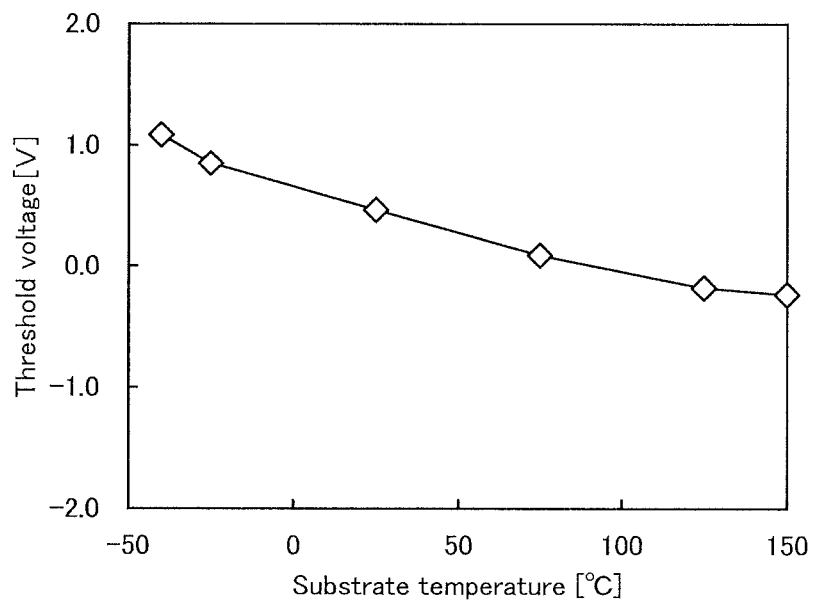
FIG. 30A is a graph showing a relation between threshold voltage and substrate temperature.

FIG. 29 shows the $V_g$ dependence of $I_d$ (a solid line) and field-effect mobility (a dotted line). FIG. 30A shows a relation between the substrate temperature and the threshold voltage, and FIG. 30B shows a relation between the substrate temperature and the field-effect mobility.

From FIG. 30A, it is found that the threshold voltage gets lower as the substrate temperature increases. Note that the threshold voltage is decreased from 1.09 V to −0.23 V in the range from −40° C. to 150° C.

Figure 30B:
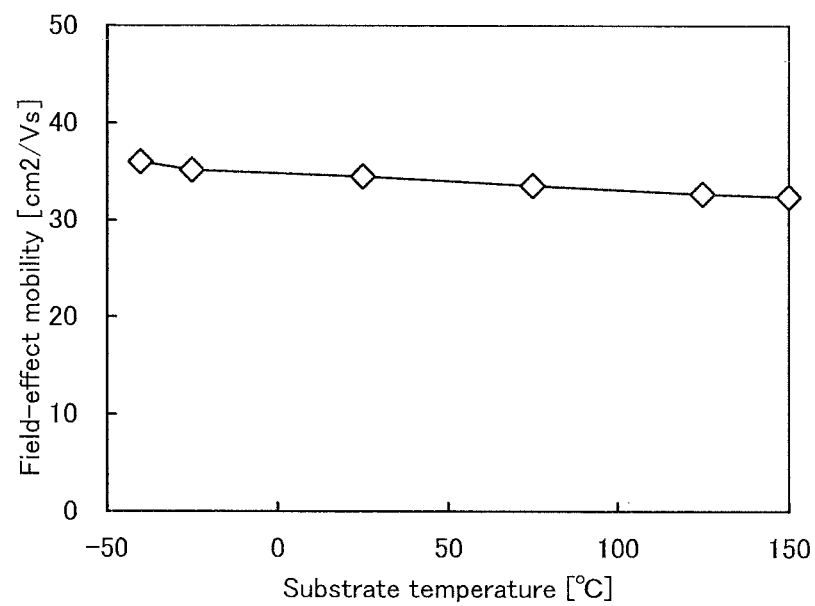
FIG. 30B is a graph showing a relation between field-effect mobility and substrate temperature.

From FIG. 30B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a S1 semiconductor.

This embodiment can be implemented in combination with any of the above embodiments.

Example 1

With the use of a signal processing circuit according to one embodiment of the present invention, an electronic device with low power consumption can be provided. In particular, in the case of a portable electronic device which has difficulty in continuously receiving power, when a signal processing circuit with low power consumption according to one embodiment of the present invention is added as a component of the device, an advantage in increasing the continuous operation time can be obtained. Further, by the use of a transistor with small off-state current, redundant circuit design which is needed to cover a failure caused by large off-state current is unnecessary; therefore, the integration degree of the signal processing circuit can be increased, and a signal processing circuit having higher functionality can be formed.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). In addition, as an electronic device which can employ the signal processing circuit according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case where a signal processing circuit according to one embodiment of the present invention is applied to electronic devices such as a mobile phone, a smartphone, and an e-book reader will be described.

Figure 13:
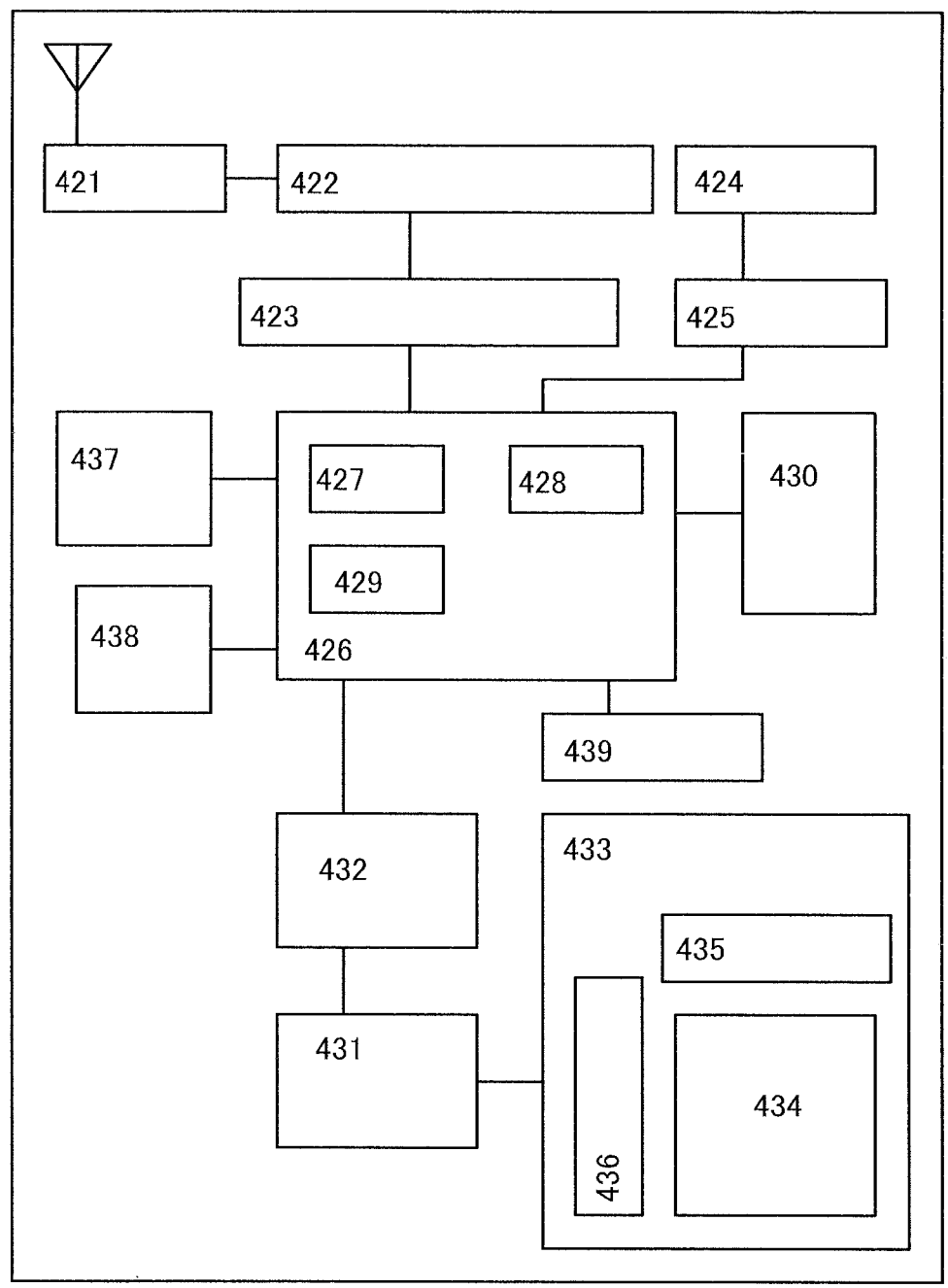
FIG. 13 is a block diagram of a portable electronic device.

FIG. 13 is a block diagram of a portable electronic device. The portable electronic device illustrated in FIG. 13 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. The signal processing circuit described in the above embodiment is employed for the CPU 427, whereby power consumption can be reduced. An SRAM or a DRM is used in the memory circuit 432 in general; however, the storage device described in the above embodiment is used in the memory circuit 432, whereby power consumption can be reduced.

Figure 14:
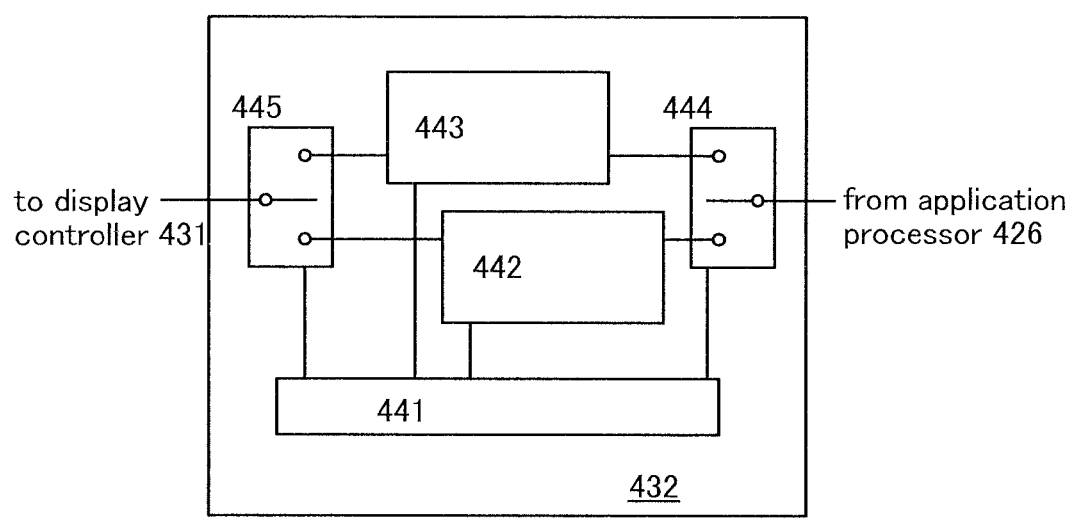
FIG. 14 is a block diagram of a memory circuit.

FIG. 14 is a block diagram illustrating a configuration of the memory circuit 432. The memory circuit 432 includes a storage device 442, a storage device 443, a switch 444, a switch 445, and a memory controller 441.

First, image data is received by the portable electronic device or is formed by the application processor 426. This image data is stored in the storage device 442 through the switch 444. Then, image data output through the switch 444 is sent to the display 433 through the display controller 431. The display 433 displays an image using the image data.

If a displayed image is not changed as in the case of a still image, image data read from the storage device 442 continues to be sent to the display controller 431 through the switch 445 at a frequency of approximately 30 Hz to 60 Hz in general. When operation for rewriting an image displayed on a screen is performed by a user, new image data is formed by the application processor 426 and is stored in the storage device 443 through the switch 444. While storing of this new image data in the storage device 443 is performed, image data is periodically read from the storage device 442 through the switch 445.

When the storing of new image data in the storage device 443 is completed, from the following frame period, the new image data stored in the storage device 443 is read and sent to the display 433 through the switch 445 and the display controller 431. The display 433 displays an image using the sent new image data.

Reading of this image data continues until the following new data is stored in the storage device 442. In this manner, writing and reading of image data are performed to/from the storage device 442 and the storage device 443 alternately, and an image is displayed by the display 433.

The storage device 442 and the storage device 443 are not necessarily different storage devices; a memory region included in one storage device may be divided to be used by the storage device 442 and the storage device 443. The storage device described in the above embodiment is employed for these storage devices, whereby power consumption can be reduced.

Figure 15:
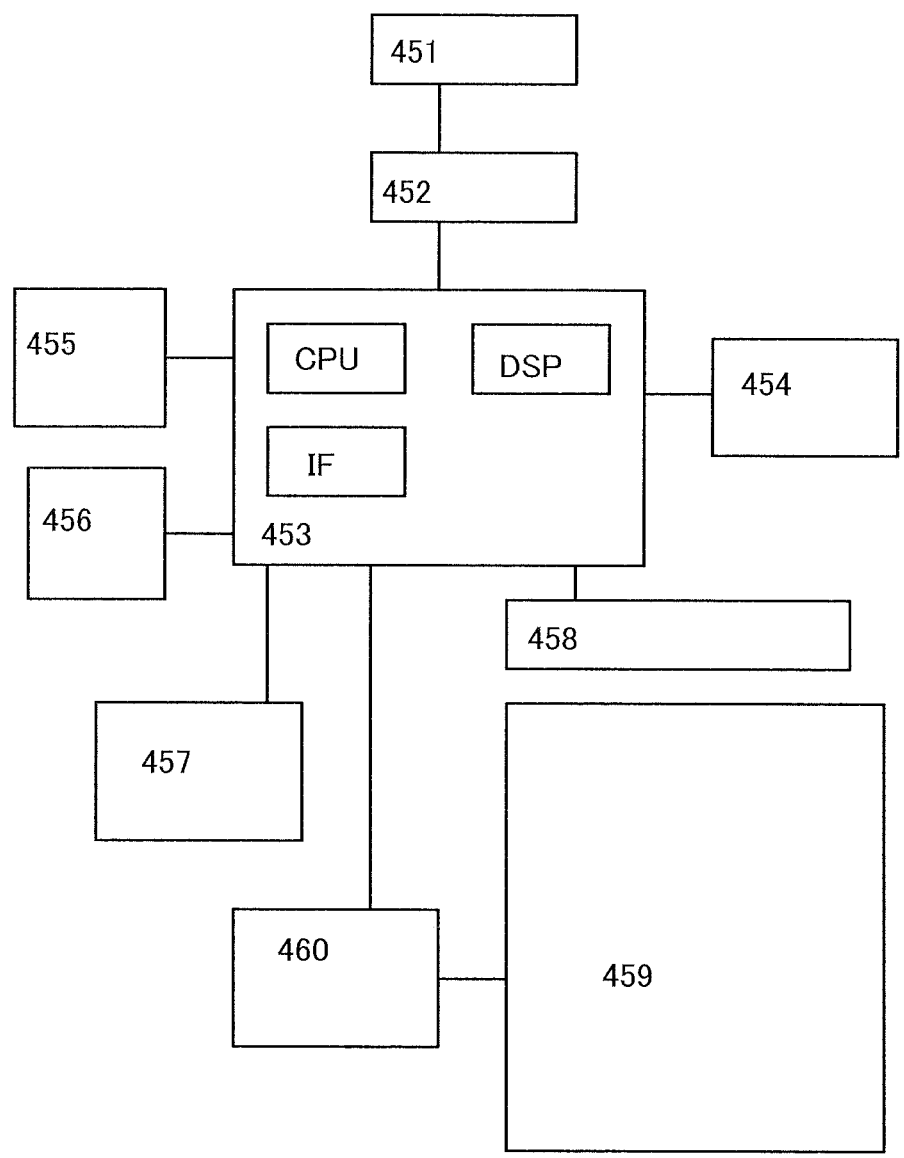
FIG. 15 is a block diagram of an e-book reader.

FIG. 15 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The signal processing circuit described in the above embodiment is employed for the microprocessor 453, whereby power consumption can be reduced. Further, the storage device described in the above embodiment is employed for the memory circuit 457, whereby power consumption can be reduced.

For example, in the case where a user uses a highlighting function of changing a display color, drawing an underline, using a bold font, changing the type of letter, or the like in a specific portion in e-book data so that the specific portion is in clear contrast to the other portions, data of the portion specified by the user in the e-book data needs to be stored. The memory circuit 457 has a function of storing such data temporarily. Note that in the case where such data is held for a long time, it may be copied to the flash memory 454.

This example can be implemented in combination with any of the above embodiments.

This application is based on Japanese Patent Application serial no. 2011-000435 filed with Japan Patent Office on Jan. 5, 2011, and Japanese Patent Application serial no. 2011-113414 filed with Japan Patent Office on May 20, 2011, the entire contents of which are hereby incorporated by reference.

What is claimed is:

1. A signal processing circuit comprising:
a register, the register comprising:
   a first storage circuit; and
   a second storage circuit, the second storage circuit comprising:
      a capacitor comprising a pair of electrodes;
      a first transistor; and
      a second transistor,
wherein the first storage circuit is a volatile storage circuit,
wherein the first transistor comprises a channel formation region comprising an oxide semiconductor material,
wherein the second transistor comprises a channel formation region comprising a silicon,
wherein one of a source and a drain of the first transistor is electrically connected to one of the pair of electrodes and a gate of the second transistor,
wherein the other of the source and the drain of the first transistor is electrically connected to the first storage circuit, and
wherein one of a source and a drain of the second transistor is electrically connected to the first storage circuit.

2. A signal processing circuit comprising:
a register, the register comprising:
   a first storage circuit; and
   a second storage circuit, the second storage circuit comprising:
      a capacitor comprising a pair of electrodes;
      a first transistor;
      a second transistor; and
      a switch comprising a first terminal and a second terminal,
wherein the first storage circuit is a volatile storage circuit,
wherein the first transistor comprises a channel formation region comprising an oxide semiconductor material,
wherein the second transistor comprises a channel formation region comprising a silicon,
wherein one of a source and a drain of the first transistor is electrically connected to one of the pair of electrodes and a gate of the second transistor,
wherein the other of the source and the drain of the first transistor is electrically connected to the first storage circuit,
wherein one of a source and a drain of the second transistor is electrically connected to the first terminal of the switch, and
wherein the second terminal of the switch is electrically connected to the first storage circuit.

3. A signal processing circuit comprising:
a register, the register comprising:
   a first storage circuit; and
   a second storage circuit, the second storage circuit comprising:
      a capacitor comprising a pair of electrodes;
      a first transistor;
      a second transistor; and
      a third transistor,
wherein the first storage circuit is a volatile storage circuit,
wherein the first transistor comprises a channel formation region comprising an oxide semiconductor material,
wherein one of a source and a drain of the first transistor is electrically connected to one of the pair of electrodes and a gate of the second transistor,
wherein the other of the source and the drain of the first transistor is electrically connected to the first storage circuit,
wherein one of a source and a drain of the second transistor is electrically connected to one of a source and a drain of the third transistor, and
wherein the other of the source and the drain of the third transistor is electrically connected to the first storage circuit.

4. The signal processing circuit according to claim 1, wherein the oxide semiconductor material is an In—Ga—Zn-based oxide.

5. The signal processing circuit according to claim 1, wherein the oxide semiconductor material is an In—Sn—Zn-based oxide.

6. The signal processing circuit according to claim 1, wherein the first storage circuit is configured to hold data only in a period during which a power supply voltage supplied.

7. The signal processing circuit according to claim 1, wherein the other of the source and the drain of the first transistor is electrically connected to an output terminal of the first storage circuit.

8. The signal processing circuit according to claim 1, wherein the one of the source and the drain of the second transistor is electrically connected to an input terminal of the first storage circuit.

9. The signal processing circuit according to claim 2, wherein the oxide semiconductor material is an In—Ga—Zn-based oxide.

10. The signal processing circuit according to claim 2, wherein the oxide semiconductor material is an In—Sn—Zn-based oxide.

11. The signal processing circuit according to claim 2, wherein the first storage circuit is configured to hold data only in a period during which a power supply voltage supplied.

12. The signal processing circuit according to claim 2, wherein the other of the source and the drain of the first transistor is electrically connected to an output terminal of the first storage circuit.

13. The signal processing circuit according to claim 2, wherein the second terminal of the switch is electrically connected to an input terminal of the first storage circuit.

14. The signal processing circuit according to claim 3, wherein the oxide semiconductor material is an In—Ga—Zn-based oxide.

15. The signal processing circuit according to claim 3, wherein the oxide semiconductor material is an In—Sn—Zn-based oxide.

16. The signal processing circuit according to claim 3, wherein the first storage circuit is configured to hold data only in a period during which a power supply voltage supplied.

17. The signal processing circuit according to claim 3, wherein the other of the source and the drain of the first transistor is electrically connected to an output terminal of the first storage circuit.

18. The signal processing circuit according to claim 3, wherein the other of the source and the drain of the third transistor is electrically connected to an input terminal of the first storage circuit.

19. The signal processing circuit according to claim 1, wherein the first storage circuit is electrically connected to the gate of the second transistor and the one of the pair of electrodes through the first transistor.

* * * * *